United States Patent [19]
Kunita et al.

[11] Patent Number: 6,051,367
[45] Date of Patent: Apr. 18, 2000

[54] PHOTOPOLYMERIZABLE COMPOSITION

[75] Inventors: Kazuto Kunita; Tatsuji Higashi, both of Shizuoka, Japan

[73] Assignee: Fuji Photo Film Co., Ltd., Minami-Ashigara, Japan

[21] Appl. No.: 09/027,737

[22] Filed: Feb. 23, 1998

[30] Foreign Application Priority Data

Feb. 25, 1997 [JP] Japan ................................ 9-040964

[51] Int. Cl.$^7$ .............................. G03C 1/725; C08F 2/46
[52] U.S. Cl. ...................... 430/281.1; 430/919; 430/926; 522/57
[58] Field of Search ........................... 522/57; 430/281.1, 430/919, 913, 926

[56] References Cited

U.S. PATENT DOCUMENTS 5,703,140  12/1997  Kunita et al. ............................ 522/57

*Primary Examiner*—Janet Baxter
*Assistant Examiner*—Rosemary Ashton
*Attorney, Agent, or Firm*—Burns, Doane, Swecker & Mathis, LLP

[57] ABSTRACT

A photopolymerizable composition which comprises a compound having one or more addition-polymerizable ethylenically unsaturated bonds and a specific oxime ether compound. The photopolymerizable composition has high sensitivity to actinic rays in a wide region, ranging from ultraviolet to visible light, and gives a photosensitive material which has improved film strength in exposed areas.

4 Claims, No Drawings

PHOTOPOLYMERIZABLE COMPOSITION

FIELD OF THE INVENTION

The present invention relates to a photopolymerizable composition. More particularly, this invention relates to a photopolymerizable composition comprising at least a polymerizable compound having one or more addition-polymerizable ethylenically unsaturated bonds and an oxime ether compound.

BACKGROUND OF THE INVENTION

A photographic technique of image duplication has conventionally been known, which uses a photosensitive composition comprising a mixture of a compound having one or more addition-polymerizable ethylenically unsaturated bonds, a photopolymerization initiator, and optionally an appropriate binder having film-forming ability and a heat polymerization inhibitor. Examples of this technique are described, e.g., in U.S. Pat. Nos. 2,927,022, 2,902,356, and 3,870,524. As described therein, this kind of photosensitive composition undergoes photopolymerization upon light irradiation and thus cures to become insoluble. Consequently, a desired cured image can be formed from the photopolymerizable composition, as described in those U.S. Patents, by forming the photosensitive composition into an appropriate film, irradiating the film with light through a negative bearing the desired image pattern, and removing the film only in the unexposed areas with an appropriate solvent (hereinafter simply called development). This type of photosensitive composition is extremely useful as a material for producing printing plates, etc.

Since the single use of the compound having one or more addition-polymerizable ethylenically unsaturated bonds does not have sufficient photosensitivity, it has been proposed to add a photopolymerization initiator thereto in order to heighten the photosensitivity. The photopolymerization initiators which have been used in this application include benzil, benzoin, benzoin ethyl ether, Michler's ketone, anthraquinone, acridine, phenazine, benzophenone, and 2-ethylanthraquinone. However, use of these photopolymerization initiators has a drawback that the resultant photopolymerizable compositions have reduced response in curing and hence necessitate a prolonged period for image-wise exposure in image formation, and even slight vibration in the operation makes it impossible to attain satisfactory image quality in reproducing a fine image. Furthermore, since the amount of irradiation energy of the light source for exposure should be increased, it is necessary to account for a large amount of the resultant heat irradiation. In addition, there is a further problem that the heat is apt to cause deformation and denaturation of the film of the composition.

On the other hand, investigations are recently being made on the enhancement of sensitivity to ultraviolet rays and techniques for forming an image with a laser. Image-forming techniques based on the UV projection exposure method, direct laser platemaking, laser facsimile, holography, etc. are in a stage in which they can be put to practical use. High-sensitivity photosensitive materials capable of coping with these techniques have hence been desired, and are being developed.

In particular, a photopolymerizable composition having an oxime ether compound is proposed in JP-A-8-202035 (the term "JP-A" as used herein means an "unexamined published Japanese patent application") as a photopolymerizable composition having high sensitivity and excellent storage stability.

Use of that oxime ether compound is preferred in that it improves sensitivity as the addition amount thereof increases. However, the resultant composition tends to give a film which is brittle due to the oxime ether compound present therein. Consequently, no fully satisfactory photosensitive material has been obtained so far.

SUMMARY OF THE INVENTION

An object of the present invention is to provide a photopolymerizable composition having high sensitivity. Another object of the present invention is to provide a photopolymerizable composition which exhibits an increased rate of photopolymerization while containing a generally used compound having one or more addition-polymerizable ethylenically unsaturated bonds and which provides a film having enhanced strength in exposed areas.

The present inventor has made intensive studies in order to attain the above objects. As a result, it has been found that a specific oxime ether compound serves not only to significantly increase the photopolymerization rate of a compound having one or more addition-polymerizable ethylenically unsaturated bonds but to heighten the strength of a film thereof in exposed areas. The present invention has been achieved based on this finding.

The present invention provides a photopolymerizable composition comprising at least the following ingredients (i) and (ii):

(i) a compound having one or more addition-polymerizable ethylenically unsaturated bonds and (ii) an oxime ether compound represented by formula (I)

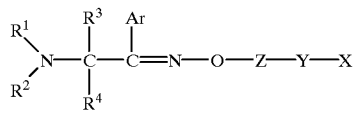

wherein $R^1$ to $R^4$ each represents an alkyl group or an aryl group; Ar represents an aryl group; $R^1$ and $R^2$ may be bonded to each other to form a ring, and $R^3$ and $R^4$ may be bonded to each other to form a ring; Z represents a bivalent hydrocarbon-containing connecting group which may have substituent(s); Y represents a bivalent connecting group or a single bond, said connecting group comprising at least one of the following groups:

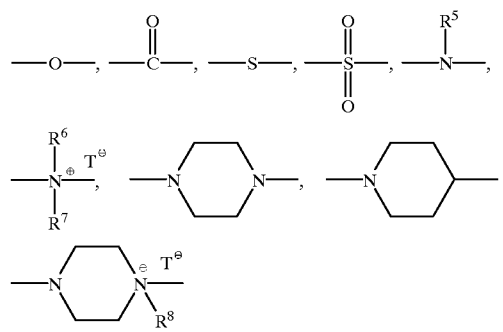

wherein $R^5$ represents a hydrogen atom, a hydrocarbon group which may have substituent(s) and may contain unsaturated bond(s), a carbonyl group, or a sulfonyl group, $R^6$ to $R^8$ are the same or different and each represents a hydrocarbon group which may have substituent(s) and may contain unsaturated bond(s), and T⁻ represents a univalent anion comprising a halogen atom or a univalent sulfonate anion; and X is a group having an addition-polymerizable group represented by the following formula (I-a):

wherein D represents one of the following groups:

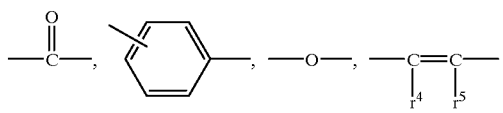

$r^1$ to $r^3$ are the same or different and each represents a hydrogen atom, a methyl group, an ethyl group, a phenyl group, a halogen atom, a cyano group, or —C(=O)—OR⁹; n represents 0 or 1, provided that when n is 0, not all of $r^1$ to $r^3$ are hydrogen atoms; $r^4$ and $r^5$, which may be the same or different, each represents a hydrogen atom, a methyl group, an ethyl group, or a phenyl group; and $R^9$ represents an alkyl group or an aryl group.

DETAILED DESCRIPTION OF THE INVENTION

The present invention has been accomplished based on the finding that a specific oxime ether compound having an addition-polymerizable group at an end serves not only to significantly increase the photopolymerization rate of a compound having one or more addition-polymerizable ethylenically unsaturated bonds but to heighten the strength of a film thereof in exposed areas. Although the reason for these functions has not been elucidated, it is thought that the specific oxime ether compound according to the present invention participates in the photopolymerization of the compound having one or more ethylenically unsaturated bonds and, as a result, the composition gives a film which itself cures to an improved degree to have heightened film strength.

The compound having one or more addition-polymerizable ethylenically unsaturated bonds, used as ingredient (i) in the present invention, is selected from compounds each having at least one, preferably two or more ethylenically unsaturated bonds on the terminal(s).

Examples of ingredient (i) include monomers such as esters of unsaturated carboxylic acids (e.g., acrylic acid, methacrylic acid, itaconic acid, crotonic acid, isocrotonic acid, and maleic acid) with aliphatic polyhydric alcohol compounds and amides of those unsaturated carboxylic acids with aliphatic polyamine compounds.

Examples of the acrylic esters, as specific examples of the monomeric esters of aliphatic polyhydric alcohol compounds with unsaturated carboxylic acids, include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomers.

Examples of the methacrylic esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(acryloxyethoxy)phenyl]dimethylmethane.

Examples of the itaconic esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the crotonic esters include ethylene glycol dicrotonate, tetramethylene glycol dicrotonate, pentaerythritol dicrotonate, and sorbitol tetradicrotonate.

Examples of the isocrotonic esters include ethylene glycol diisocrotonate, pentaerythritol diisocrotonate, and sorbitol tetraisocrotonate.

Examples of the maleic esters include ethylene glycol dimaleate, triethylene glycol dimaleate, pentaerythritol dimaleate, and sorbitol tetramaleate.

Mixtures of the ester monomers enumerated above may also be used as ingredient (i).

Specific examples of the monomeric amides of aliphatic polyamine compounds with unsaturated carboxylic acids include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, and xylylenebismethacrylamide.

Other examples of ingredient (i) include vinyl urethane compounds which contain two or more polymerizable vinyl groups per molecule and are formed by the addition of hydroxyl-containing vinyl monomers represented by the following general formula (A) to the polyisocyanate compounds having two or more isocyanate groups per molecule which are described in JP-B-48-41708. (The term "JP-B" as used herein means an "examined Japanese patent publication".)

(In formula (A), R and R' each represents H or CH₃.)

Other examples thereof further include polyfunctional acrylates and methacrylates, e.g., urethane acrylates such as those described in JP-A-51-37193, polyester acrylates such as those described in JP-A-48-64183, JP-B-49-43191, and JP-B-52-30490, and epoxy acrylates formed by reacting epoxy resins with (meth)acrylic acid. Also usable are the compounds described as photocurable monomers and oligomers in *Journal of the Adhesion Society of Japan*, Vol. 20, No. 7, pp. 300–308 (1984). In the present invention, these monomers can be used in chemical forms such as prepolymers, i.e., dimer, trimer, and oligomer, mixtures thereof, copolymers thereof, etc.

The use amount of these compounds is from 5 to 70% by weight (hereinafter "% by weight" is referred to simply as "%"), preferably from 10 to 55%, based on the amount of all the ingredients (excluding a solvent) in the photopolymerizable composition. The use of ingredient (i) in an amount outside of the range is undesirable. If the amount exceeds 70%, the composition is liable to provide an unsatisfactory formation of a film (tacky film), and if it is smaller than 5%, curing failure may be caused.

The oxime ether compound represented by general formula (I), used as ingredient (ii) in the present invention, will be explained below in detail.

Examples of the alkyl or aryl group represented by $R^1$ to $R^4$ in general formula (I) are as follows.

Examples of the alkyl group include linear, branched, or cyclic alkyl groups having 1 to 20 carbon atoms. Specific examples thereof include methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl, and 2-norbornyl. Among them, the linear alkyl groups having 1 to 12 carbon atoms, the branched alkyl groups having 3 to 12 carbon atoms, and the cyclic alkyl groups having 5 to 10 carbon atoms are preferred.

These alkyl groups may be substituted alkyl groups consisting of an alkylene group and a substituent bonded thereto. The substituent may be a univalent atom of a nonmetallic element other than hydrogen or a univalent group of atoms of such nonmetallic elements. Preferred examples thereof include halogen atoms (—F, —Br, —Cl, and —I), hydroxyl, alkoxy groups, aryloxy groups, mercapto, alkylthio groups, arylthio groups, alkyldithio groups, aryldithio groups, amino, N-alkylamino groups, N,N-dialkylamino groups, N-arylamino groups, N,N-diarylamino groups, N-alkyl-N-arylamino groups, acyloxy groups, carbamoyloxy, N-alkylcarbamoyloxy groups, N-arylcarbamoyloxy groups, N,N-dialkylcarbamoyloxy groups, N,N-diarylcarbamoyloxy groups, N-alkyl-N-arylcarbamoyloxy groups, alkylsulfoxy groups, arylsulfoxy groups, acylthio groups, acylamino groups, N-alkylacylamino groups, N-arylacylamino groups, ureido, N'-alkylureido groups, N',N'-dialkylureido groups, N'-arylureido groups, N',N'-diarylureido groups, N'-alkyl-N'-arylureido groups, N-alkylureido groups, N-arylureido groups, N'-alkyl-N-alkylureido groups, N'-alkyl-N-arylureido groups, N',N'-dialkyl-N-alkylureido groups, N',N'-dialkyl-N-arylureido groups, N'-aryl-N-alkylureido groups, N'-aryl-N-arylureido groups, N',N'-diaryl-N-alkylureido groups, N',N'-diaryl-N-arylureido groups, N'-alkyl-N'-aryl-N-alkylureido groups, N'-alkyl-N'-aryl-N-arylureido groups, alkoxycarbonylamino groups, aryloxycarbonylamino groups, N-alkyl-N-alkoxycarbonylamino groups, N-alkyl-N-aryloxycarbonylamino groups, N-aryl-N-alkoxycarbonylamino groups, N-aryl-N-aryloxycarbonylamino groups, formyl, acyl groups, carboxyl and conjugate base groups thereof (hereinafter referred to as "icarboxylato"), alkoxycarbonyl groups, aryloxycarbonyl groups, carbamoyl, N-alkylcarbamoyl groups, N,N-dialkylcarbamoyl groups, N-arylcarbamoyl groups, N,N-diarylcarbamoyl groups, N-alkyl-N-arylcarbamoyl groups, alkylsulfinyl groups, arylsulfinyl groups, alkylsulfonyl groups, arylsulfonyl groups, sulfo (—SO$_3$H) and conjugate base groups thereof (hereinafter referred to as "sulfonato groups"), alkoxysulfonyl groups, aryloxysulfonyl groups, sulfinamoyl, N-alkylsulfinamoyl groups, N,N-dialkylsulfinamoyl groups, N-arylsulfinamoyl groups, N,N-diarylsulfinamoyl groups, N-alkyl-N-arylsulfinamoyl groups, sulfamoyl, N-alkylsulfamoyl groups, N,N-dialkylsulfamoyl groups, N-arylsulfamoyl groups, N,N-diarylsulfamoyl groups, N-alkyl-N-arylsulfamoyl groups, N-acylsulfamoyl groups and conjugate base groups thereof, N-alkylsulfonylsulfamoyl groups (—SO$_2$NHSO$_2$(alkyl)) and conjugate base groups thereof, N-arylsulfonylsulfamoyl groups (—SO$_2$NHSO$_2$(aryl)) and conjugate base groups thereof, N-alkylsulfonylcarbamoyl groups (—CONHSO$_2$(alkyl)) and conjugate base groups thereof, N-arylsulfonylcarbamoyl groups (—CONHSO$_2$(aryl)) and conjugate base groups thereof, alkoxysilyl groups (—Si(Oalkyl)$_3$), aryloxysilyl groups (—Si(Oaryl)$_3$), hydroxysilyl (—Si(OH)$_3$) and conjugate base groups thereof, phosphono (—PO$_3$H$_2$) and conjugate base groups thereof (hereinafter referred to as "phosphonato groups"), dialkylphosphono groups (—PO$_3$(alkyl)$_2$), diarylphosphono groups (—PO$_3$(aryl)$_2$), alkylarylphosphono groups (—PO$_3$(alkyl)(aryl)), monoalkylphosphono groups (—PO$_3$H(alkyl)) and conjugate base groups thereof (hereinafter referred to as "alkylphosphonato groups"), monoarylphosphono groups (—PO$_3$H(aryl)) and conjugate base groups thereof (hereinafter referred to as "arylphosphonato groups"), phosphonooxy (—OPO$_3$H$_2$) and conjugate base groups thereof (hereinafter referred to as "phosphonatooxy groups"), dialkylphosphonooxy groups (—OPO$_3$(alkyl)$_2$), diarylphosphonooxy groups (—OPO$_3$(aryl)$_2$), alkylarylphosphonooxy groups (—OPO$_3$(alkyl)(aryl)), monoalkylphosphonooxy groups (—OPO$_3$H(alkyl)) and conjugate base groups thereof (hereinafter referred to as "alkylphosphonatooxy groups"), monoarylphosphonooxy groups (—OPO$_3$H(aryl)) and conjugate base groups thereof (hereinafter referred to as "arylphosphonatooxy groups"), cyano, nitro, aryl groups, alkenyl groups, and alkynyl groups.

Examples of the alkyl groups contained in those substituents include the alkyl group enumerated hereinabove. Examples of the aryl groups include phenyl, biphenyl, naphthyl, tolyl, xylyl, mesityl, cumenyl, fluorophenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxycarbonylphenyl, phenoxycarbonylphenyl, N-phenylcarbamoylphenyl, phenyl, nitrophenyl, cyanophenyl, sulfophenyl, sulfonatophenyl, phosphonophenyl, and phosphonatophenyl. Examples of the alkenyl groups include vinyl, 1-propenyl, 1-butenyl, cinnamyl, and 2-chloro-1-ethenyl. Examples of the alkynyl groups include ethynyl, 1-propynyl, 1-butynyl, trimethylsilylethynyl, and phenylethynyl.

Examples of the acyl groups ($R^{10}$CO—) described above include those in which $R^{10}$ is a hydrogen atom or any of the alkyl, aryl, alkenyl, and alkynyl groups enumerated above.

On the other hand, examples of the alkylene groups in the substituted alkyl groups include bivalent organic residues formed by removing any one hydrogen atom from the aforementioned alkyl groups having 1 to 20 carbon atoms. Preferred examples thereof include a linear alkylene group having 1 to 12 carbon atoms, a branched alkylene group having 3 to 12 carbon atoms, and a cyclic alkylene group having 5 to 10 carbon atoms. Preferred examples of the substituted alkyl group include chloromethyl, bromomethyl, 2-chloroethyl, trifluoromethyl, methoxymethyl, methoxyethoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, methoxycarbonylmethyl, methoxycarbonylbutyl, ethoxycarbonylmethyl, butoxycarbonylmethyl, allyloxycarbonylmethyl, benzyloxycarbonylmethyl, methoxycarbonylphenylmethyl, trichloromethylcarbonylmethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfopropyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl,

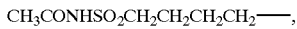

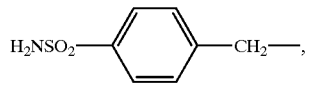

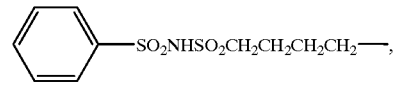

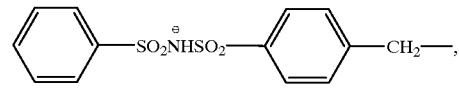

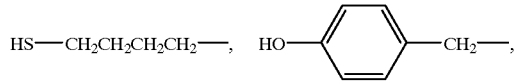

phosphonobutyl, phosphonatohexyl, diethylphosphonobutyl, diphenylphosphonopropyl, methylphosphonobutyl, methylphosphonatobutyl, tolylphosphonohexyl, tolylphosphonatohexyl, phosphonooxypropyl, phosphonatooxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl, and 3-butynyl.

Examples of the aryl group represented by $R^1$ to $R^4$ include a benzene ring, a fused ring composed of up to three benzene rings, and a fused ring composed of a benzene ring and a five-membered unsaturated ring. Specific examples thereof include phenyl, naphthyl, anthryl, phenanthryl, indenyl, acenaphthenyl, and fluorenyl. Preferred are phenyl and naphthyl.

The aryl group represented by $R^1$ to $R^4$ may be a substituted aryl group consisting of an aryl group and a substituent bonded thereto. The substituted aryl group consists of any of the aryl groups enumerated above and a group of atoms of nonmetallic elements other than hydrogen which group is bonded as a substituent to a ring-forming carbon atom of the aryl group. Preferred examples of the substituent include the alkyl groups and substituted alkyl groups enumerated above and the substituents enumerated hereinabove with regard to the substituted alkyl group. Preferred examples of the substituted aryl group include biphenyl, tolyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, tolylthiophenyl, phenylthiophenyl, ethyl aminophenyl, diethylaminophenyl, morpholinophenyl, acetyloxyphenyl, benzoyloxyphenyl, N-cyclohexylcarbamoyloxyphenyl, N-phenylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl)carbamoylphenyl, N-methyl-N-(sulfophenyl)carbamoylphenyl, sulfophenyl, sulfonatophenyl, sulfamoylphenyl, N-ethylsulfamoylphenyl, N,N-dipropylsulfamoylphenyl, N-tolylsulfamoylphenyl, N-methyl-N-(phosphonophenyl)sulfamoylphenyl, phosphonophenyl, phosphonatophenyl, diethylphosphonophenyl, diphenylphosphonophenyl, methylphosphonophenyl, methylphosphonatophenyl, tolylphosphonophenyl, tolylphosphonatophenyl, allylphenyl, 1-propenylmethylphenyl, 2-butenylphenyl, 2-methylallylphenyl, 2-methylpropenylphenyl, 2-propynylphenyl, 2-butynylphenyl, and 3-butynylphenyl.

The case where $R^1$ and $R^2$ are bonded to each other to form a ring will be explained below.

Examples of the ring made up of $R^1$ and $R^2$ bonded to each other include alkylene groups which each has 2 to 8 carbon atoms and may contain —O—, —O—C(=O)—, —S—, or —NH—C(=O)— in the main connected chain.

The case where $R^3$ and $R^4$ are bonded to each other to form a ring will be explained below.

Examples of the ring made up of $R^3$ and $R^4$ bonded to each other include alkylene groups which each has 2 to 8 carbon atoms and may contain —O—, —O—C(=O)—, —S—, or —NH—C(=O)— in the main connected chain.

Ar in general formula (I) will be explained below.

The aryl group represented by Ar has the same meaning as that represented by $R^1$ to $R^4$, and can be the same substituted aryl group as that represented by $R^1$ to $R^4$.

Z in general formula (I) will be explained below in detail.

Examples of the bivalent hydrocarbon-containing group optionally having substituent(s), which is represented by Z in formula (I), include a bivalent connecting group formed by removing one hydrogen atom from any of the carbon atoms of an alkyl or aryl group. The alkyl or aryl group has the same meaning as that represented by $R^1$ to $R^4{}_1$, and can be a substituted alkyl or aryl group.

Y will be explained below in detail.

The bivalent connecting group represented by Y include a bivalent connecting group formed by removing one hydrogen atom from any of the carbon atoms of an alkyl or aryl group. The alkyl or aryl group has the same meaning as that represented by $R^1$ to $R^4$.

$R^5$ to $R^8$ in Y will be explained below in detail.

Examples of the hydrocarbon group which may have substituent(s) and/or unsaturated bond(s), which is represented by $R^5$ to $R^8$, include an alkyl group, an aryl group, an alkenyl group, and an alkynyl group.

The alkyl group and aryl group as $R^5$ to $R^8$ have the same meanings as those represented by $R^1$ to $R^4$, respectively.

Examples of the alkenyl group and alkynyl group as $R^5$ to $R^8$ include those exemplified above.

With respect to the substituted alkenyl group, which consist of an alkenyl group and substituent(s) bonded thereto in place of one or more hydrogen atoms, the substituent(s) can be the same as those in the substituted alkyl groups described above. The alkenyl group can be any of the alkenyl groups enumerated above.

Preferred examples of the substituted alkenyl groups include the following.

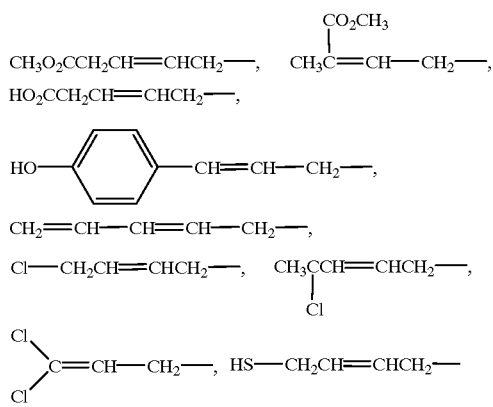

With respect to the substituted alkynyl group which consists of an alkynyl group and substituent(s) bonded thereto in place of one or more hydrogen atoms, the substituent can be the same as those in the substituted alkyl groups described above. The alkynyl group may be any of the alkynyl groups enumerated hereinabove.

The carbonyl group and sulfonyl group represented by $R^5$ will be explained below.

Examples of the carbonyl group ($R^{11}$—CO—) include those in which $R^{11}$ is a univalent group of atoms of nonmetallic elements. Preferred examples of the carbonyl group include formyl, acyl groups, carboxyl, alkoxycarbonyl groups, aryloxycarbonyl groups, carbamoyl, N-alkylcarbamoyl groups, N,N-dialkylcarbamoyl groups, N-arylcarbamoyl groups, N,N-diarylcarbamoyl groups, and N-alkyl-N-arylcarbamoyl groups. Examples of the alkyl and aryl groups in these carbonyl groups include the alkyl and aryl groups enumerated hereinabove. More preferred of these substituents are formyl, acyl groups, carboxyl, alkoxycarbonyl groups, aryloxycarbonyl groups, carbamoyl, N-alkylcarbamoyl groups, N,N-dialkylcarbamoyl groups, and N-arylcarbamoyl groups. Most preferred are formyl, acyl groups, alkoxycarbonyl groups, and aryloxycarbonyl groups. Specific examples of such preferred substituents include formyl, acetyl, benzoyl, carboxyl, methoxycarbonyl, allyloxycarbonyl, N-methylcarbamoyl, N-phenylcarbamoyl, N,N-diethylcarbamoyl, and morpholinocarbonyl.

Examples of the sulfonyl group ($R^{12}$—$SO_2$—) include those in which $R^{12}$ is a univalent group of atoms of nonmetallic elements. Preferred examples thereof include alkylsulfonyl groups and arylsulfonyl groups. Examples of the alkyl and aryl groups in these sulfonyl groups include the alkyl and aryl groups enumerated hereinabove. Specific examples of such sulfonyl groups include butylsulfonyl and chlorophenylsulfonyl.

$T^-$ is explained in detail. Examples of the halogen atom represented by $T^-$ include F, Cl, Br, and I. Examples of the sulfonate anion represented by $T^-$ include ions each consisting of any of the aforementioned alkyl and aryl groups represented by $R^1$ to $R^7$ and a sulfonato group ($—SO_3^-$) bonded thereto. Preferred examples thereof include a methylsulfonate anion, trifluoromethylsulfonate anion, benzenesulfonate anion, and toluenesulfonate anion.

X will be explained below in detail.

The alkyl or aryl group represented by $R^9$ in X has the same meaning as that represented by $R^1$ to $R^5$, and can be a substituted alkyl or aryl group.

Examples of the compound represented by general formula (I) are described below, but the compound should not be construed as being limited thereto.

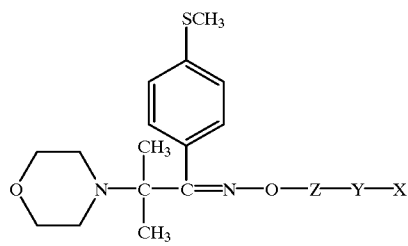

| Compound No. | Structure of —Z—Y—X |
|---|---|
| I-1 | —CH₂CH₂—O—C(=O)—CH=CH₂ |
| I-2 | —CH₂CH₂—O—C(=O)—C(CH₃)=CH₂ |
| I-3 | —CH₂CH₂—O—C(=O)—CH=CH—C₆H₅ |

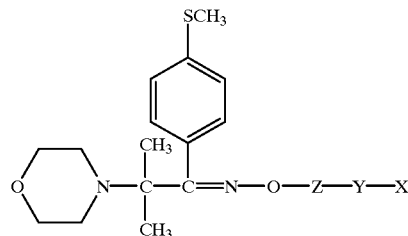
| Compound No. | Structure of —Z—Y—X |
|---|---|
| I-4 | 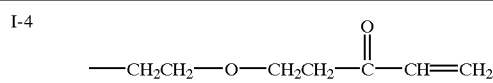 |
| I-5 | 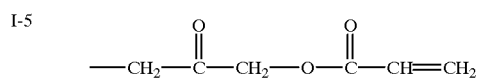 |
| I-6 | 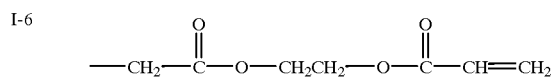 |
| I-7 | 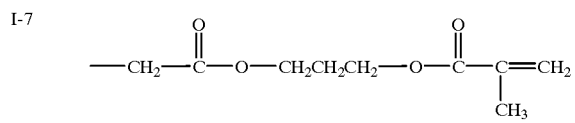 |
| I-8 | 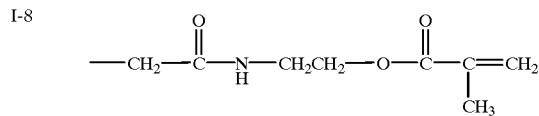 |
| I-9 | 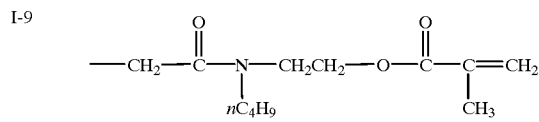 |
| I-10 | 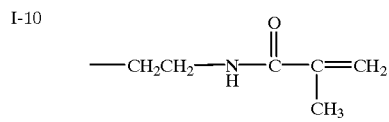 |
| I-11 | 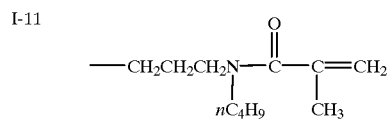 |
| I-12 | 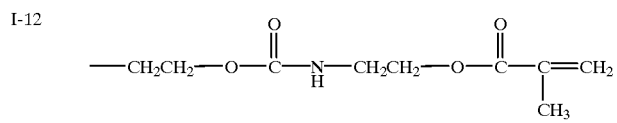 |
| I-13 | 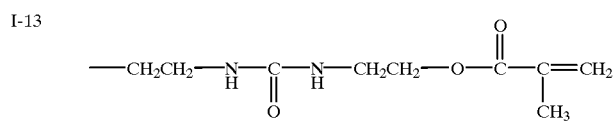 |

-continued
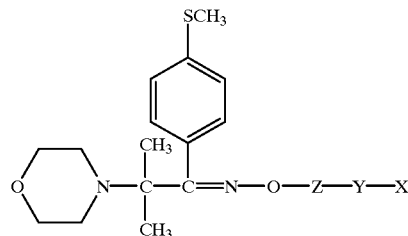
| Compound No. | Structure of —Z—Y—X |
|---|---|
| I-14 | 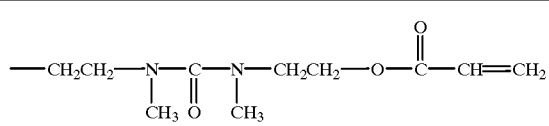 |
| I-15 | 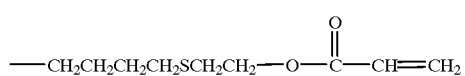 |
| I-16 | 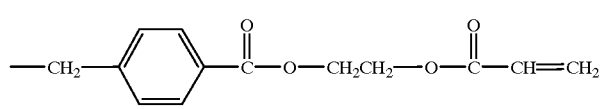 |
| I-17 | 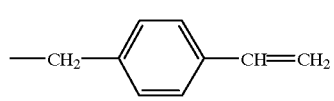 |
| I-18 | 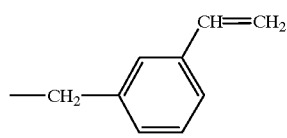 |
| I-19 | 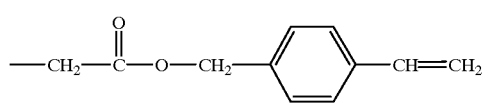 |
| I-20 | 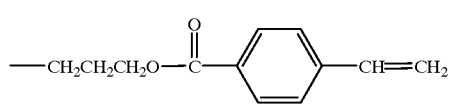 |
| I-21 | 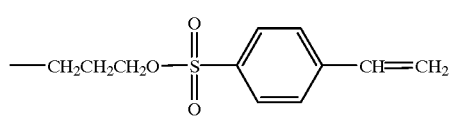 |
| I-22 | 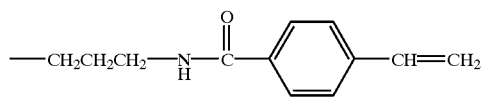 |
| I-23 | 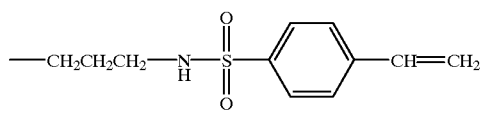 |

-continued
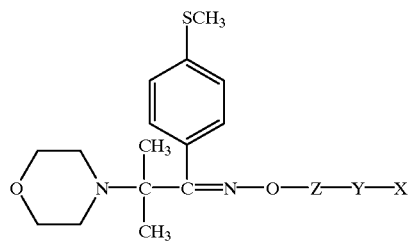
| Compound No. | Structure of —Z—Y—X |
|---|---|
| I-24 | 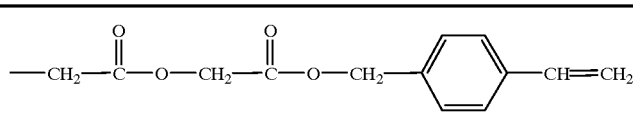 |
| I-25 | 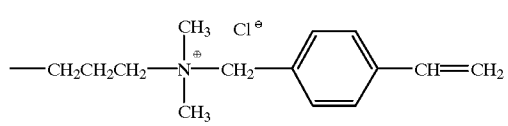 |
| I-26 | 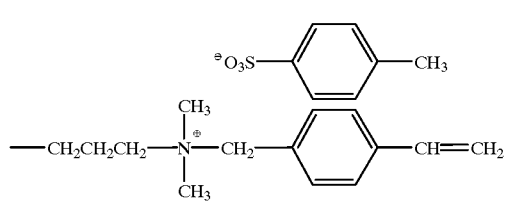 |
| I-27 | 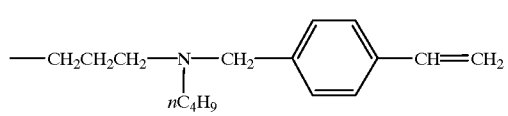 |
| I-28 | 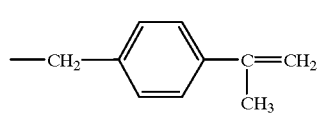 |
| I-29 | 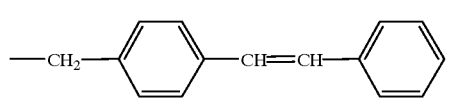 |
| I-30 | 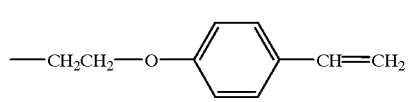 |
| I-31 | 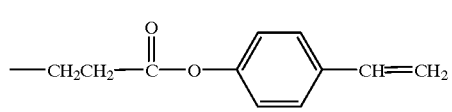 |
| I-32 | 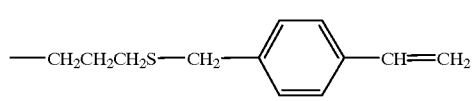 |
| I-33 | 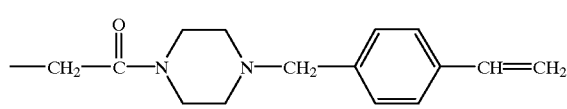 |

-continued
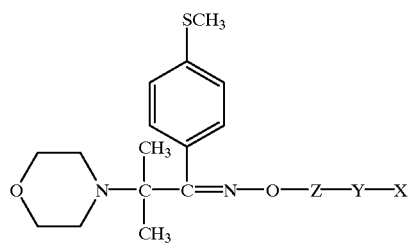
| Compound No. | Structure of —Z—Y—X |
|---|---|
| I-34 | 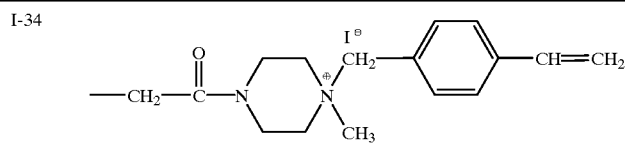 |
| I-35 | 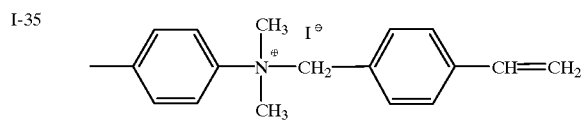 |
| I-36 | 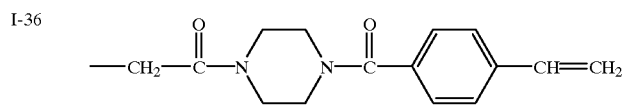 |
| I-37 | 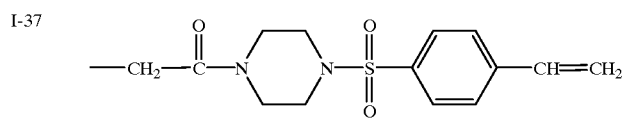 |
| I-38 | —CH$_2$CH$_2$CH$_2$O—CH=CH$_2$ |
| I-39 | 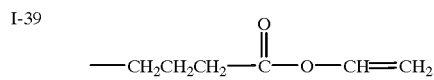 |
| I-40 | 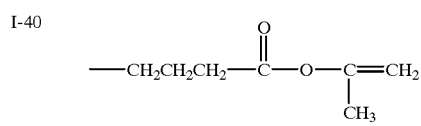 |
| I-41 | 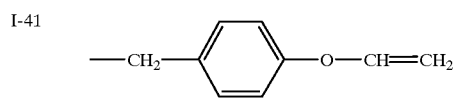 |
| I-42 | 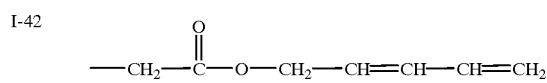 |
| I-43 | 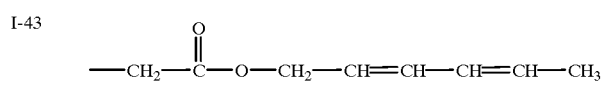 |
| I-44 | —CH$_2$—CH=CH—CH=CH—CH$_3$ |
| I-45 | 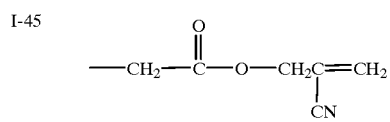 |

-continued
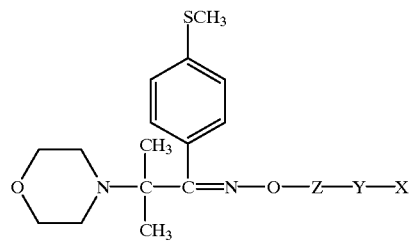
| Compound No. | Structure of —Z—Y—X |
|---|---|
| I-46 | 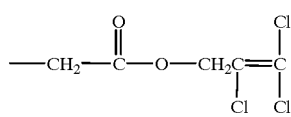 |
| I-47 | 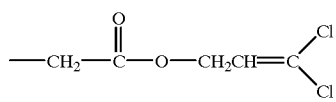 |
| I-48 | 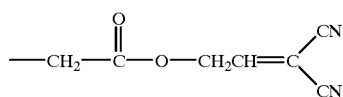 |
| I-49 | 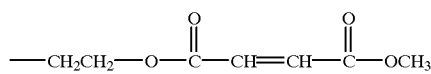 |
| I-50 | 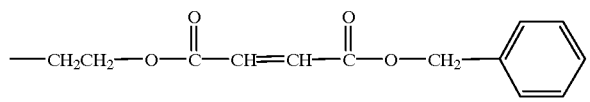 |
| I-51 | 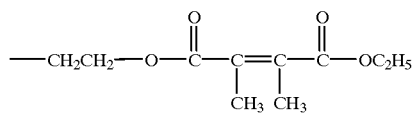 |
| I-52 | 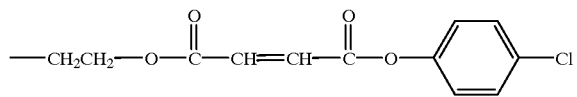 |
| I-53 | 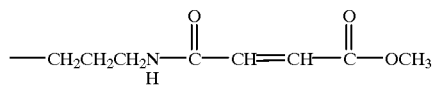 |
| I-54 | 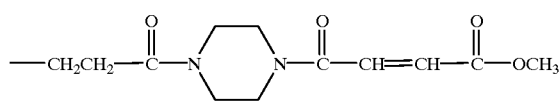 |
| I-55 | 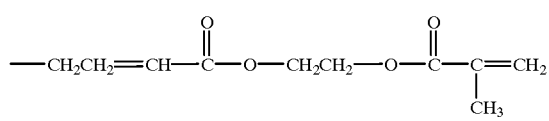 |

-continued
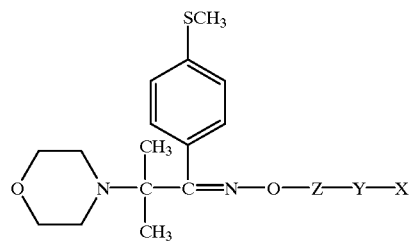
| Compound No. | Structure of —Z—Y—X |
|---|---|
| I-56 | 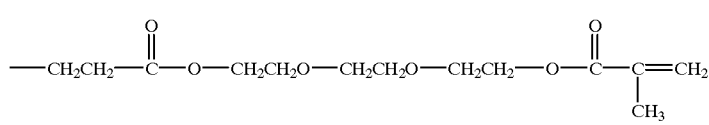 |
| I-57 | 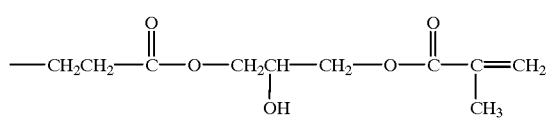 |
| I-58 | 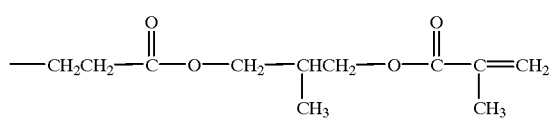 |
| I-59 | 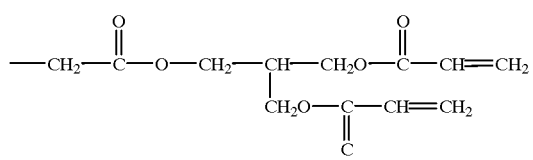 |
| I-60 | 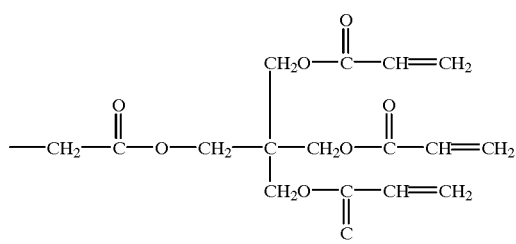 |
| I-61 | 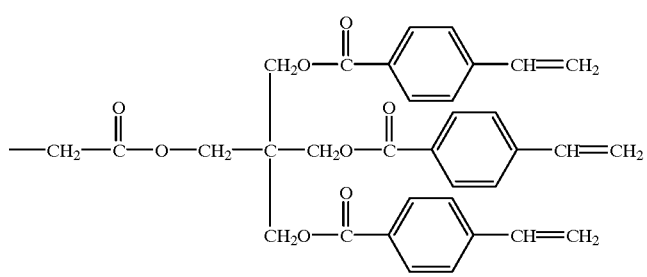 |

-continued
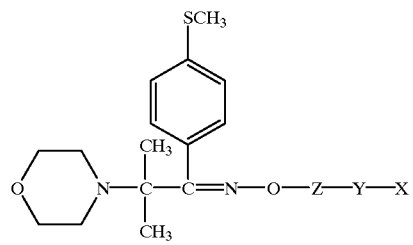
| Compound No. | Structure of —Z—Y—X |
|---|---|
I-62
I-63
I-64
I-65
I-66
I-67
I-68

-continued

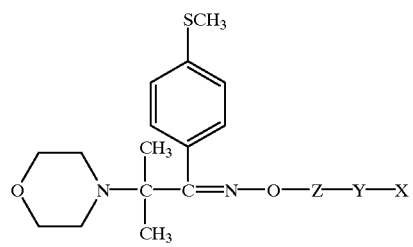

| Compound No. | Structure of —Z—Y—X |
|---|---|
| I-69 | —CH₂CH₂CH₂CH₂CH₂O—C(=O)—C(CH₃)=CH₂ |
| I-70 | —CH₂—(C₆H₄)—O—C(=O)—CH=CH₂ |
| I-71 | —(C₆H₄)—S(=O)₂—NH—S(=O)₂—(C₆H₄)—CH=CH₂ |
| I-72 | —CH₂CH₂CH₂—S(=O)₂—NH—(C₆H₄)—CH=CH₂ |
| I-73 | —CH(CH₃)CH₂CH₂O—C(=O)—C(CH₃)=CH₂ |
| I-74 | —CH₂CH₂—C(=O)—N(piperidine-4-yl)—O—C(=O)—CH=CH₂ |
| I-75 | —CH₂CH₂—C(=O)—N(piperidine-4-yl)—C(=O)—O—CH₂—(C₆H₄)—CH=CH₂ |
| I-76 | —CH₂CH₂—C(=O)—N(piperidine-4-yl)—CH₂NH—C(=O)—CH=CH₂ |
| I-77 | —CH₂CH₂—C(=O)—N(piperidine-4-yl)—CH₂NH—CH₂CH₂C(=O)—O—CH₂CH₂—O—C(=O)—CH=CH₂ |
| I-78 | —CH₂—C(=O)—CH₂—C(=O)—O—CH₂—(C₆H₄)—CH=CH₂ |

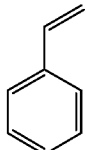
| Compound No. | —R¹ | —R² | —R³ | —R⁴ | —Ar |
|---|---|---|---|---|---|
| I-79 | —CH$_3$ | —CH$_3$ | —CH$_3$ | —CH$_3$ | 4-SCH$_3$-C$_6$H$_4$— |
| I-80 | —CH$_3$ | —CH$_3$ | —CH$_2$C$_6$H$_5$ | —CH$_3$ | 4-SCH$_3$-C$_6$H$_4$— |
| I-81 | —CH$_3$ | —CH$_3$ | —CH$_2$C$_6$H$_5$ | —$^n$C$_3$H$_7$ | C$_6$H$_5$— |
| I-82 | —C$_2$H$_5$ | —CH$_3$ | —CH$_3$ | —CH$_2$CH$_2$OCH$_3$ | 4-OCH$_3$-C$_6$H$_4$— |
| I-83 | —C$_2$H$_5$ | —C$_2$H$_5$ | —C$_2$H$_5$ | —C$_2$H$_5$ | 4-Cl-C$_6$H$_4$— |
| I-84 | —$^n$C$_4$H$_9$ | —$^n$C$_4$H$_9$ | —CH$_2$C$_6$H$_5$ | —CH$_2$C$_6$H$_5$ | 4-(CH$_3$SO$_2$)-C$_6$H$_4$— |
| I-85 | —CH$_2$CH$_2$OH | —CH$_2$CH$_2$OH | —CH$_3$ | —CH$_3$ | 3-CN-C$_6$H$_4$— |

-continued
| Compound No. | -R¹ | -R² | -R³ | -R⁴ | -Ar |
|---|---|---|---|---|---|
| I-86 | -CH₂CH₂OCH₃ | -CH₂CH₂OCH₃ | -CH₃ | -CH₃ | 2,4-dimethoxy-methylphenyl |
| I-87 | -CH₂CH₂CN | -CH₂CH₂CN | -CH₃ | -CH₃ | 2,4-bis(methylthio)-methylphenyl |
| I-88 | phenyl | -CH₃ | -CH₃ | -CH₃ | 4-methoxyphenyl |
| I-89 | phenyl | -C₂H₅ | -CH₂CH=CH₂ | -CH₃ | 4-methoxyphenyl |
| I-90 | -CH₃ | -CH₃ | -CH₂-(4-chlorophenyl) | -CH₃ | 4-(morpholino)phenyl |
| I-90 | -CH₃ | -ⁿC₄H₉ | -CH₂-(4-methoxyphenyl) | -CH₃ | 4-methoxyphenyl |
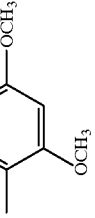

I-91
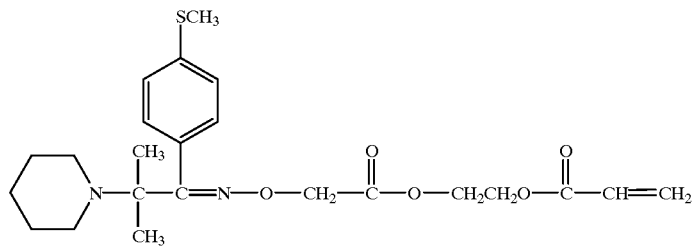
I-92
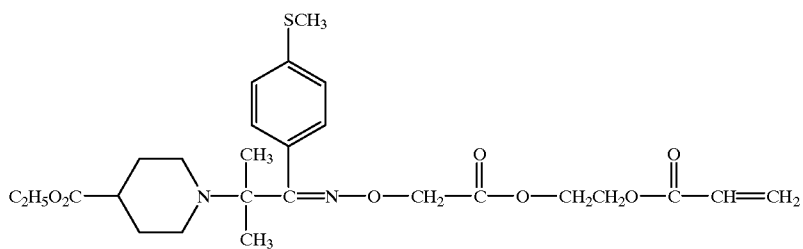
I-93
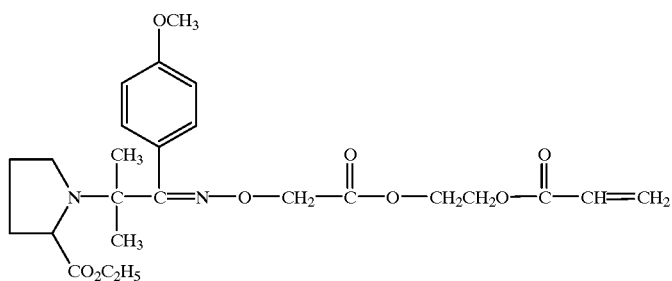
I-94
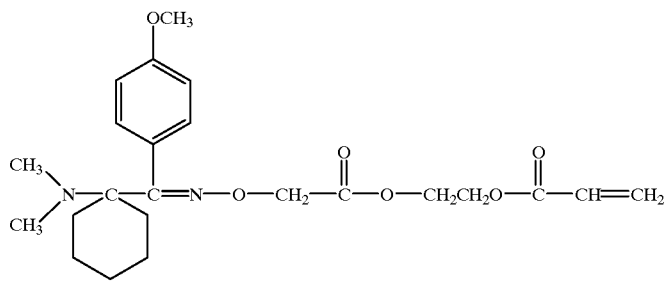
I-95
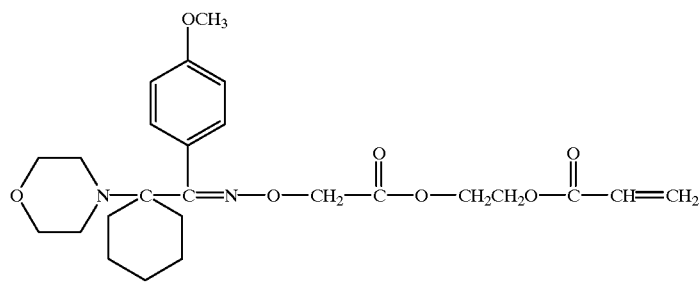

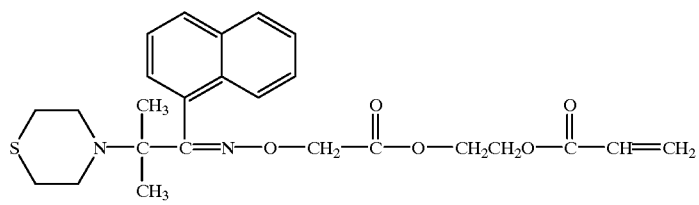

The oxime ether compound represented by formula (I) may be used alone or in combination of two or more thereof.

The compound represented by formula (I) is used in an amount of generally from 0.05 to 50%, preferably from 0.5 to 35%, more preferably from 1 to 25%, based on the amount of all the ingredients (excluding a solvent) of the photopolymerizable composition. If the amount is larger than 50%, film formation failure (cracking) may be caused, and if it is smaller than 0.05%, curing failure may be caused.

A known photopolymerization initiator is preferably incorporated as ingredient (iii) in the photosensitive composition of the present invention. Preferred examples of the photopolymerization initiator include (a) aromatic ketones, (b) aromatic onium salt compounds, (c) organic peroxides, (d) thio compounds, (e) hexaarylbiimidazole compounds, (f) ketoxime ester compounds, (g) borate compounds, (h) azinium compounds, (i) metallocene compounds, (j) active ester compounds, and (k) compounds having one or more carbon-halogen bonds.

Preferred examples of the aromatic ketones (a) as an example of ingredient (iii) include the compounds having a benzophenone or thioxanthone structure which are described in "RADIATION CURING IN POLYMER SCIENCE AND TECHNOLOGY", J. P. Fouassier and J. F. Rabek (1993), pp. 77–117. Specific examples thereof include the following.

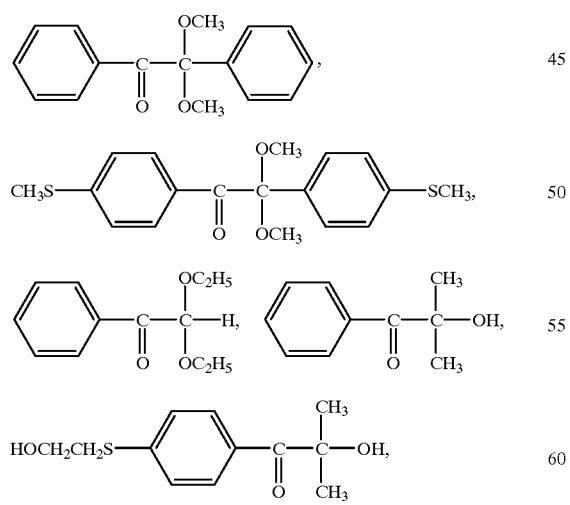

I-96

-continued

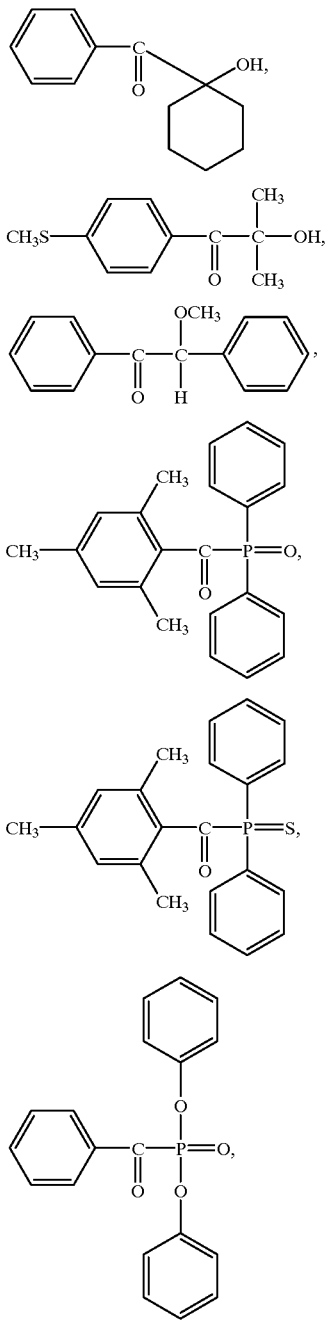

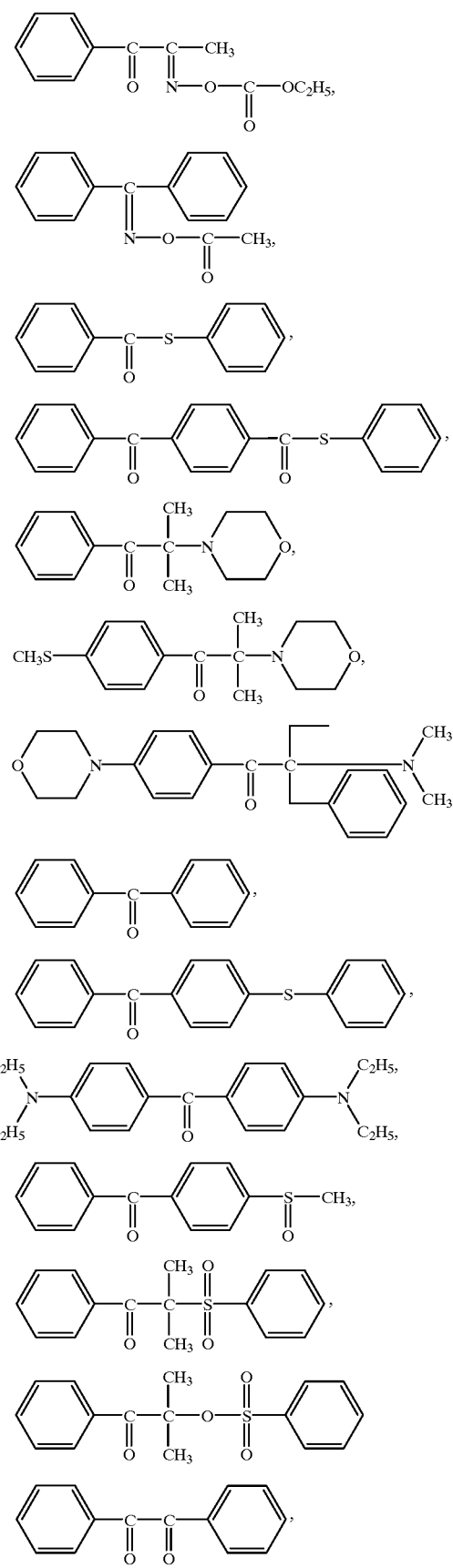
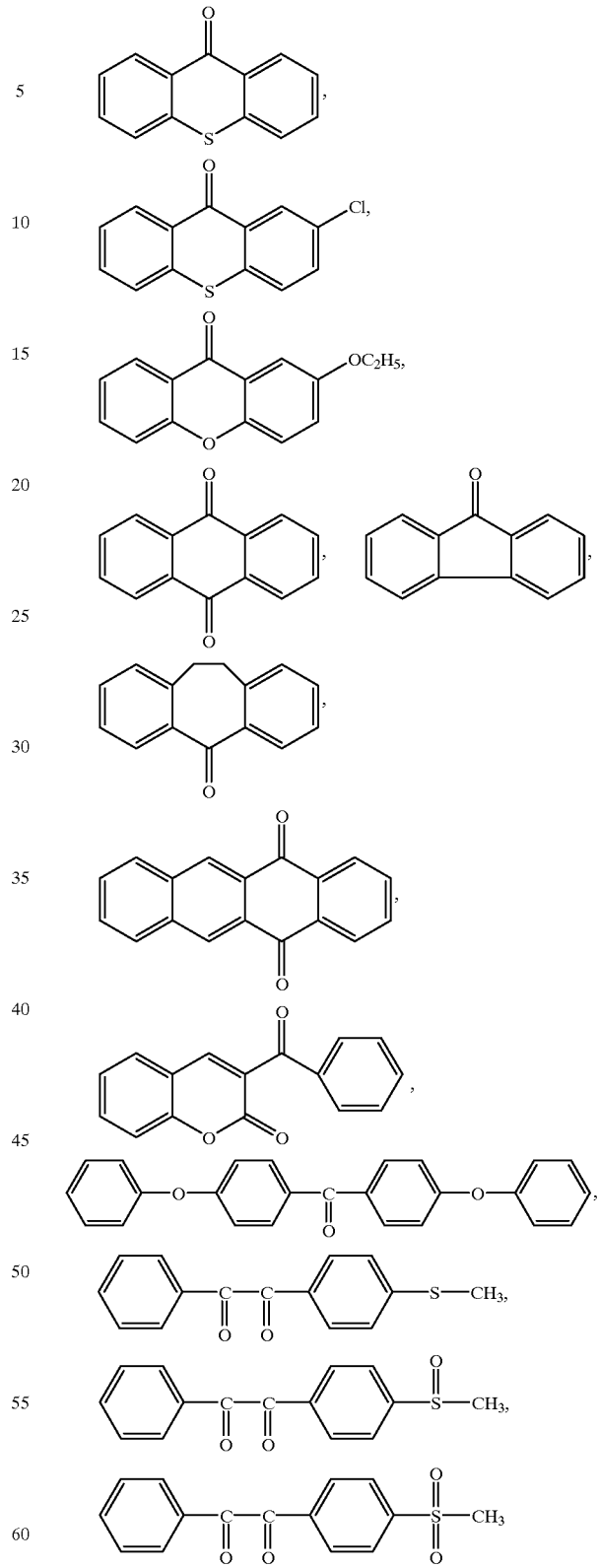
More preferred examples of the aromatic ketones (a) include the a-thiobenzophenone compounds described in JP-B-47-6416, the benzoin ether compounds described in JP-B-47-3981, e.g.,

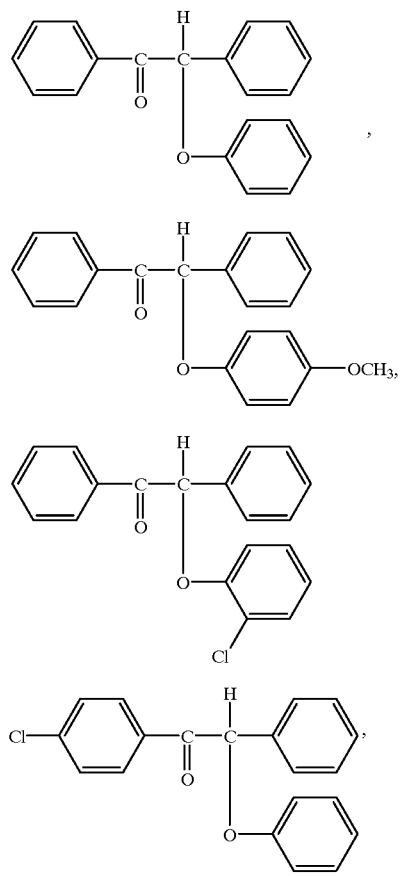
the α-substituted benzoin compounds described in JP-B-47-22326, e.g.,
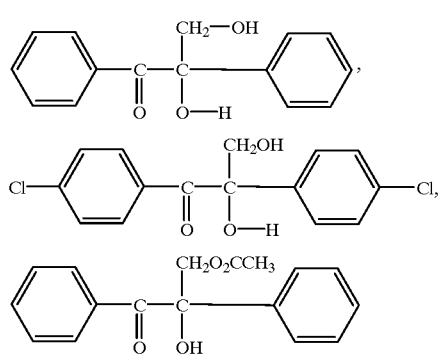
the benzoin derivatives described in JP-B-47-23664, the aroylphosphonic esters described in JP-A-57-30704, the dialkoxybenzophenones described in JP-B-60-26483, e.g.,
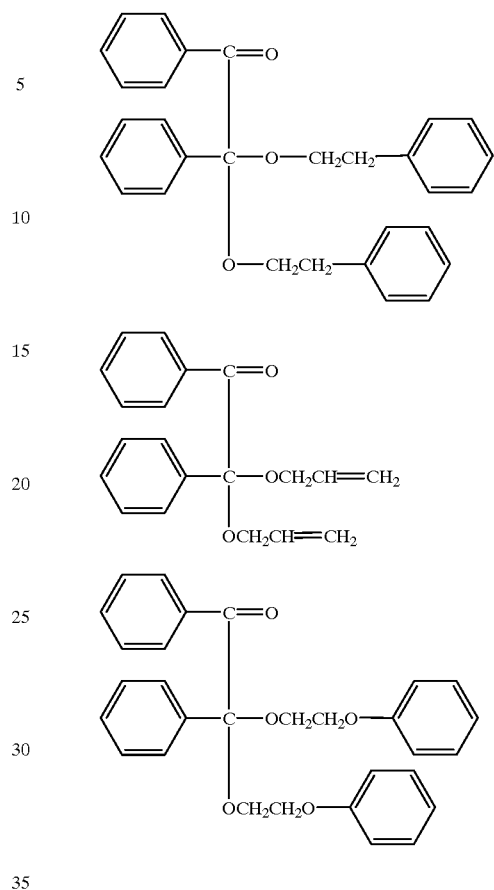
the benzoin ethers described in JP-B-60-26403 and JP-A-62-81345, e.g.,
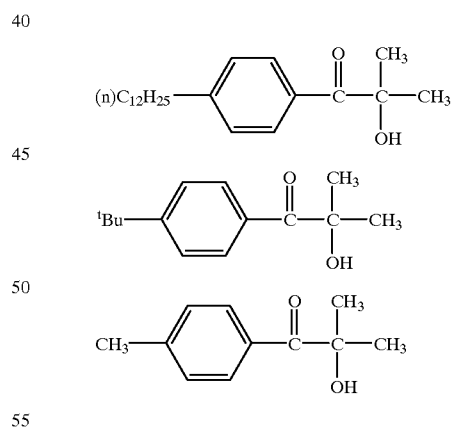
the α-aminobenzophenones described in JP-B-1-34242, U.S. Pat. No. 4,318,791, and EP 0284561 A1, e.g.,

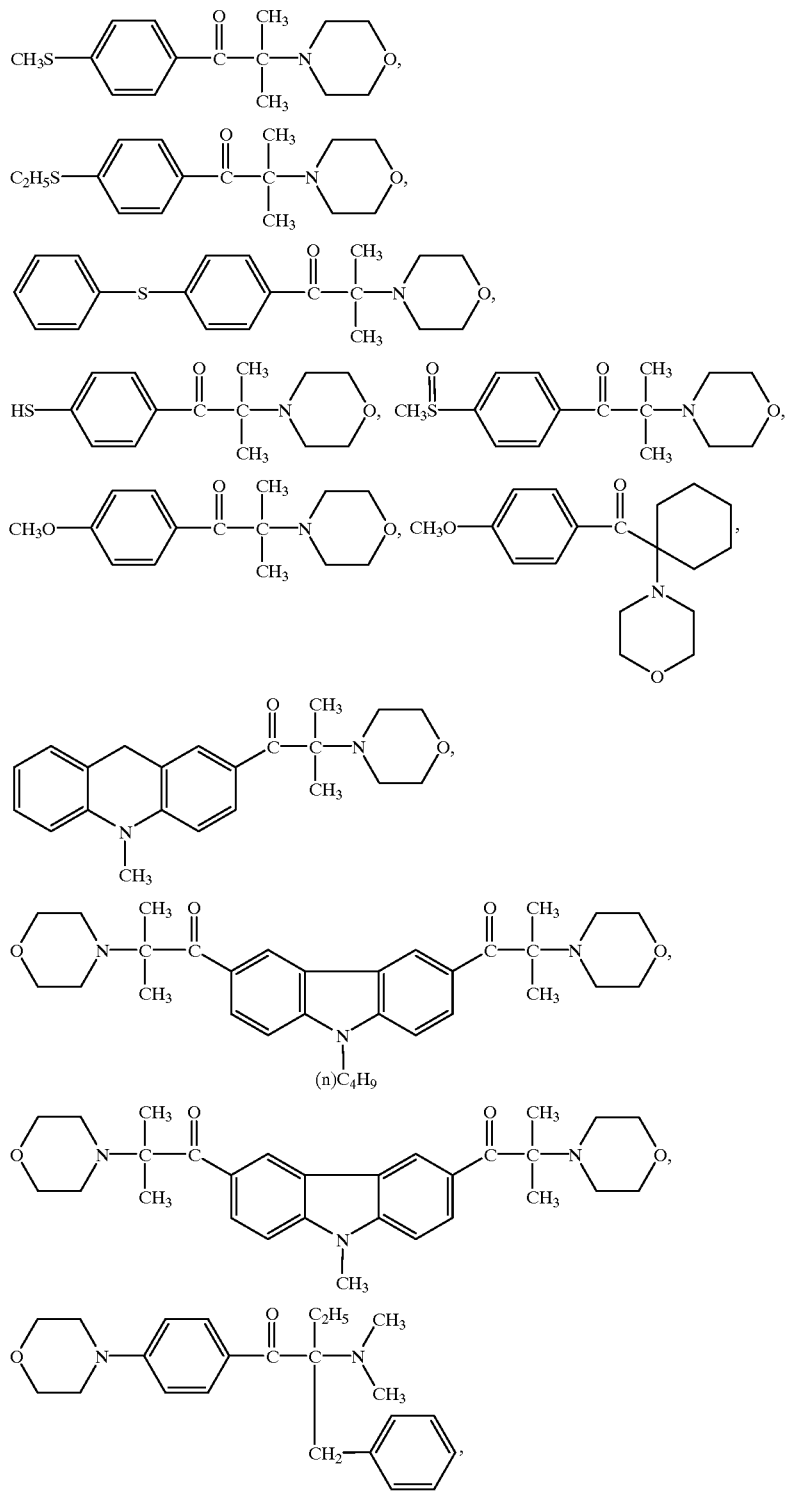
the p-di(dimethylaminobenzoyl)benzenes described in JP-A-2-211452, e.g.,
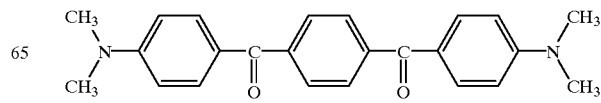

the thio-substituted aromatic ketones described in JP-A-61-194062, e.g.,

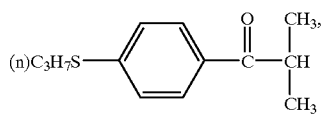

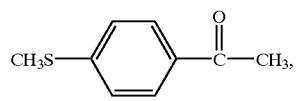

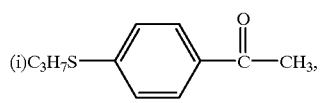

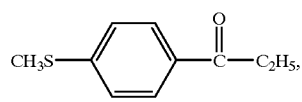

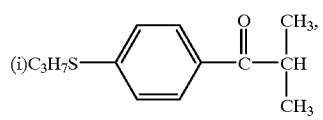

the acylphosphine sulfides described in JP-B-2-9597, e.g.,

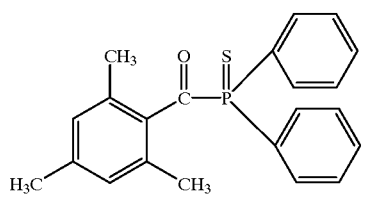

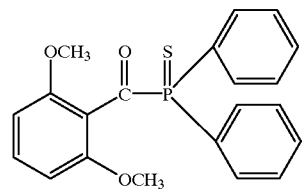

the acylphosphines described in JP-B-2-9596, e.g.,

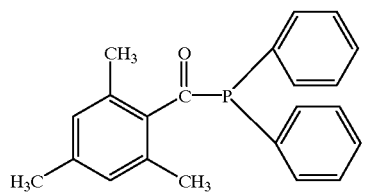

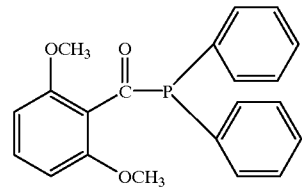

the thioxanthone derivatives described in JP-B-63-61950, and the coumarin derivatives described in JP-B-59-42864.

Examples of the aromatic onium salts (b) as another example of ingredient (iii) include aromatic onium salts of elements of Groups V, VI, and VII of the periodic table, specifically, nitrogen, phosphorus, arsenic, antimony, bismuth, oxygen, sulfur, selenium, tellurium, and iodine. Examples of such aromatic onium salts are described in JP-B-52-14277, JP-B-52-14278, and JP-B-52-14279.

Specific examples thereof include the following.

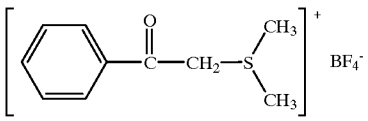

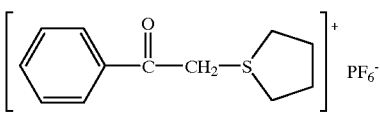

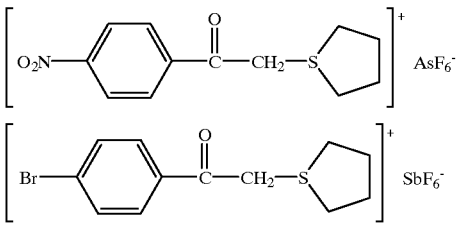

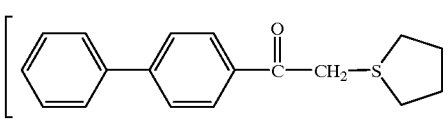

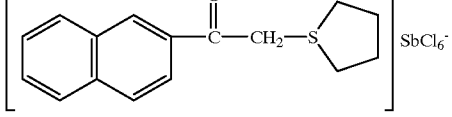

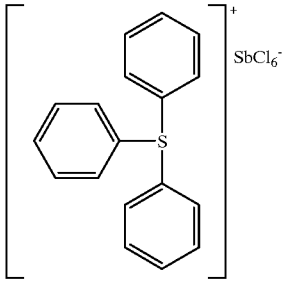

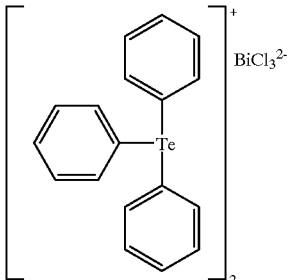

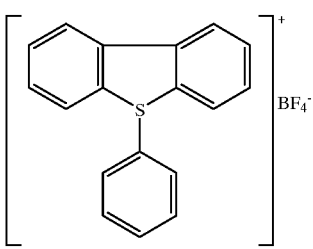

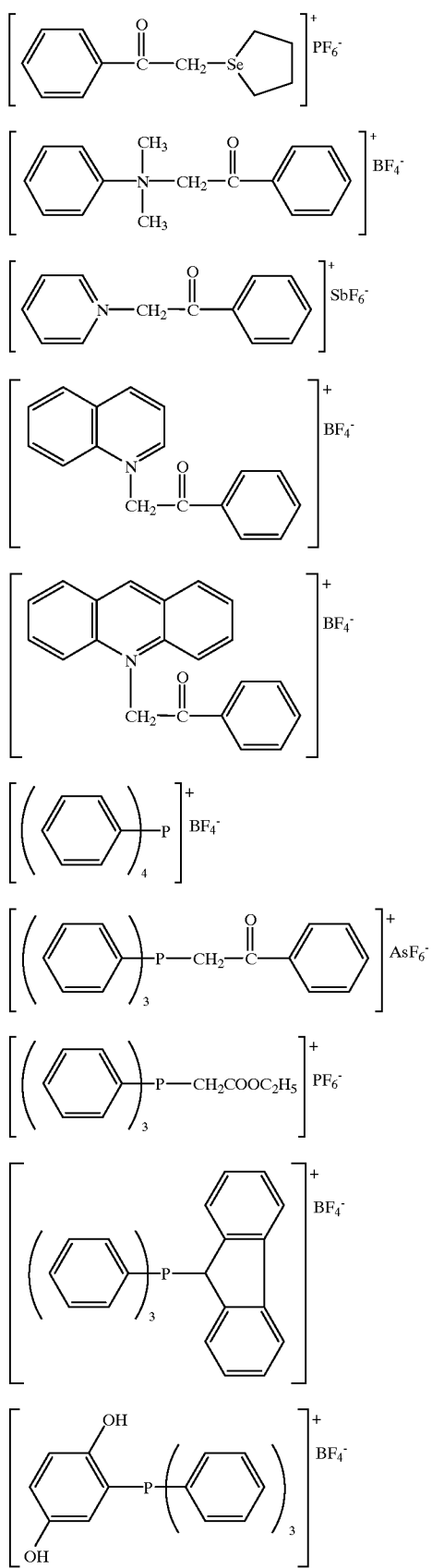
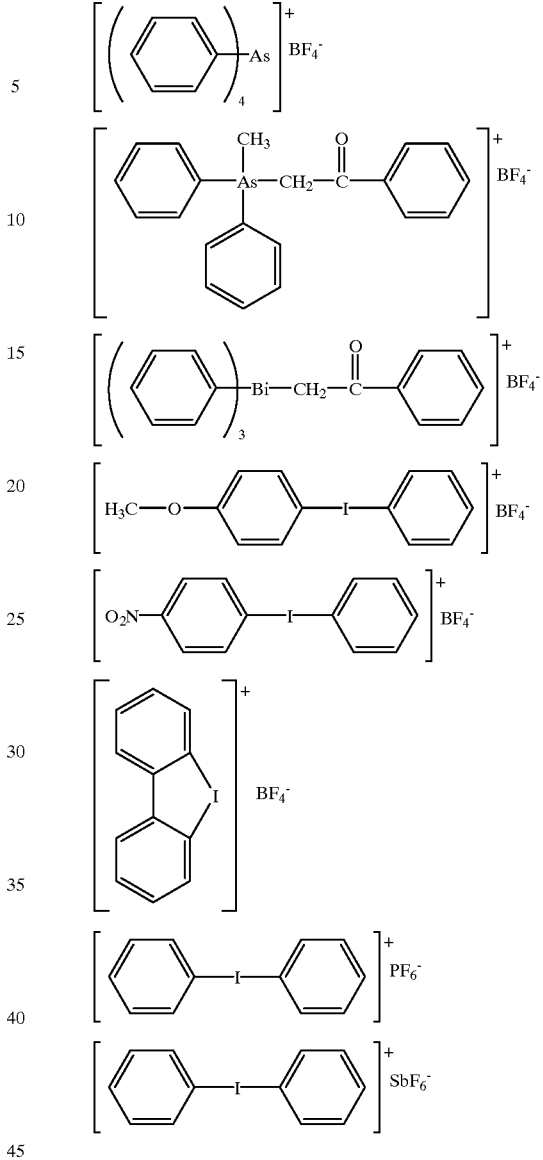

Examples of the "organic peroxides" (c) as still another example of ingredient (iii) for use in the present invention include almost all of the organic compounds each having one or more oxygen—oxygen bonds in the molecule. Specific examples thereof include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethylhexane 2,5-dihydroperoxide, 1,1,3,3-tetramethylbutyl hydroperoxide, di-tert-butyl peroxide, tert-butyl cumyl peroxide, dicumyl peroxide, bis(tert-butylperoxyisopropyl)benzene, 2,5-dimethyl-2,5-di(tert-butylperoxy)hexane, 2,5-xanoyl peroxide, succinic acid peroxide, benzoyl peroxide, 2,4-dichlorobenzoyl peroxide, m-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tert-carbonate, 3,3',4,4'-tetra(t-butylperoxycarbonyl)-benzophenone, 3,3',4,4'-tetra(t-amylperoxycarbonyl)-benzophenone, 3,3',4,4'-tetra(t-hexylperoxycarbonyl)-benzophenone, 3,3',4,4'-tetra(t-octylperoxycarbonyl)-benzophenone, 3,3',4,4'-tetra(cumylperoxycarbonyl)benzophenone, 3,3',4,4'-tetra(p-isopropylcumylperoxycarbonyl)benzophenone, carbonyldi(t-butyl peroxydihydrogendiphthalate), and carbonyldi(t-hexyl peroxydihydrogendiphthalate).

Preferred thereof are peroxyesters such as 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, and di-t-butyl diperoxyisophthalate.

The thio compounds (d) as ingredient (iii) for use in the present invention are represented by the following formula (II):

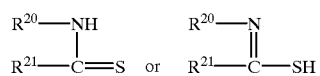

(wherein $R^{20}$ represents an alkyl group, an aryl group, or a substituted aryl group and $R^{21}$ represents a hydrogen atom or an alkyl group, provided that $R^{20}$ and $R^{21}$ may be bonded to each other to form a group of nonmetallic-element atoms which are necessary for forming a five- to seven-membered ring and may contain one or more heteroatoms selected from oxygen, sulfur, and nitrogen atoms).

The alkyl group represented by $R^{20}$ in formula (II) preferably has 1 to 4 carbon atoms. The aryl group represented by $R^{20}$ is preferably one having 6 to 10 carbon atoms, such as phenyl or naphthyl. Examples of the substituted aryl group include an aryl group substituted with substituent(s) selected from a halogen atom (e.g., chlorine), an alkyl group (e.g., methyl), and an alkoxy group (e.g., methoxy and ethoxy).

$R^{21}$ is preferably an alkyl group having 1 to 4 carbon atoms.

Specific examples of the thio compounds represented by formula (II) include the following compounds.

TABLE 1

| No. | $R^{20}$ | $R^{21}$ |
|---|---|---|
| 1 | H | H |
| 2 | H | $CH_3$ |
| 3 | $CH_3$ | H |
| 4 | $CH_3$ | $CH_3$ |
| 5 | $C_6H_5$ | $C_2H_5$ |
| 6 | $C_6H_5$ | $C_4H_9$ |
| 7 | $C_6H_4Cl$ | $CH_3$ |
| 8 | $C_6H_4Cl$ | $C_4H_9$ |
| 9 | $C_6H_4$—$CH_3$ | $C_4H_9$ |
| 10 | $C_6H_4$—$OCH_3$ | $CH_3$ |
| 11 | $C_6H_4$—$OCH_3$ | $C_2H_5$ |
| 12 | $C_6H_4OC_2H_5$ | $CH_3$ |
| 13 | $C_6H_4OC_2H_5$ | $C_2H_5$ |

TABLE 1-continued

| No. | $R^{20}$ | $R^{21}$ |
|---|---|---|
| 14 | $C_6H_4OCH_3$ | $C_4H_9$ |
| 15 | —$(CH_2)_2$— | |
| 16 | —$(CH_2)_2$—S— | |
| 17 | —$CH(CH_3)$—$CH_2$—S— | |
| 18 | —$CH_2$—$CH(CH_3)$—S— | |
| 19 | —$C(CH_3)_2$—$CH_2$—S— | |
| 20 | —$CH_2$—$C(CH_3)_2$—S— | |
| 21 | —$(CH_2)_2$—O— | |
| 22 | —$CH(CH_3)$—$CH_2$—O— | |
| 23 | —$C(CH_3)_2$—$CH_2$—O— | |
| 24 | —CH=CH—$N(CH_3)$— | |
| 25 | —$(CH_2)_3$—S— | |
| 26 | —$(CH_2)_2$—$CH(CH_3)$—S— | |
| 27 | —$(CH_2)_3$—O— | |
| 28 | —$(CH_2)_5$— | |
| 29 | —$C_6H_4$—O— | |
| 30 | —N=$C(SCH_3)$—S— | |
| 31 | —$C_6H_4$—NH— | |
| 32 | (chlorine-substituted methylphenyl ether structure) | |

Examples of the hexaarylbiimidazole compounds (e) as a further example of ingredient (iii) for use in the present invention include the lophine dimer derivatives described in JP-B-45-37377 and JP-B-44-86516, e.g., 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

Examples of the ketoxime esters (f) as still a further example of ingredient (iii) for use in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one, and 2-ethoxycarbonyloxyimino-1-phenylpropan-1-one.

Examples of the borate salts (g) as still a further example of ingredient (iii) in the present invention include compounds represented by the following formula (III):

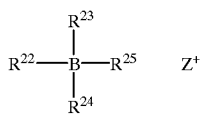 (III)

(wherein $R^{22}$, $R^{23}$, $R^{24}$, and $R^{25}$, which may be the same or different, each represents a substituted or unsubstituted alkyl group, a substituted or unsubstituted aryl group, a substituted or unsubstituted alkenyl group, a substituted or unsubstituted alkynyl group, or a substituted or unsubstituted heterocyclic group, provided that two or more of $R^{22}$, $R^{23}$, $R^{24}$, and $R^{25}$ may be bonded to each other to form a ring structure, with at least one of $R^{22}$, $R^{23}$, $R^{24}$, and $R^{25}$ being a substituted or unsubstituted alkyl group; and $Z^+$ represents an alkali metal cation or a quaternary ammonium cation).

Examples of the alkyl group represented by $R^{22}$ to $R^{25}$ include linear, branched, and cyclic alkyl groups preferably having 1 to 18 carbon atoms. Specific examples thereof include methyl, ethyl, propyl, isopropyl, butyl, pentyl, hexyl, octyl, stearyl, cyclobutyl, cyclopentyl, and cyclohexyl. Examples of the substituted alkyl group include an alkyl group having substituent(s) selected from a halogen atom (e.g., —Cl and —Br), cyano, nitro, an aryl group (preferably phenyl), hydroxy,

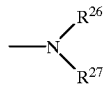

(wherein $R^{26}$ and $R^{27}$ each independently represents a hydrogen atom, an alkyl group having 1 to 14 carbon atoms, or an aryl group), —COOR$^{28}$ (wherein $R^{28}$ represents a hydrogen atom, an alkyl group having 1 to 14 carbon atoms, or an aryl group), —OCOR$^{29}$, and —OR$^{30}$ (wherein $R^{29}$ and $R^{30}$ each represents an alkyl group having 1 to 14 carbon atoms, or an aryl group).

Examples of the aryl group represented by $R^{22}$ to $R^{25}$ include uni- to tricyclic aryl groups such as phenyl and naphthyl. Examples of the substituted aryl group include an aryl group having substituent(s) selected from the aforementioned substituents for the substituted alkyl group and from an alkyl group having 1 to 14 carbon atoms.

Examples of the alkenyl group represented by $R^{22}$ to $R^{25}$ include linear, branched, and cyclic alkenyl groups having 2 to 18 carbon atoms. Examples of the substituent(s) of the substituted alkenyl group include the aforementioned substituents for the substituted alkyl group.

Examples of the alkynyl group represented by $R^{22}$ to $R^{25}$ include linear and branched alkynyl groups having 2 to 28 carbon atoms. Examples of the substituent(s) of the substituted alkynyl group include the aforementioned substituents for the substituted alkyl group.

Examples of the heterocyclic group represented by $R^{22}$ to $R^{25}$ include five-membered and larger, preferably five- to seven-membered, heterocyclic groups containing at least one of nitrogen, sulfur, and oxygen atoms. This heterocyclic group may contain a fused ring. The heterocyclic group may have substituent(s) selected from the aforementioned substituents for the substituted aryl group.

Specific examples of the compounds represented by formula (III) include the borate compounds described in U.S. Pat. Nos. 3,567,453 and 4,343,891 and European Patents 109,772 and 109,773 and the following compounds.

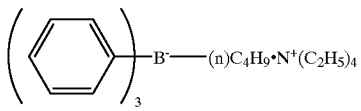
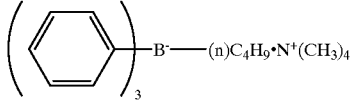
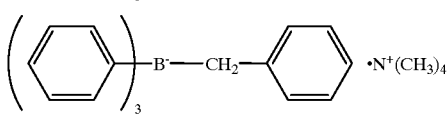
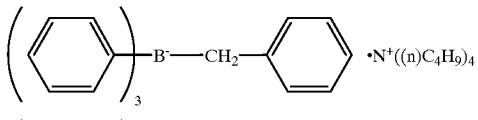
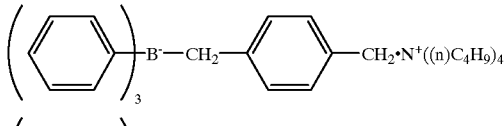
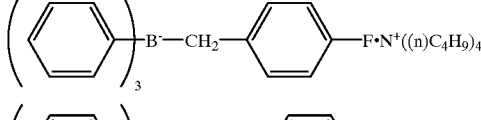
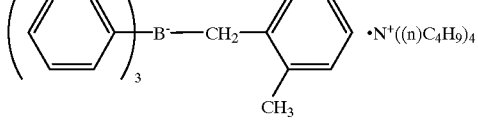
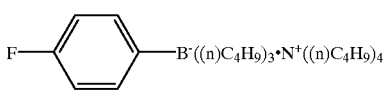
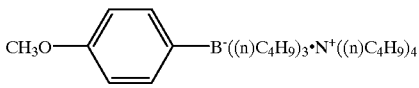

Examples of the azinium salt compounds (h) as still a further example of ingredient (iii) for use in the present invention include the compounds having an N—O bond which are described in JP-A-63-138345, JP-A-63-142345, JP-A-63-142346, JP-A-63-143537, and JP-B-46-42363.

Examples of the metallocene compounds (i) as still a further example of ingredient (iii) include the titanocene compounds described in JP-A-59-152396, JP-A-61-151197, JP-A-63-41484, JP-A-2-249, and JP-A-2-4705 and the iron-arene complexes described in JP-A-1-304453 and JP-A-1-152109.

Specific examples of the titanocene compounds include dicyclopentadienyl-Ti dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-2,6-difluorophen-1-yl, dicyclopentadienyl-Ti-bis-2,4-difluorophen-1-yl, di(methylcyclopentadienyl)-Ti-bis-2,3,4,5,6-pentafluorophen-1-yl,di(methylcyclopentadienyl)-Ti-bis-2,3,5,6-tetrafluorophen-1-yl,di(methylcyclopentadienyl)-Ti-bis-2,4-difluorophen-1-yl, bis(cyclopentadienyl)bis(2,6-difluoro-3-(pyr-1-yl)phenyl)titanium, bis(cyclopentadienyl)bis[2,6-difluoro-3-(methylsulfonamido)phenyl]titanium,
bis(cyclopentadienyl)bis[2,6-difluoro-3-(N-butylbiaroylamino)phenyl]titaniums, bis(cyclopentadienyl)bis[2,6-difluoro-3-(N-ethylacetylamino)phenyl]titanium,
bis(cyclopentadienyl)bis[2,6-difluoro-3-(N-methylacetylamino)phenyl]titanium,
bis(cyclopentadienyl)bis[2,6-difluoro-3-(N-ethylpropionylamino)phenyl]titanium,
bis(cyclopentadienyl)bis[2,6-difluoro-3-(N-ethyl(2,2-dimethylbutanoyl)amino)phenyl]titanium,
bis(cyclopentadienyl)bis[2,6-difluoro-3-(N-butyl(2,2-dimethylbutanoyl)amino)phenyl]titanium,
bis(cyclopentadienyl)bis[2,6-difluoro-3-(N-pentyl(2,2-dimethylbutanoyl)amino)phenyl]titanium,
bis(cyclopentadienyl)bis[2,6-difluoro-3-(N-hexyl(2,2-dimethylbutanoyl)phenyl]titanium,
bis(cyclopentadienyl)bis[2,6-difluoro-3-(N-methylbutyrylamino)phenyl]titanium,
bis(cyclopentadienyl)bis[2,6-difluoro-3-(N-methylpentanoylamino)phenyl]titanium,
bis(cyclopentadienyl)bis[2,6-difluoro-3-(N-ethylcyclohexylcarbonylamino)phenyl]titanium,
bis(cyclopentadienyl)bis[2,6-difluoro-3-(N-ethylisobutyrylamino)phenyl]titanium,
bis(cyclopentadienyl)bis[2,6-difluoro-3-(N-ethylacetylamino)phenyl]titanium,
bis(cyclopentadienyl)bis[2,6-difluoro-3-(2,2,5,5-tetramethyl-1,2,5-azadisyrrolidin-1-yl)phenyl]titanium,
bis(cyclopentadienyl)bis[2,6-difluoro-3-(octylsulfonamido)phenyl]titanium,
bis(cyclopentadienyl)bis[2,6-difluoro-3-(4-tolylsulfonamido)phenyl]titanium,
bis(cyclopentadienyl)bis[2,6-difluoro-3-(4-dodecylphenylsulfonylamido)phenyl]titanium,
bis(cyclopentadienyl)bis[2,6-difluoro-3-(4-(1-pentylheptyl)phenylsulfonylamido)phenyl]titanium,
bis(cyclopentadienyl)bis[2,6-difluoro-3-(ethylsulfonylamido)phenyl]titanium,
bis(cyclopentadienyl)bis[2,6-difluoro-3-((4-bromophenyl)sulfonylamido)phenyl]titanium,
bis(cyclopentadienyl)bis[2,6-difluoro-3-(2-naphthylsulfonylamido)phenyl]titanium,
bis(cyclopentadienyl)bis[2,6-difluoro-3-(hexadecylsulfonylamido)phenyl]titanium,
bis(cyclopentadienyl)bis[2,6-difluoro-3-(N-methyl(4-dodecylphenyl)sulfonylamido)phenyl]titanium,
bis(cyclopentadienyl)bis[2,6-difluoro-3-(N-methyl-4-(1-pentylheptyl)phenyl)sulfonylamido)]titanium,
bis(cyclopentadienyl)bis[2,6-difluoro-3-(N-hexyl(4-tolyl)sulfonylamido)phenyl]titanium,
bis(cyclopentadienyl)bis[2,6-difluoro-3-(pyrrolidine-2,5-dion-1-yl)phenyl]titanium,
bis(cyclopentadienyl)bis[2,6-difluoro-3-(3,4-dimethyl-3-pyrrolidine-2,5-dion-1-yl)phenyl]titanium,
bis(cyclopentadienyl)bis[2,6-difluoro-3-(phthalimido)phenyl]titanium,
bis(cyclopentadienyl)bis[2,6-difluoro-3-isobutoxycarbonylamino)phenyl]titanium,
bis(cyclopentadienyl)bis[2,6-difluoro-3-(ethoxycarbonylamino)phenyl]titanium,
bis(cyclopentadienyl)bis[2,6-difluoro-3-((2-chloroethoxy)carbonylamino)phenyl]titanium,
bis(cyclopentadienyl)bis[2,6-difluoro-3-(phenoxycarbonylamino)phenyl]titanium,
bis(cyclopentadienyl)bis[2,6-difluoro-3-(3-phenylthiouredio)phenyl]titanium,
bis(cyclopentadienyl)bis[2,6-difluoro-3-(3-butylthioureido)phenyl]titanium,
bis(cyclopentadienyl)bis[2,6-difluoro-3-(3-phenylureido)phenyl]titanium,
bis(cyclopentadienyl)bis[2,6-difluoro-3-(3-butylureido)phenyl]titanium,
bis(cyclopentadienyl)bis[2,6-difluoro-3-(N,N-diacetylamino)phenyl]titanium,
bis(cyclopentadienyl)bis[2,6-difluoro-3-(3,3-dimethylureido)phenyl]titanium,
bis(cyclopentadienyl)bis[2,6-difluoro-3-(acetylamino)phenyl]titanium,
bis(cyclopentadienyl)bis[2,6-difluoro-3-(butyrylamino)phenyl]titanium,
bis(cyclopentadienyl)bis[2,6-difluoro-3-(decanoylamino)phenyl]titanium,
bis(cyclopentadienyl)bis[2,6-difluoro-3-(octadecanoylamino)phenyl]titanium,
bis(cyclopentadienyl)bis[2,6-difluoro-3-(isobutyrylamino)phenyl]titanium,
bis(cyclopentadienyl)bis[2,6-difluoro-3-(2-ethylhexanoylamino)phenyl]titanium,
bis(cyclopentadienyl)bis[2,6-difluoro-3-(2-methylbutanoylamino)phenyl]titanium,
bis(cyclopentadienyl)bis[2,6-difluoro-3-(pivaloylamino)phenyl]titanium,
bis(cyclopentadienyl)bis[2,6-difluoro-3-(2,2-dimethylbutanoylamino)phenyl]titanium,
bis(cyclopentadienyl)bis[2,6-difluoro-3-(2-ethyl-2-methylheptanoylamino)phenyl]titanium,
bis(cyclopentadienyl)bis[2,6-difluoro-3-(cyclohexylcarbonylamino)phenyl]titanium,
bis(cyclopentadienyl)bis[2,6-difluoro-3-(2,2-dimethyl-3-chloropropanoylamino)phenyl]titanium,
bis(cyclopentadienyl)bis[2,6-difluoro-3-(3-phenylpropanoylamino)phenyl]titanium,
bis(cyclopentadienyl)bis[2,6-difluoro-3-(2-chloromethyl-2-methyl-3-chloropropanoylamino)phenyl]titanium,
bis(cyclopentadienyl)bis[2,6-difluoro-3-(3,4-xyloylamino)phenyl]titanium,
bis(cyclopentadienyl)bis[2,6-difluoro-3-(4-ethylbenzoylamino)phenyl]titanium,
bis(cyclopentadienyl)bis[2,6-difluoro-3-(2,4,6-mesitylcarbonylamino)phenyl]titanium,
bis(cyclopentadienyl)bis[2,6-difluoro-3-(benzoylamino)phenyl]titanium,
bis(cyclopentadienyl)bis[2,6-difluoro-3-(N-(3-phenylpropyl)benzoylamino)phenyl]titanium,
bis(cyclopentadienyl)bis[2,6-difluoro-3-(N-(3-ethylheptyl)-2,2-dimethylpentanoylamino]phenyltitanium,
bis(cyclopentadienyl)bis[2,6-difluoro-3-(N-isobutyl(4-toluyl)amino)phenyl]titanium,
bis(cyclopentadienyl)bis[2,6-difluoro-3-(N-isobutylbenzoylamino)phenyl]titanium,
bis(cyclopentadienyl)bis[2,6-difluoro-3-(N-cyclohexylmethylpivaloylamino)phenyl]titanium,
bis(cyclopentadienyl)bis[2,6-difluoro-3-(N-oxolan-2-ylmethyl)benzoylamino)phenyl]titanium,
bis(cyclopentadienyl)bis[2,6-difluoro-3-(N-(3-ethylheptyl)-2,2-dimethylbutanoylamino)phenyl]titanium, bis(cyclopentadienyl)bis[2,6-difluoro-3-(N-(3-phenylpropyl(4-toluyl)amino)phenyl]titanium,
bis(cyclopentadienyl)bis[2,6-difluoro-3-(N-(oxolan-2-ylmethyl)(4-toluyl)amino)phenyl]titanium,
bis(cyclopentadienyl)bis[2,6-difluoro-3-(N-(4-toluylmethyl)benzoylamino)phenyl]titanium,
bis(cyclopentadienyl)bis[2,6-difluoro-3-(N-(4-toluylmethyl)(4-toluyl)amino)phenyl]titanium,
bis(cyclopentadienyl)bis[2,6-difluoro-3-(N-butylbenzoylamino)phenyl]titanium,
bis(cyclopentadienyl)bis[2,6-difluoro-3-(N-butyl(4-toluyl)amino)phenyl]titanium,
bis(cyclopentadienyl)bis[2,6-difluoro-3-(N-hexyl(4-toluyl)amino)phenyl]titanium,
bis(cyclopentadienyl)bis[2,6-difluoro-3-(N-(2,4-dimethylpentyl)-2,2-dimethylbutanoylamino)phenyl]titanium,
bis(cyclopentadienyl)bis[2,6-difluoro-3-(2,4-dimethylpentyl)-2,2-dimethylpentanoylamino)phenyl]titanium,
bis(cyclopentadienyl)bis[2,6-difluoro-3-((4-toluyl)amino)phenyl]titanium,
bis(cyclopentadienyl)bis[2,6-difluoro-3-(2,2-dimethylpentanoylamino)phenyl]titanium,
bis(cyclopentadienyl)bis[2,6-difluoro-3-(2,2-dimethyl-3-ethoxypropanoylamino)phenyl]titanium,
bis(cyclopentadienyl)bis[2,6-difluoro-3-(2,2-dimethyl-3-allyloxypropanoylamino)phenyl]titanium,
bis(cyclopentadienyl)bis[2,6-difluoro-3-(N-allylacetylamino)phenyl]titanium,
bis(cyclopentadienyl)bis[2,6-difluoro-3-(2-ethylbutanoylamino)phenyl]titanium,
bis(cyclopentadienyl)bis[2,6-difluoro-3-(N-cyclohexylmethylbenzoylamino)phenyl]titanium,
bis(cyclopentadienyl)bis[2,6-difluoro-3-(N-cyclohexylmethyl(4-toluyl)amino)phenyl]titanium,
bis(cyclopentadienyl)bis[2,6-difluoro-3-(N-(2-ethylhexyl)benzoylamino)phenyl]titanium,
bis(cyclopentadienyl)bis[2,6-difluoro-3-(N-isopropylbenzoylamino)phenyl]titanium,
bis(cyclopentadienyl)bis[2,6-difluoro-3-(N-(3-phenylpropyl)-2,2-dimethylpentanoyl)amino)phenyl]titanium,
bis(cyclopentadienyl)bis[2,6-difluoro-3-(N-hexylbenzoylamino)phenyl]titanium,
bis(cyclopentadienyl)bis[2,6-difluoro-3-(N-cyclohexylmethyl-2,2-dimethylpentanoyl)amino)phenyl]titanium,
bis(cyclopentadienyl)bis[2,6-difluoro-3-(N-butylbenzoylamino)phenyl]titanium,
bis(cyclopentadienyl)bis[2,6-difluoro-3-(N-(2-ethylhexyl)-2,2-dimethylpentanoyl)amino)phenyl]titanium,
bis(cyclopentadienyl)bis[2,6-difluoro-3-(N-hexyl-2,2-dimethylpentanoylamino)phenyl]titanium,
bis(cyclopentadienyl)bis[2,6-difluoro-3-(N-isopropyl-2,2-dimethylpentanoylamino)phenyl]titanium,
bis(cyclopentadienyl)bis[2,6-difluoro-3-(N-(3-phenylpropyl)pivaloylamino)phenyl]titanium,
bis(cyclopentadienyl)bis[2,6-difluoro-3-(N-butyl-2,2-dimethylpentanoylamino)phenyl]titanium,
bis(cyclopentadienyl)bis[2,6-difluoro-3-(N-(2-methoxyethyl)benzoylamino)phenyl]titanium,
bis(cyclopentadienyl)bis[2,6-difluoro-3-(N-benzylbenzoylamino)phenyl]titanium,
bis(cyclopentadienyl)bis[2,6-difluoro-3-(N-benzyl(4-toluyl)amino)phenyl]titanium,
bis(cyclopentadienyl)bis[2,6-difluoro-3-(N-(2-methoxyethyl)(4-toluyl)amino)phenyl]titanium,
bis(cyclopentadienyl)bis[2,6-difluoro-3-(N-(4-methylphenylmethyl)-2,2-dimethylpentanoylamino)phenyl]titanium,
bis(cyclopentadienyl)bis[2,6-difluoro-3-(N-(2-methoxyethyl)-2,2-dimethylpentanoylamino)phenyl]titanium,
bis(cyclopentadienyl)bis[2,6-difluoro-3-(N-cyclohexylmethyl(2-ethyl-2-methylheptanoyl)amino)phenyl]-titanium,
bis(cyclopentadienyl)bis[2,6-difluoro-3-(N-butyl(4-chlorobenzoyl)amino)phenyl]titanium,
bis(cyclopentadienyl)bis[2,6-difluoro-3-(N-hexyl(2-ethyl-2-methylbutanoyl)amino)phenyl]titanium,
bis(cyclopentadienyl)bis[2,6-difluoro-3-(N-cyclohexyl-2,2-dimethylpentanoyl)amino)phenyl]titanium,
bis(cyclopentadienyl)bis[2,6-difluoro-3-(N-(oxolan-2-ylmethyl)-2,2-dimethylpentanoyl)amino)phenyl]titanium,
bis(cyclopentadienyl)bis[2,6-difluoro-3-(N-cyclohexyl(4-chlorobenzoyl)amino)phenyl]titanium,
bis(cyclopentadienyl)bis[2,6-difluoro-3-(N-cyclohexyl(2-chlorobenzyl)amino)phenyl]titanium,
bis(cyclopentadienyl)bis[2,6-difluoro-3-(3,3-dimethyl-2-azetidinon-1-yl)phenyl]titanium,
bis(cyclopentadienyl)bis[2,6-difluoro-3-isocyanatophenyl)titanium,
bis(cyclopentadienyl)bis[2,6-difluoro-3-(N-ethyl(4-tolylsulfonyl)amino)phenyl]titanium,
bis(cyclopentadienyl)bis[2,6-difluoro-3-(N-hexyl(4-tolylsulfonyl)amino)phenyl]titanium,
bis(cyclopentadienyl)bis[2,6-difluoro-3-(N-butyl(4-tolylsulfonyl)amino)phenyl]titanium,
bis(cyclopentadienyl)bis[2,6-difluoro-3-(N-isobutyl(4-tolylsulfonyl)amino)phenyl]titanium,
bis(cyclopentadienyl)bis[2,6-difluoro-3-(N-butyl(2,2-dimethyl-3-chloropropanoyl)amino)phenyl]titanium,
bis(cyclopentadienyl)bis[2,6-difluoro-3-(N-(3-phenylpropanoyl)-2,2-dimethyl-3-chloropropanoyl)amino)phenyl]titanium,
bis(cyclopentadienyl)bis[2,6-difluoro-3-(N-cyclohexylmethyl(2,2-dimethyl-3-chloropropanoyl)amino)phenyl]titanium,
bis(cyclopentadienyl)bis[2,6-difluoro-3-(N-isobutyl(2,2-dimethyl-3-chloropropanoyl)phenyl]titanium,
bis(cyclopentadienyl)bis[2,6-difluoro-3-(N-butyl(2-chloromethyl-2-methyl-3-chloropropanoyl)amino)phenyl]titanium,
bis(cyclopentadienyl)bis[2,6-difluoro-3-(butylthiocarbonylamino)phenyl]titanium,
bis(cyclopentadienyl)bis[2,6-difluoro-3-(phenylthiocarbonylamino)phenyl]titanium,
bis(cyclopentadienyl)bis[2,6-difluoro-3-isocyanatophenyl)titanium,
bis(cyclopentadienyl)bis[2,6-difluoro-3-(N-ethyl(4-tolylsulfonyl)amino)phenyl]titanium,
bis(cyclopentadienyl)bis[2,6-difluoro-3-(N-hexyl(4-tolylsulfonyl)amino)phenyl]titanium, bis(cyclopentadienyl)bis[2,6-difluoro-3-(N-butyl(4-tolylsulfonyl)amino)phenyl]titanium,
bis(cyclopentadienyl)bis[2,6-difluoro-3-(N-isobutyl(4-tolylsulfonyl)amino)phenyl]titanium,
bis(cyclopentadienyl)bis[2,6-difluoro-3-(N-butyl(2,2-dimethyl-3-chloropropanoyl)amino)phenyl]titanium,
bis(cyclopentadienyl)bis[2,6-difluoro-3-(N-(3-phenylpropanoyl)-2,2-dimethyl-3-chloropropanoyl)amino)phenyl]-titanium,
bis(cyclopentadienyl)bis[2,6-difluoro-3-(N-cyclohexylmethyl(2,2-dimethyl-3-chloropropanoyl)amino)phenyl]titanium,
bis(cyclopentadienyl)bis[2,6-difluoro-3-(N-isobutyl(2,2-dimethyl-3-chloropropanoyl)phenyl]titanium,
bis(cyclopentadienyl)bis[2,6-difluoro-3-(N-butyl(2-chloromethyl-2-methyl-3-chloropropanoyl)amino)phenyl]titanium,
bis(cyclopentadienyl)bis[2,6-difluoro-3-(butylthiocarbonylamino)phenyl]titanium,
bis(cyclopentadienyl)bis[2,6-difluoro-3-(phenylthiocarbonylamino)phenyl]titanium,
bis(methylcyclopentadienyl)bis[2,6-difluoro-3-(N-hexyl-2,2-dimethylbutanoyl)amino)phenyl]titanium,
bis(methylcyclopentadienyl)bis[2,6-difluoro-3-(N-hexyl-2,2-dimethylpentanoylamino)phenyl]titanium,
bis(methylcyclopentadienyl)bis[2,6-difluoro-3-(N-ethylacetylamino)phenyl]titanium,
bis(methylcyclopentadienyl)bis[2,6-difluoro-3-(N-ethylpropionylamino)phenyl]titanium,
bis(trimethylsilylpentadienyl)bis[2,6-difluoro-3-(N-butyl-2,2-dimethylpropanoylamino)phenyl]titanium,
bis(cyclopentadienyl)bis[2,6-difluoro-3-(N-(2-methoxyethyl)trimethylsilylamino)phenyl]titanium,
bis(cyclopentadienyl)bis[2,6-difluoro-3-(N-butylhexyldimethylsilylamino)phenyl]titanium,
bis(cyclopentadienyl)bis[2,6-difluoro-3-(N-ethyl(1,1,2-trimethylpropyl)dimethylsilylamino)phenyl]titanium,
bis(cyclopentadienyl)bis[2,6-difluoro-3-(3-ethoxymethyl-3-methyl-2-azetiodinon-1-yl)phenyl]titanium,
bis(cyclopentadienyl)bis[2,6-difluoro-3-(3-allyloxymethyl-3-methyl-2-azetidinon-1-yl)phenyl]titanium,
bis(cyclopentadienyl)bis[2,6-difluoro-3-(3-chloromethyl-3-methyl-2-azetidinon-1-yl)phenyl]titanium,
bistcyclopentadienyl)bis[2,6-difluoro-3-(N-benzyl-2,2-dimethylpropanoylamino)phenyl]titanium,
bis(cyclopentadienyl)bis[2,6-difluoro-3-(5,5-dimethyl-2-pyrrolidinon-1-yl)phenyl]titanium,
bis(cyclopentadienyl)bis[2,6-difluoro-3-(6,6-diphenyl-2-piperidinon-1-yl)phenyl]titanium,
bis(cyclopentadienyl)bis[2,6-difluoro-3-(N-2,3-dihydro-1,2-benzothiazol-3-one(1,1-dioxide)-2-yl)phenyl]titanium,
bis(cyclopentadienyl)bis[2,6-difluoro-3-(N-hexyl(4-chlorobenzoyl)amino)phenyl]titanium,
bis(cyclopentadienyl)bis[2,6-difluoro-3-(N-hexyl(2-chlorobenzoyl)amino)phenyl]titanium,
bis(cyclopentadienyl)bis[2,6-difluoro-3-(N-isopropyl(4-chlorobenzoyl)amino)phenyl]titanium,
bis(cyclopentadienyl)bis[2,6-difluoro-3-(N-(4-methylphenylmethyl)(4-chlorobenzoyl)amino)phenyl]titanium,
bis(cyclopentadienyl)bis[2,6-difluoro-3-(N-(4-methylphenylmethyl)(2-chlorobenzoyl)amino)phenyl]titanium,
bis(cyclopentadienyl)bis[2,6-difluoro-3-(N-butyl(4-chlorobenzoyl)amino)phenyl]titanium,
bis(cyclopentadienyl)bis[2,6-difluoro-3-(N-benzyl-2,2-dimethylpentanoylamino)phenyl]titanium,
bis(cyclopentadienyl)bis[2,6-difluoro-3-(N-(2-ethylhexyl)-4-tolylsulfonyl)amino)phenyl]titanium,
bis(cyclopentadienyl)bis[2,6-difluoro-3-(N-(3-oxaheptyl)benzoylamino)phenyl]titanium,
bis(cyclopentadienyl)bis[2,6-difluoro-3-(N-(3,6-dioxadecyl)benzoylamino)phenyl]titanium,
bis(cyclopentadienyl)bis[2,6-difluoro-3-(trifluoromethylsulfonyl)amino)phenyl]titanium,
bis(cyclopentadienyl)bis[2,6-difluoro-3-(trifluoroacetylamino)phenyl]titanium,
bis(cyclopentadienyl)bis[2,6-difluoro-3-(2-chlorobenzoyl)amino)phenyl]titanium,
bis(cyclopentadienyl)bis[2,6-difluoro-3-(4-chlorobenzoyl)amino)phenyl]titanium,
bis(cyclopentadienyl)bis[2,6-difluoro-3-(N-(3,6-dioxadecyl)-2,2-dimethylpentanoylamino)phenyl]titanium,
bis(cyclopentadienyl)bis[2,6-difluoro-3-(N-(3,7-dimethyl-7-methoxyoctyl)benzoylamino)phenyl]titanium, and
bis(cyclopentadienyl)bis[2,6-difluoro-3-(N-cyclohexylbenzoylamino)phenyl]titanium.

Examples of the active ester compounds (j) as still a further example of ingredient (iii) include the imidosulfonate compounds described in JP-B-62-6223 and the active sulfonates described in JP-B-63-14340 and JP-A-59-174831.

Preferred examples of the compounds having one or more carbon-halogen bonds (k) as ingredient (iii) include the following compounds represented by formula (IV) to (X).

Compounds represented by formula (IV):

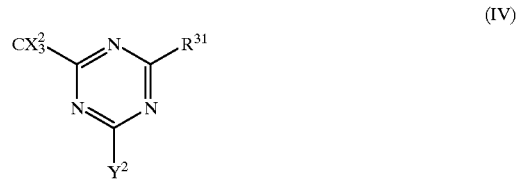

(IV)

(wherein $X^2$ represents a halogen atom; $Y^2$ represents —$CX^2$, —$NH^2$, —$NHR^{32}$—$NR^{32}$, or —$OR^{32}$, wherein $R^{32}$ represents an alkyl group, a substituted alkyl group, an aryl group, or a substituted aryl group; and $R^{31}$ represents —$CX^2$, an alkyl group, a substituted alkyl group, an aryl group, a substituted aryl group, or a substituted alkenyl group).

Compounds represented by formula (V):

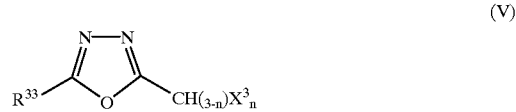

(V)

(wherein $R^{33}$ is an alkyl group, a substituted alkyl group, an alkenyl group, a substituted alkenyl group, an aryl group, a substituted aryl group, a halogen atom, an alkoxy group, a substituted alkoxy group, a nitro group, or a cyano group, $X^2$ is a halogen atom, and n is an integer of 1 to 3).

Compounds represented by formula (VI):

$$R^{34}-Z^2-CH_{(2-m)}X_m^3R^{35} \quad (VI)$$

(wherein $R^{34}$ is an aryl group or a substituted aryl group, $R^{35}$ is one of the following groups:

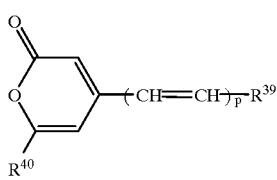

or a halogen, $Z^2$ is —C(=O)—, —C(=S)—, or —SO$_2$—, $R^{36}$ and $R^{37}$ each is an alkyl group, a substituted alkyl group, an alkenyl group, a substituted alkenyl group, an aryl group, or a substituted aryl group, $R^{38}$ is the same as $R^{32}$ in formula (IV), $X^3$ is a halogen atom, and m is 1 or 2).

Compounds represented by formula (VII):

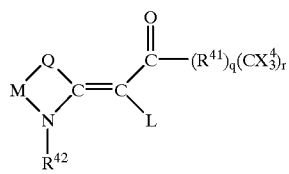

(wherein $R^{39}$ is an aryl or heterocyclic group which may have substituent(s), $R^{40}$ is a trihaloalkyl or trihaloalkenyl group having 1 to 3 carbon atoms, and p is 1, 2, or 3).

Carbonylated methylene heterocyclic compounds having a trihalogenomethyl group which are represented by formula (VIII):

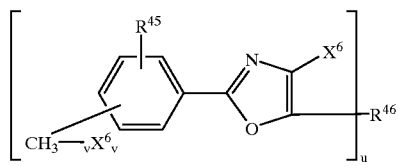

(wherein

L is a hydrogen atom or a substituent represented by CO—$(R^{41})_q(CX^4{}_3)_r$, Q is a sulfur, selenium, or oxygen atom, a dialkylmethylene group, an alken-1,2-ylene group, a 1,2-phenylene group, or an N—R group, M is a substituted or unsubstituted alkylene or alkenylene group or a 1,2-arylene group, $R^{42}$ is an alkyl group, an aralkyl group, or an alkoxyalkyl group, $R^{41}$ is a bivalent aromatic group which is carbocyclic or heterocyclic, $X^4$ is a chlorine, bromine, or iodine atom, and q=0 and r=1, or q=1 and r=1 or 2).

4-Halogeno-5-(halogenomethylphenyl)oxazole derivatives represented by formula (IX):

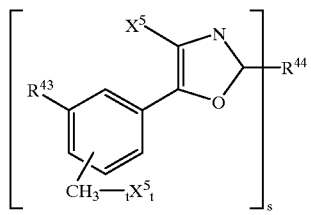

(wherein $X^5$ is a halogen atom; t is an integer of 1 to 3; s is an integer of 1 to 4; $R^{43}$ is a hydrogen atom or a group represented by $CH_{3-t}X^5{}_t$; and $R^{44}$ is an unsaturated organic group having a valence of s which may have substituent(s)).

2-(Halogenomethylphenyl)-4-halogenooxazole derivatives represented by formula (X):

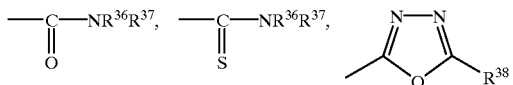

(wherein $X^6$ is a halogen atom; v is an integer of 1 to 3; u is an integer of 1 to 4; $R^{45}$ is a hydrogen atom or a group represented by $CH_{3-v}X^6{}_v$; and $R^{46}$ is an unsaturated organic group having a valence of u which may have substituent(s)).

Specific examples of such compounds having one or more carbon-halogen bonds include compounds described in Wakabayashi et al., *Bull. Chem. Soc. Japan*, 42, 2924 (1969), e.g., 2-phenyl-4,6-bis(trichloromethyl)-s-triazine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(trichloromethyl)-s-triazine, 2-(2',4'-dichlorophenyl)-4,6-bis(trichloromethyl)-s-triazine, 2,4,6-tris(trichloromethyl)-s-triazine, 2-methyl-4,6-bis(trichloromethyl)-s-triazine, 2-n-nonyl-4,6-bis(trichloromethyl)-s-triazine, and 2-(α,α,β-trichloroethyl)-4,6-bis(trichloromethyl)-s-triazine. Other examples thereof include compounds described in British Patent 1,388,492, e.g., 2-styryl-4,6-bis(trichloromethyl)-s-triazine, 2-(p-methylstyryl)-4,6-bis(trichloro.ethyl)-s-triazine, 2-(p-methoxystyryl)-4,6-bis(trichloromethyl)-s-triazine, and 2-(p-methoxystyryl)-4-amino-6-trichloromethyl-s-triazine, compounds described in JP-A-53-133428, e.g., 2-(4-methoxynaphth-1-yl)-4,6-bistrichloromethyl-s-triazine, 2-(4-ethoxynaphth-1-yl)-4,6-bistrichloromethyl-s-triazine, 2-[4-(2-ethoxyethyl)naphth-1-yl]-4,6-bistrichloromethyl-s-triazine, 2-(4,7-dimethoxynaphth-1-yl)-4,6-bistrichloromethyl-s-triazine, and 2-(acenaphth-5-yl)-4,6-bistrichloromethyl-s-triazine, compounds described in German Patent 3,337,024, e.g.,

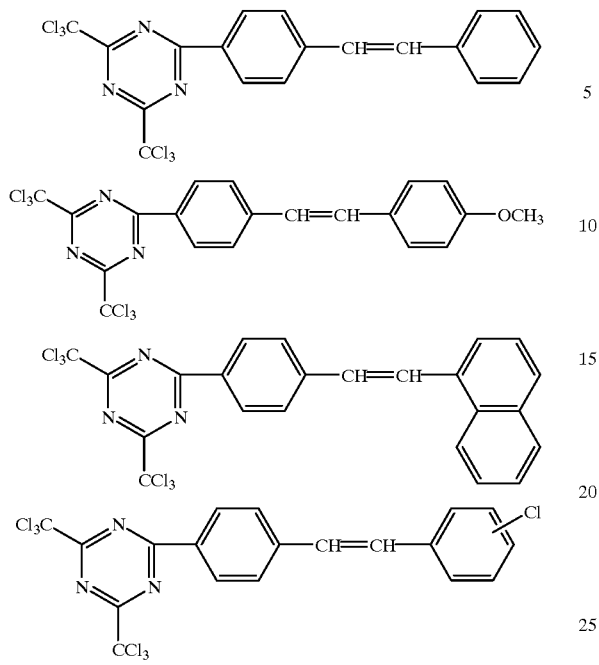

and compounds such as the following.

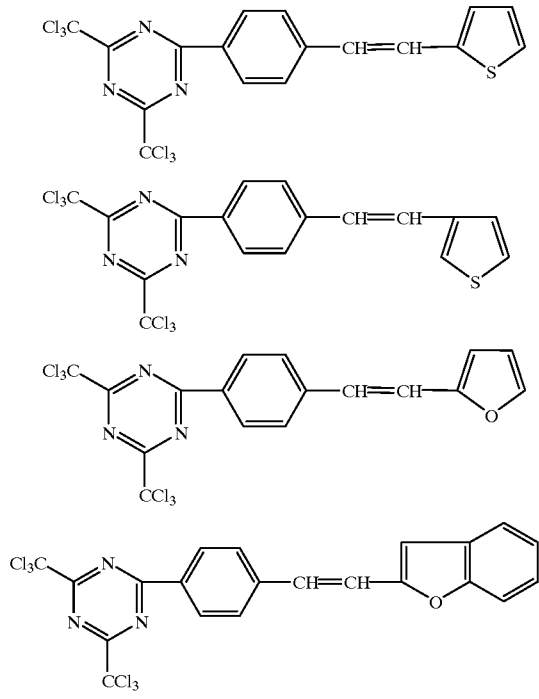

Examples of the compounds having one or more carbon-halogen bonds further include compounds described in F. C. Schaefer et al., *J. Org. Chem.*, 29, 1527 (1964), e.g., 2-methyl-4,6-bis(tribromomethyl)-s-triazine, 2,4,6-tris(tribromomethyl)-s-triazine, 2,4,6-tris(dibromomethyl)-s-triazine, 2-amino-4-methyl-6-tribromomethyl-s-triazine, and 2-methoxy-4-methyl-6-trichloromethyl-s-triazine.

Examples thereof furthermore include compounds described in JP-A-62-58241, e.g., the following compounds.

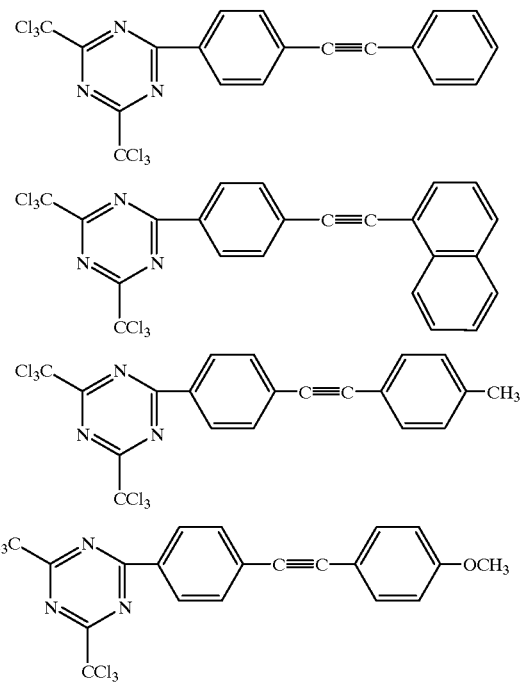

Examples thereof further include compounds described in JP-A-5-281728, e.g., the following compounds.

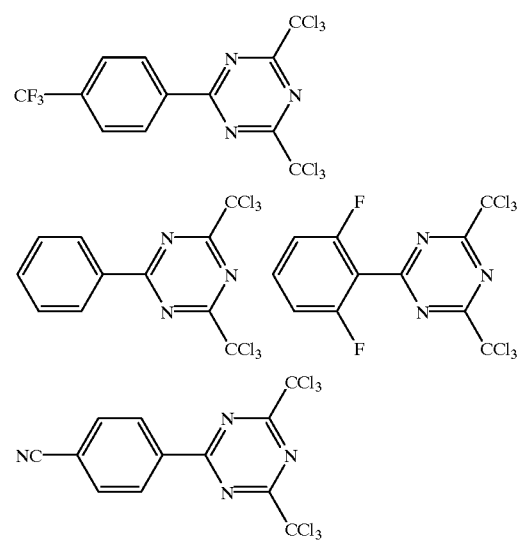

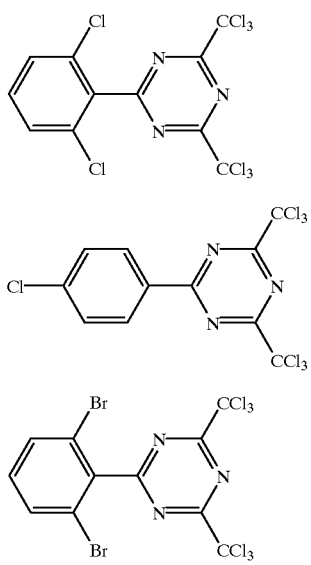
Examples thereof furthermore include the following compounds, which can be easily synthesized by persons skilled in the art according to the synthesis methods described in M. P. Hutt, E. F. Elslager, and L. M. Herbel, *Journal of Heterocyclic Chemistry*, Vol. 7 (No. 3), pp. 511—(1970).
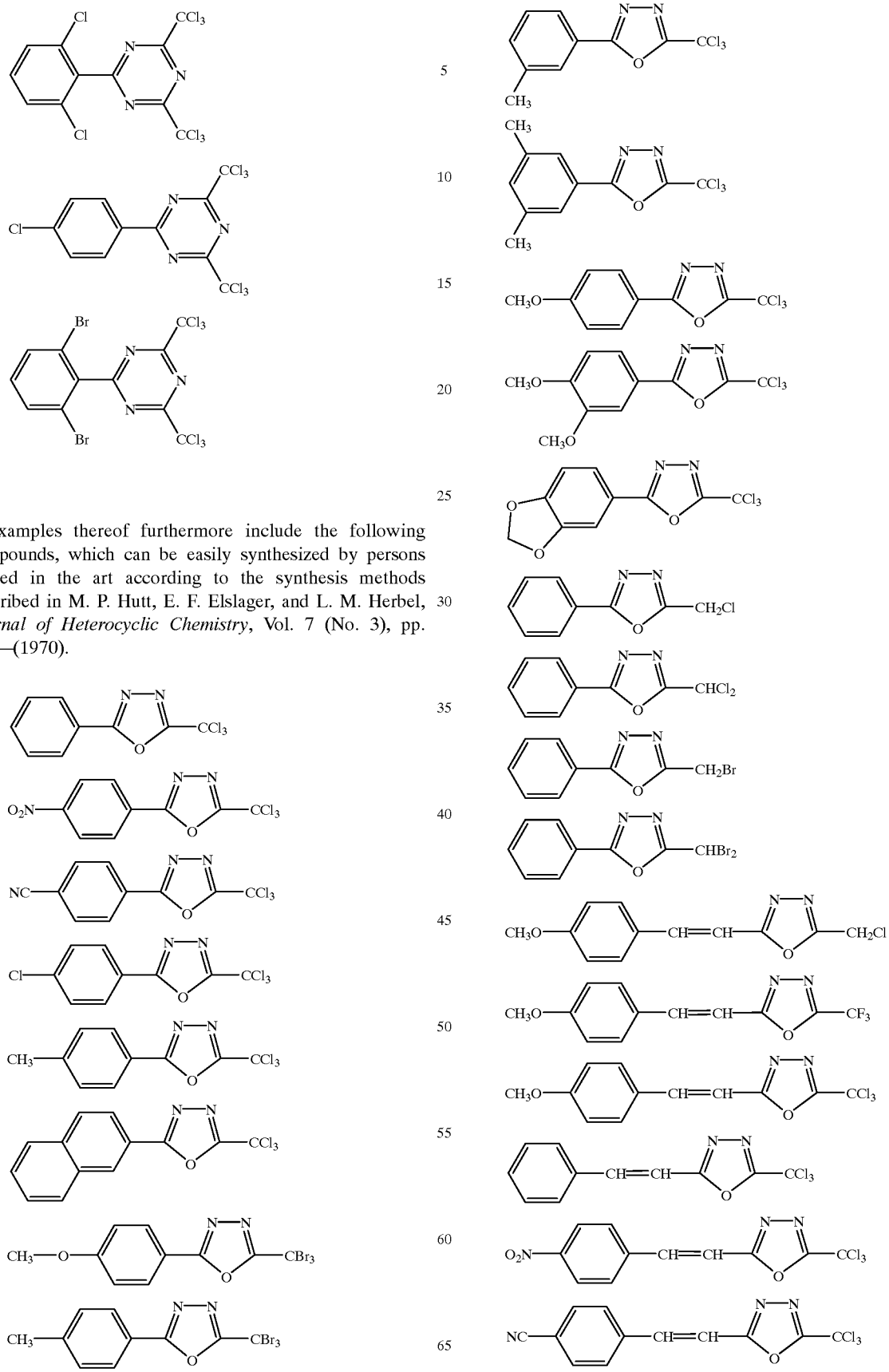

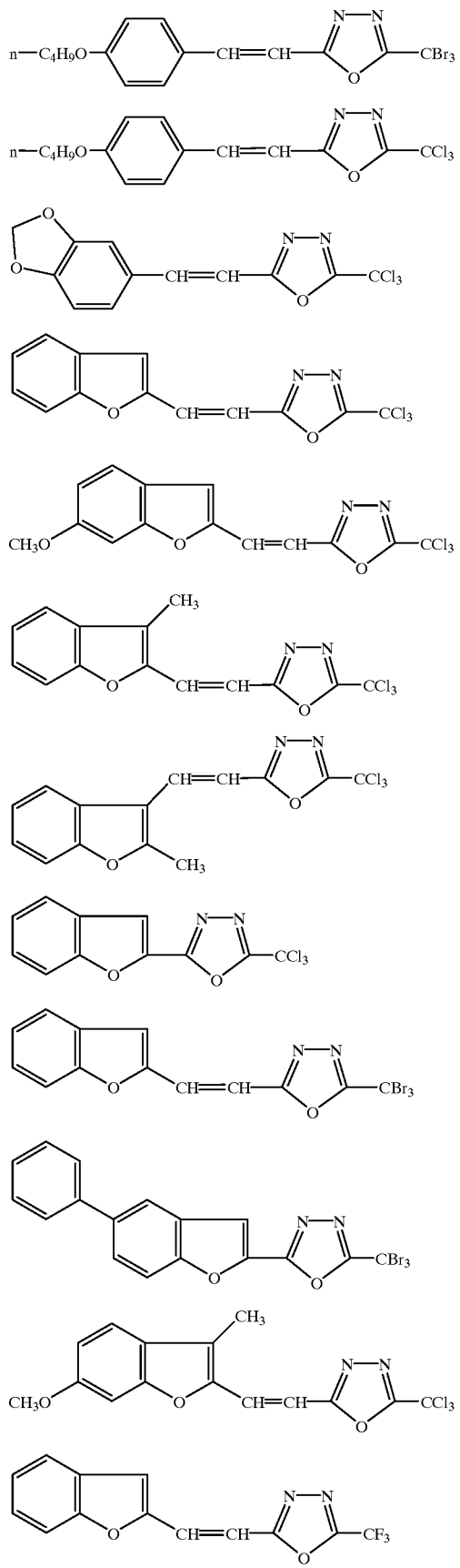
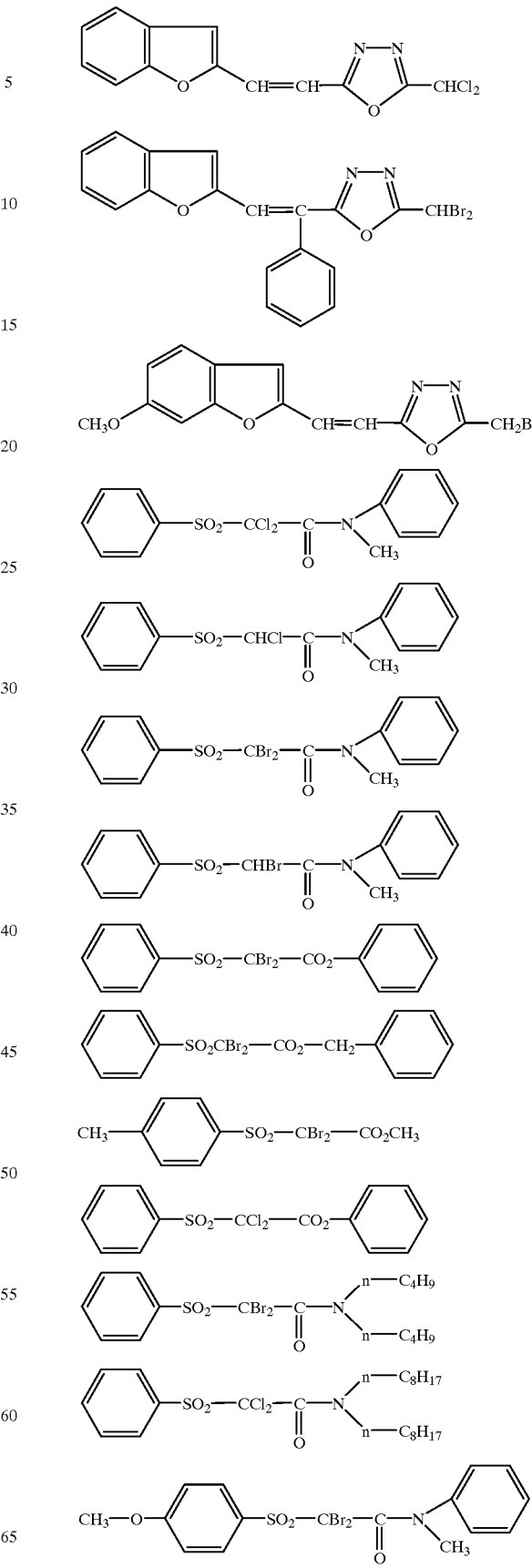

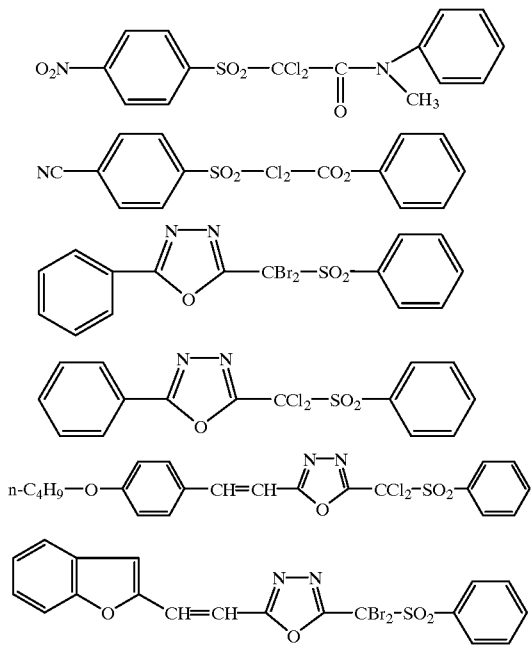

Examples of the compounds having one or more carbon-halogen bonds furthermore include compounds described in German Patent 2,641,100, such as 4-(4-methoxystyryl)-6-(3,3,3-trichloropropenyl)-2-pyrone and 4-(3,4,5-trimethoxystyryl)-6-trichloromethyl-2-pyrone, and compounds described in German Patent 3,333,450, such as those represented by the formula

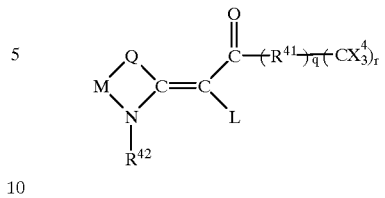

wherein $R^{41}$ represents a benzene ring and $R^{42}$ represents an alkyl group, an aralkyl group, or an alkoxyalkyl group.

TABLE 2

| | $R^{42}$ | M | L | q | $(CX^4_3)_r$ |
|---|---|---|---|---|---|
| 1 | $C_2H_5$ | 1,2-phenylene | H | 1 | $4\text{-}CCl_3$ |
| 2 | $CH_2C_6H_5$ | 1,2-phenylene | H | 1 | $4\text{-}CCl_3$ |
| 3 | $C_2H_5$ | 1,2-phenylene | H | 1 | $3\text{-}CCl_3$ |
| 4 | $C_2H_5$ | 1,2-phenylene | H | 1 | $4\text{-}CF_3$ |
| 5 | $C_2H_5$ | $5\text{-}CH_3\text{-}1,2\text{-}phenylene$ | H | 0 | $CCl_3$ |
| 6 | $CH_2C_6H_5$ | 1,2-phenylene | H | 0 | $CCl_3$ |
| 7 | $C_2H_4OCH_3$ | 1,2-phenylene | H | 1 | $4\text{-}CCl_3$ |

Examples thereof furthermore include compounds described in German Patent 3,021,590, e.g.,

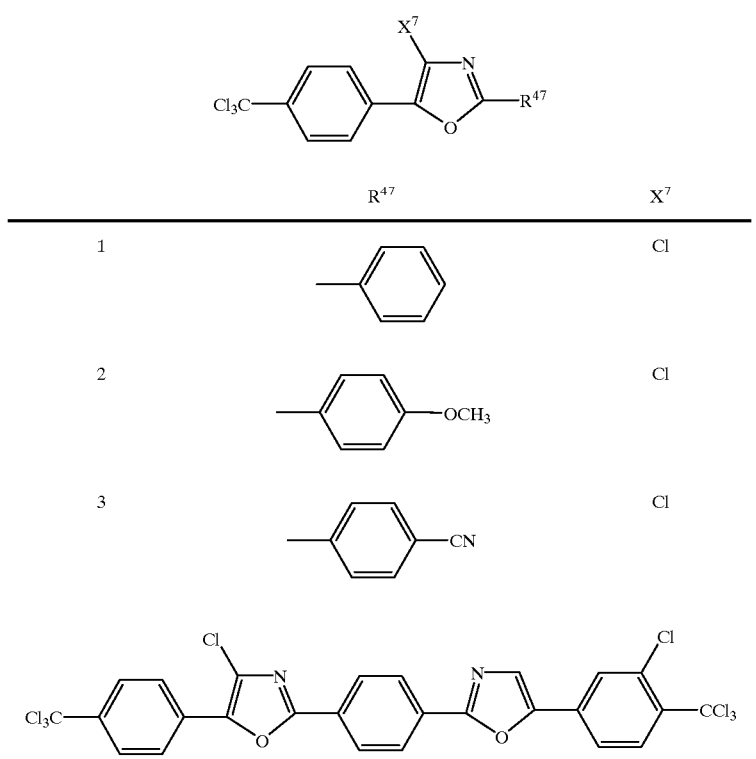

-continued

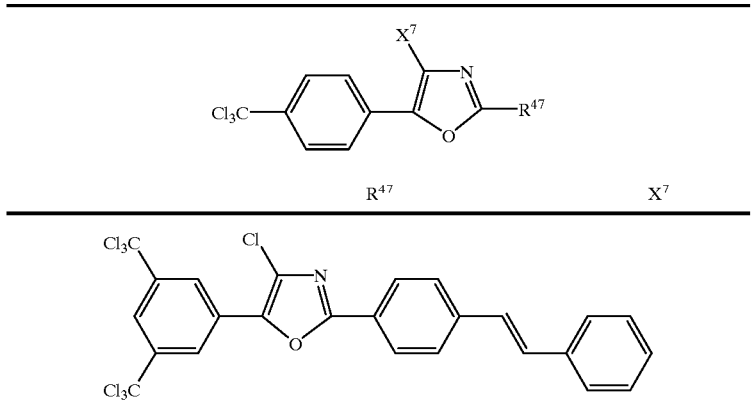

and compounds described in German Patent 3,021,599, e.g., the following.

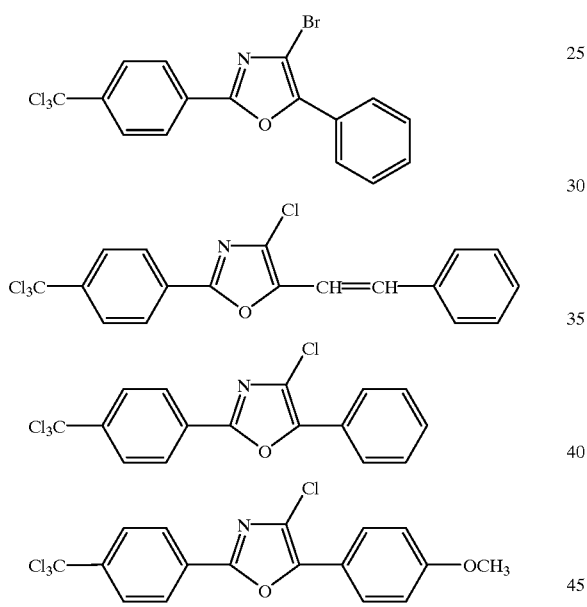

More preferred examples of ingredient (iii) in the present invention include the organic peroxides (c), hexaarylbiimidazole compounds (e), metallocene compounds (i), and compounds having one or more carbon-halogen bonds (k) described above. Most preferred examples thereof include titanocene compounds and trihalomethyl-s-triazine compounds represented by formula (IV).

Ingredient (iii) can be used as a single compound or a combination of two or more thereof.

A known spectral sensitizer dye or a known dye is preferably further contained as ingredient (iv) in the photopolymerizable composition of the present invention. Preferred examples of the spectral sensitizer dye or the dye include:

polynuclear aromatic compounds (e.g., pyrene, perylene, and triphenylene), xanthene compounds (e.g., fluorescein, eosine, erythrosine, Rhodamine B, and Rose Bengal), cyanine compounds (e.g., thiacarbocyanine and oxacarbocyanine), merocyanine compounds (e.g., merocyanine and carbomerocianine), thiazine compounds (e.g., Thionine, methylene blue, and Toluidine Blue), acridine compounds (e.g., Acridine Orange, chloroflavine, and acriflavine), phthalocyanine compounds (e.g., phthalocyanine and metal phthalocyanines), porphyrin compounds (e.g., tetraphenylporphyrin and porphyrins in which the central atom has been replaced), chlorophyll compounds (e.g., chlorophylls, chlorophyllin, and chlorophylls in which the central atom has been replaced), metal complexes, e.g.,

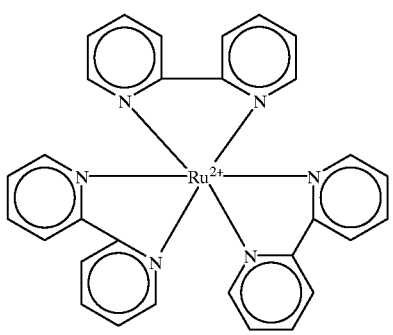

anthraquinone compounds, e.g., anthraquinone, and squalium compounds, e.g., squaliums.

More preferred examples of the spectral sensitizer dye or dye of ingredient (iv) include the styryl dyes described in JP-B-37-13034, e.g.,

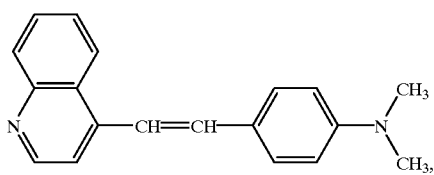

-continued
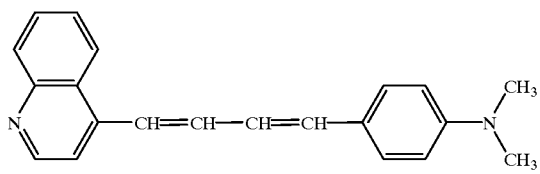
the cationic dyes described in JP-A-62-143044, e.g.,
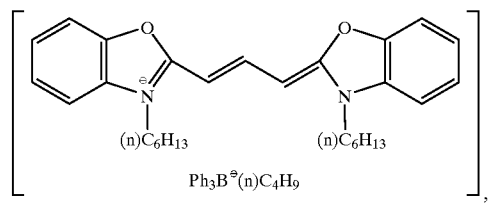
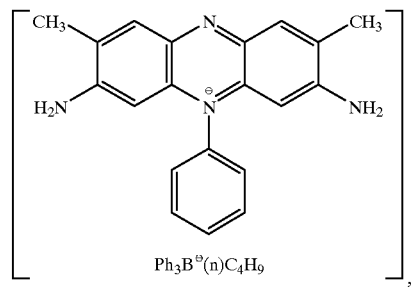
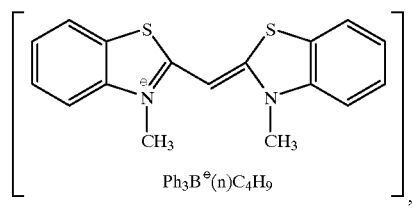
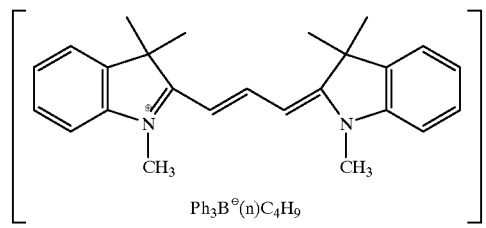
the quinoxalinium salts described in JP-B-59-24147, e.g.,
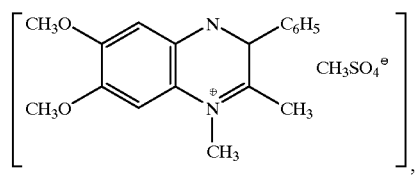
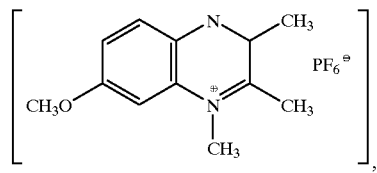
-continued
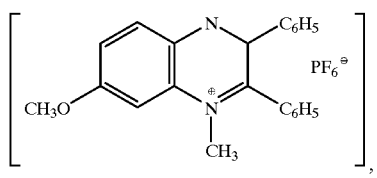
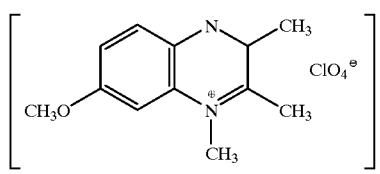
the new methylene blue compounds described in JP-A-64-33104, e.g.,
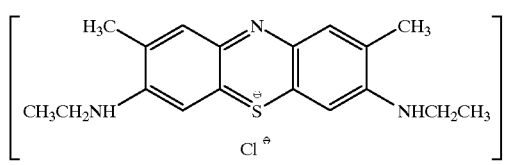
the anthraquinone compounds described in JP-A-64-56767, e.g.,
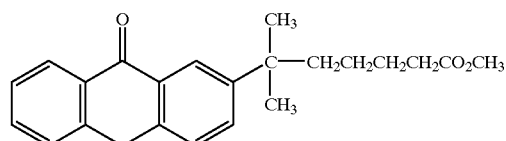
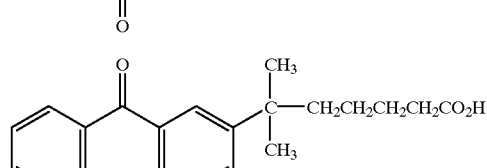
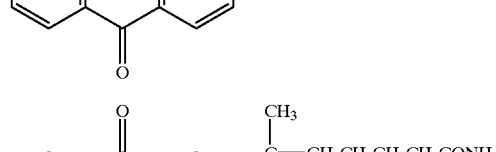
the benzoxanthene dyes described in JP-A-2-1714,
the acridine compounds described in JP-A-2-226148 and JP-A-2-226149, e.g.,

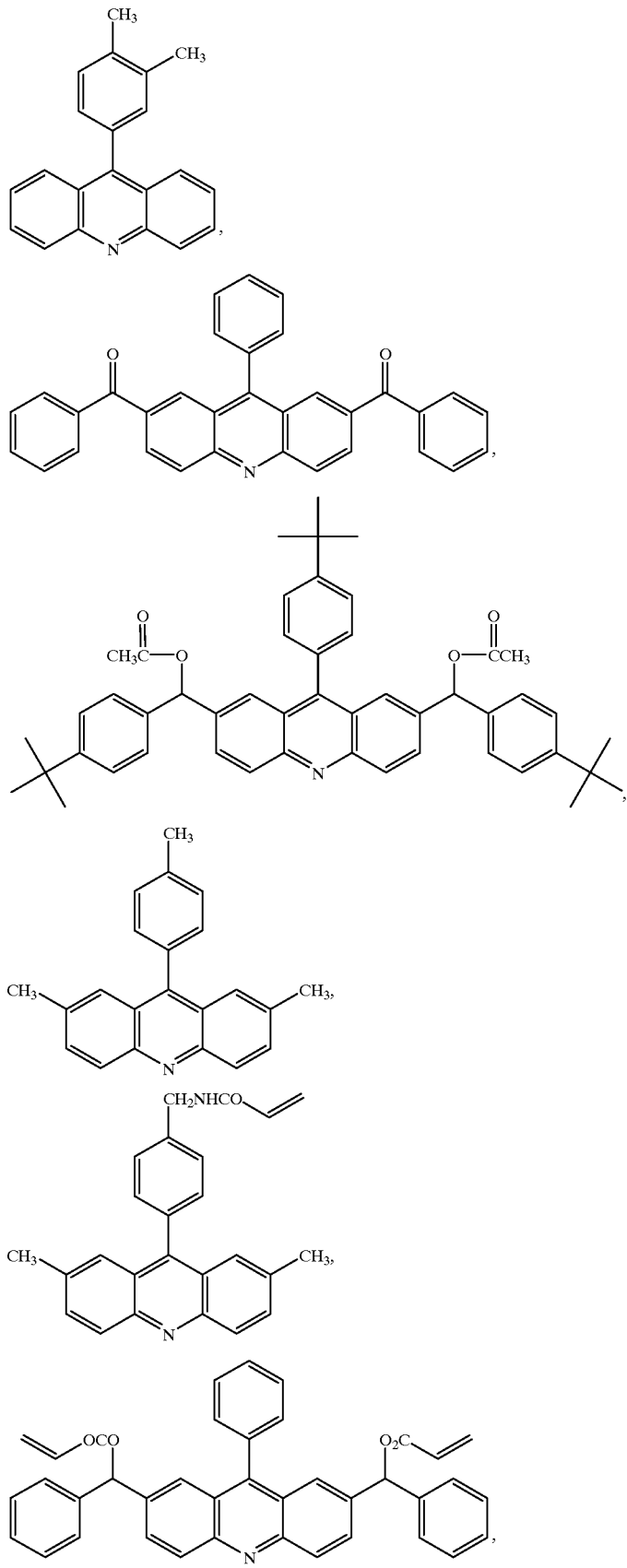

71
the pyrylium salts described in JP-B-40-28499, e.g.,
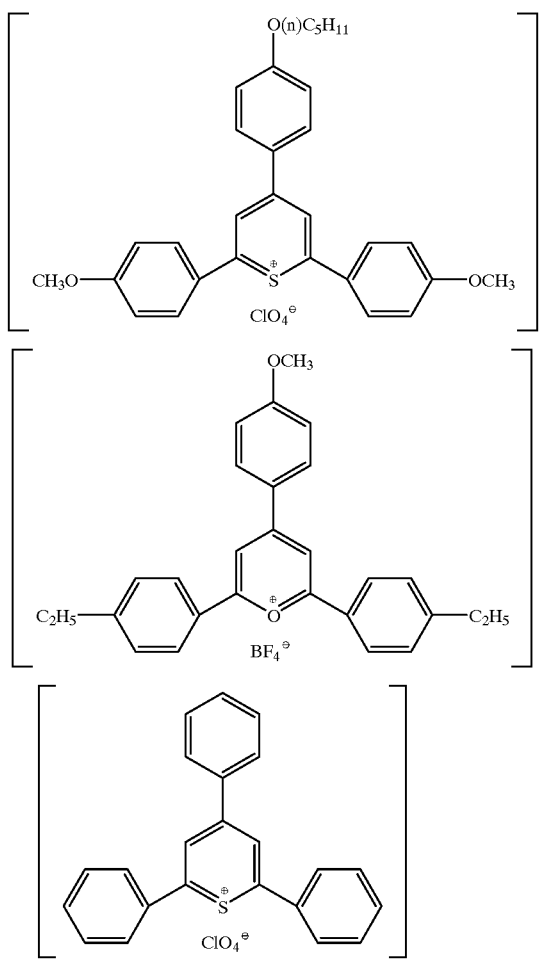
72
the cyanine compounds described in JP-B-46-42363, e.g.,
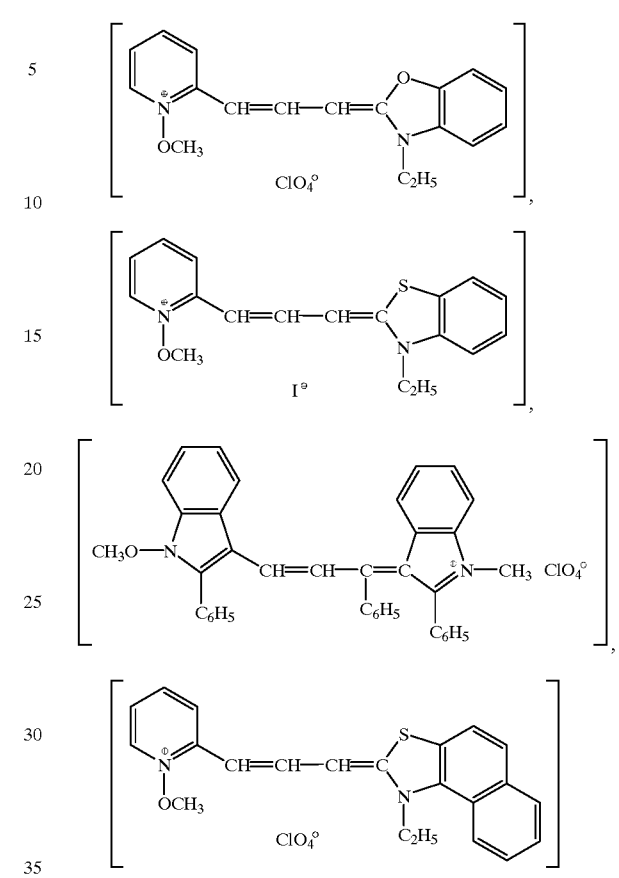
the benzofuran dyes described in JP-A-2-63053, e.g.,
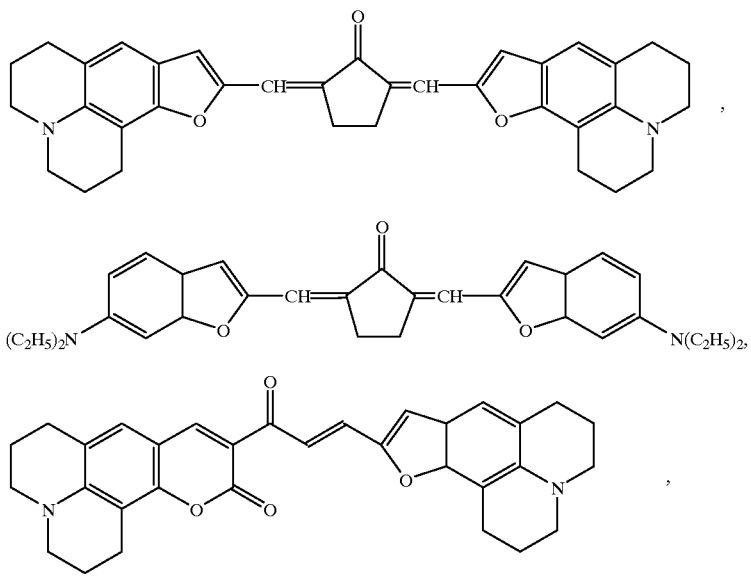

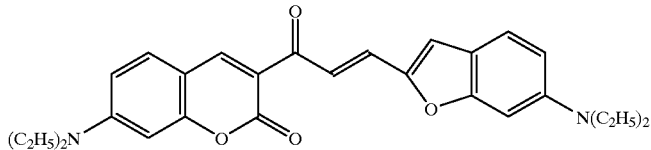
the conjugated ketone dyes described in JP-A-2-85858 and JP-A-2-216154, e.g.,
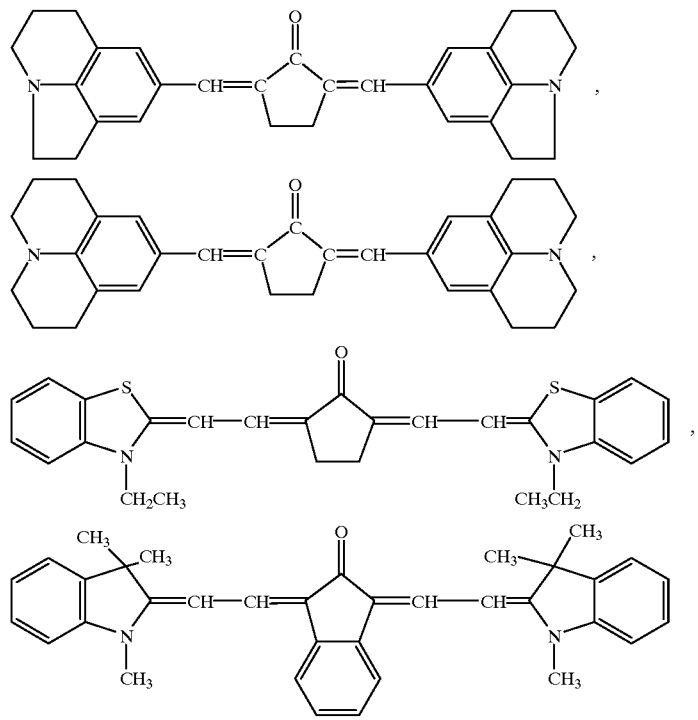
the dyes described in JP-A-57-10605,
the azocinnamylidene derivatives described in JP-B-2-30321, e.g.,
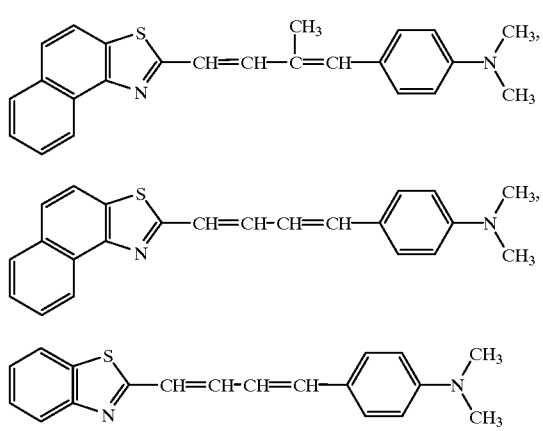
the cyanine dyes described in JP-A-1-287105, e.g.,
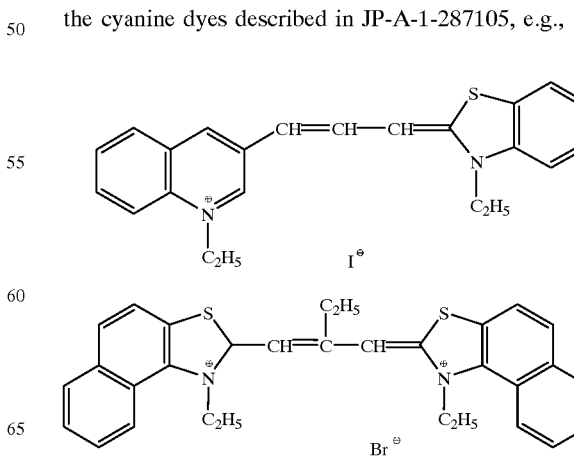

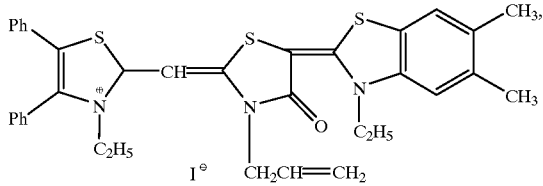

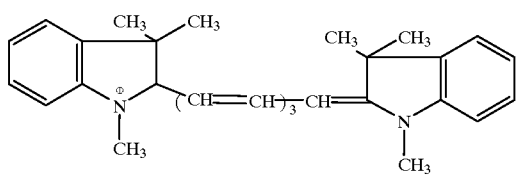

the xanthene dyes described in JP-A-62-31844, JP-A-62-31848, and JP-A-62-143043, e.g.,

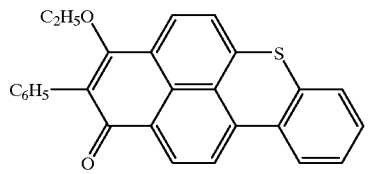

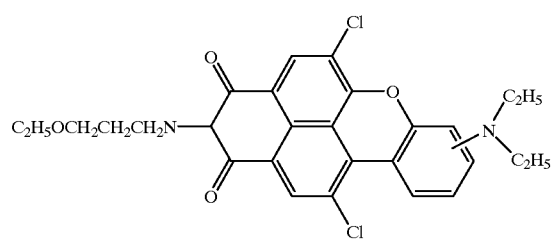

the aminostyryl ketones described in JP-B-59-28325, e.g.,

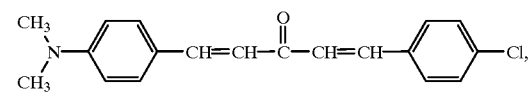

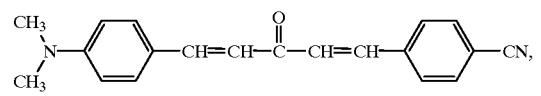

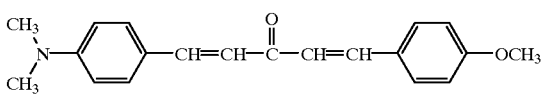

the merocyanine dyes represented by the following formulae (1) to (8) which are described in JP-B-61-9621, e.g.,

[1]

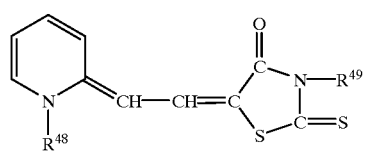

[2]

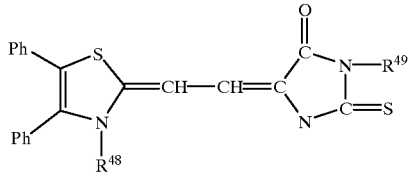

[3]

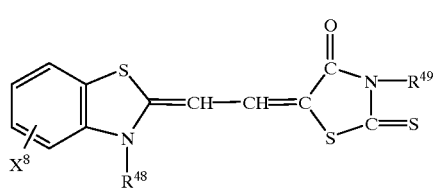

[4]

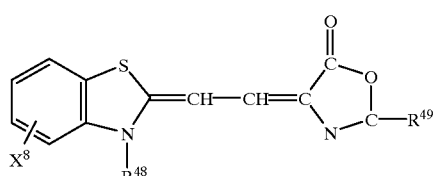

[5]

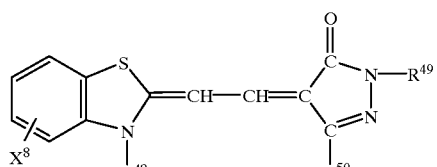

[6]

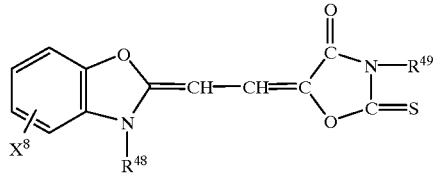

[7]

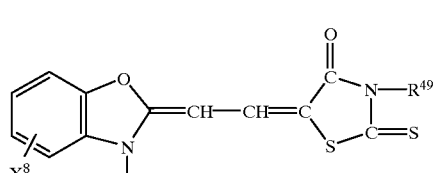

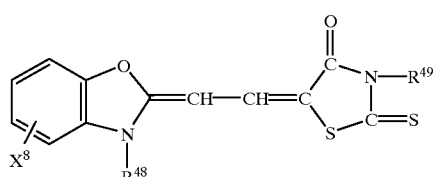

[8]

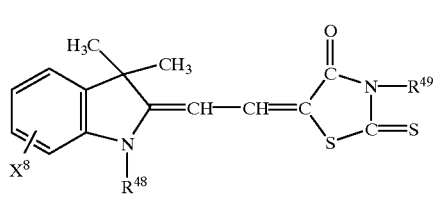

(wherein $X^8$ in formulae (3) to (8) represents a hydrogen atom, an alkyl group, a substituted alkyl group, an alkoxy group, an aryl group, a substituted aryl group, an aryloxy group, an aralkyl group, or a halogen atom; Ph in formula (2) represents a phenyl group; and $R^{48}$, $R^{49}$, and $R^{50}$ in formulae (1) to (8) may be the same or different and each represents an alkyl group, a substituted alkyl group, an alkenyl group, an aryl group, a substituted aryl group, or an aralkyl group), the dyes represented by the following formulae (9) to (11) which are described in JP-A-2-179643, e.g.,

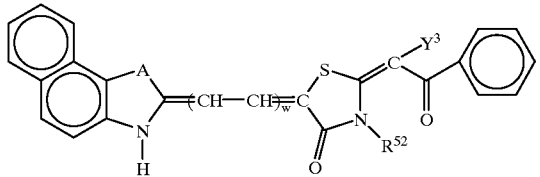

[9]

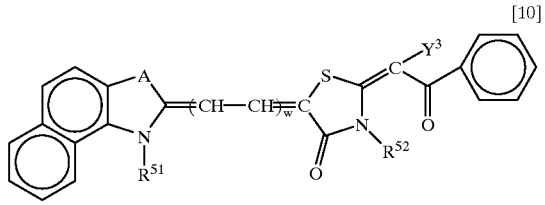

[10]

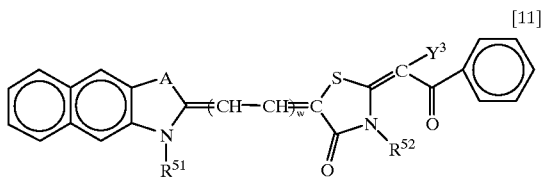

[11]

(wherein

A represents an oxygen atom, a sulfur atom, a selenium atom, a tellurium atom, a nitrogen atom substituted with an alkyl or aryl group, or a carbon atom substituted with two alkyl groups, $Y^3$ represents a hydrogen atom, an alkyl group, a substituted alkyl group, an aryl group, a substituted aryl group, an aralkyl group, an acyl group, or a substituted alkoxycarbonyl group, $R^{51}$ and $R^{52}$ each represents a hydrogen atom, an alkyl group having 1 to 18 carbon atoms, or a substituted alkyl group having 1 to 18 carbon atoms and having substituent(s) selected from $R^{53}O$—,

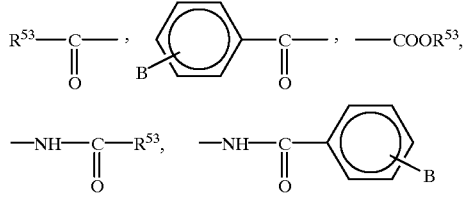

—$(CH_2CH_2O)_w$—$R^{53}$, and halogen atoms (F, Cl, Br, and I), provided that $R^{53}$ represents a hydrogen atom or an alkyl group having 1 to 10 carbon atoms and B represents a dialkylamino group, a hydroxyl group, an acyloxy group, a halogen atom, or a nitro group, w represents an integer of 0 to 4, and x represents an integer of 1 to 20), the merocyanine dyes represented by the following formula (12) which are described in JP-A-2-244050, e.g.,

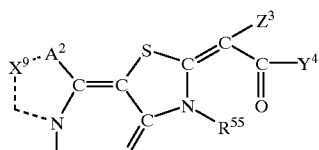

[12]

(wherein $R^{54}$ and $R^{55}$ each independently represents a hydrogen atom, an alkyl group, a substituted alkyl group, an alkoxycarbonyl group, an aryl group, a substituted aryl group, or an aralkyl group; $A^2$ represents an oxygen atom, a sulfur atom, a selenium atom, a tellurium atom, a nitrogen atom substituted with an alkyl or aryl group, or a carbon atom substituted with two alkyl groups; $X^9$ represents a group of nonmetallic-element atoms necessary for forming a nitrogen-containing five-membered heterocycle; $Y^4$ represents a substituted phenyl group, an unsubstituted or substituted polynuclear aromatic ring, or an unsubstituted or substituted aromatic heterocycle; and $Z^3$ represents a hydrogen atom, an alkyl group, a substituted alkyl group, an aryl group, a substituted aryl group, an aralkyl group, an alkoxy group, an alkylthio group, an arylthio group, a substituted amino group, an acyl group, or an alkoxycarbonyl group, provided that $Z^3$ may be bonded to $Y^4$ to form a ring), preferred examples thereof include

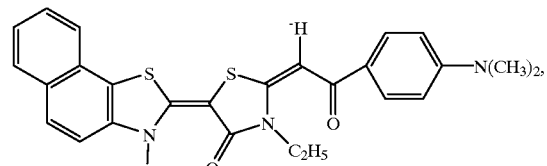

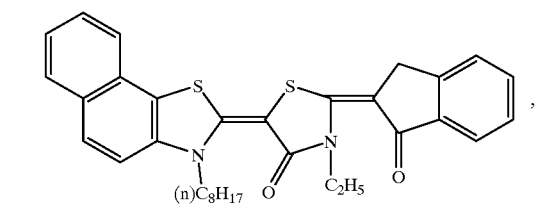

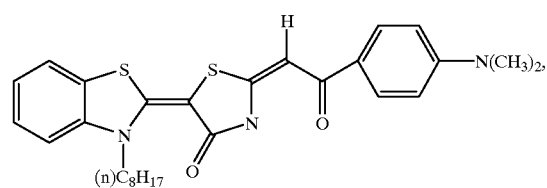

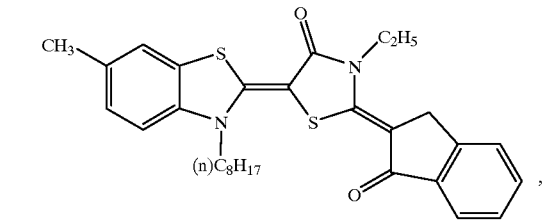

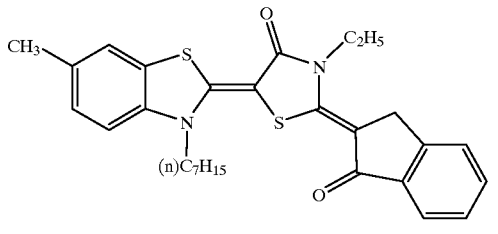

the merocyanine dyes represented by the following formula (13) which are described in JP-B-59-28326, e.g.,

[13]

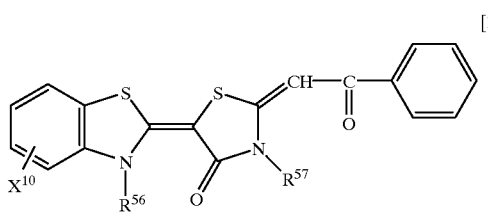

(wherein $R^{56}$ and $R^{57}$, which may be the same or different, each represents a hydrogen atom, an alkyl group, a substituted alkyl group, an aryl group, a substituted aryl group, or an aralkyl group; and $X^{10}$ represents a substituent having a Hammett's sigma ($\sigma$) value of from −0.9 to +0.5), the merocianine dyes represented by the following formula (14) which are described in JP-A-59-89303, e.g.,

[14]

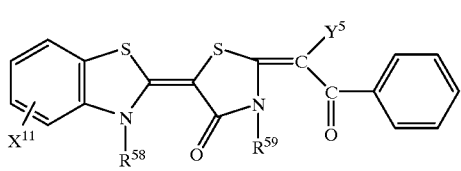

(wherein $R^{58}$ and $R^{59}$ each independently represents a hydrogen atom, an alkyl group, a substituted alkyl group, an aryl group, a substituted aryl group, or an aralkyl group; $X^{11}$ represents a substituent having a Hammett's sigma ($\sigma$) value of from −0.9 to +0.5; and $Y^5$ represents a hydrogen atom, an alkyl group, a substituted alkyl group, an aryl group, a substituted aryl group, an aralkyl group, an acyl group, or an alkoxycarbonyl group), preferred examples thereof include

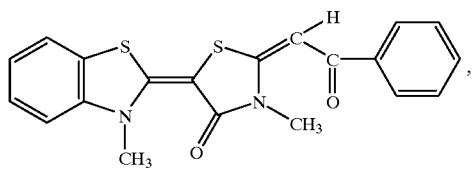

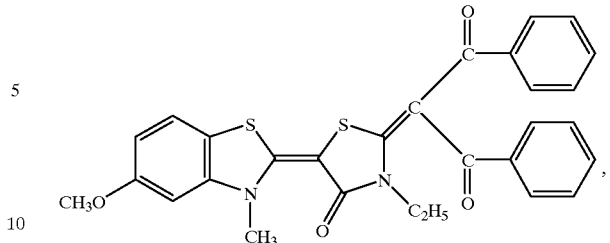

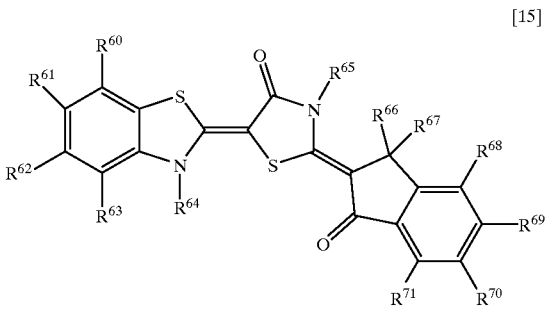

the merocianine dyes represented by the following formula (15) which are described in Japanese Patent Application No. 6-269047, e.g.,

[15]

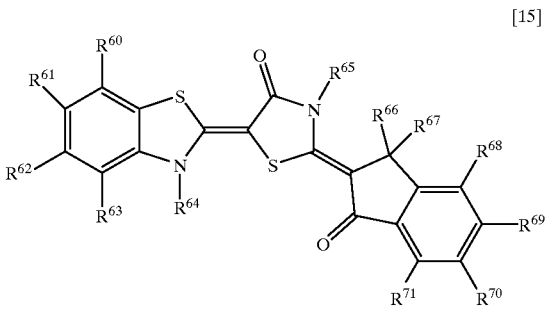

(wherein $R^{60}$, $R^{61}$, $R^{62}$, $R^{63}$, $R^{68}$, $R^{69}$, $R^{70}$, and $R^{71}$ each independently represents a hydrogen atom, a halogen atom, an alkyl group, a substituted alkyl group, an aryl group, a substituted aryl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, or a nitro group, provided that $R^{60}$ and $R^{61}$, $R^{61}$ and $R^{62}$, $R^{62}$ and $R^{63}$, $R^{68}$ and $R^{69}$, $R^{69}$ and $R^{70}$, or $R^{70}$ and $R^{71}$ may be bonded to each other to form an aliphatic or aromatic ring; $R^{64}$ represents a hydrogen atom, an alkyl group, a substituted alkyl group, an aryl group, or a substituted aryl group; $R^{65}$ represents a substituted or unsubstituted alkenylalkyl group or a substituted or unsubstituted alkynylalkyl group; and $R^{66}$ and $R^{67}$ each independently represents a hydrogen atom, a halogen atom, an alkyl group, a substituted alkyl group, an aryl group, a substituted aryl group, or a substituted carbonyl group), preferred examples thereof include

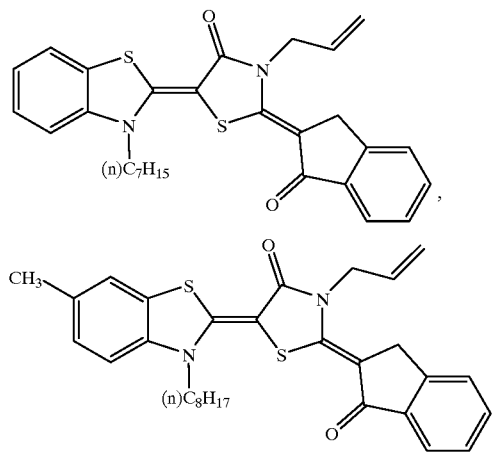

and the benzopyran dyes represented by the following formula (16) which are described in Japanese Patent Application No. 7-164583, e.g.,

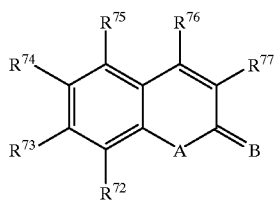

[16]

(wherein $R^{72}$ to $R^{75}$ each independently represents a hydrogen atom, a halogen atom, an alkyl group, an aryl group, a hydroxyl group, an alkoxy group, or an amino group, provided that $R^{72}$ to $R^{75}$ may form a ring consisting of nonmetallic-element atoms in cooperation with the carbon atoms bonded thereto, $R^{76}$ represents a hydrogen atom, an alkyl group, an aryl group, an aromatic heterocyclic group, a cyano group, an alkoxy group, a carboxyl group, or an alkenyl group; $R^{77}$ represents any of the groups represented by $R^{76}$ or —Z—$R^{76}$, wherein Z represents a carbonyl group, a sulfonyl group, a sulfinyl group, or an arylenedicarbonyl group, provided that $R^{76}$ and $R^{77}$ may form a ring consisting of nonmetallic-element atoms, A represents an oxygen atom, a sulfur atom, NH, or a nitrogen atom having a substituent, and B represents an oxygen atom or a group represented by =C($G^1$)($G^2$), wherein $G^1$ and $G^2$, which may be the same or different, each represents a hydrogen atom, a cyano group, an alkoxycarbonyl group, an aryloxycarbonyl group, an acyl group, an arylcarbonyl group, an alkylthio group, an arylthio group, an alkylsulfonyl group, an arylsulfonyl group, or a fluorosulfonyl group, provided that at least one of $G^1$ and $G^2$ is not a hydrogen atom, and that $G^1$ and $G^2$ may form a ring consisting of nonmetallic-element atoms in cooperation with the carbon atom).

Most preferred examples of ingredient (iv) for use in the present invention include the merocyanine dyes described in JP-B-61-9621, JP-A-2-179643, JP-A-2-244050, JP-B-59-28326, JP-A-59-89303, and Japanese Patent Application No. 6-269047 and the benzopyran dyes described in Japanese Patent Application No. 7-164583.

Ingredient (iv) preferably used in the present invention also may consist of a single compound or a combination of two or more compounds.

A known compound which functions to further improve sensitivity or restrain polymerization inhibition attributable to oxygen may be added as a co-sensitizer to the photopolymerizable composition.

Examples of the co-sensitizer include amines described, e.g., in M. R. Sander et al., Journal of Polymer Society, Vol. 10, p. 3173 (1972), JP-B-44-20189, JP-A-51-82102, JP-A-52-134692, JP-A-59-138205, JP-A-60-84305, JP-A-62-18537, JP-A-64-33104, and Research Disclosure No. 33825. Specific examples thereof include triethanolamine, ethyl p-dimethylaminobenzoate, p-formyldimethylaniline, and p-methylthiodimethylaniline.

Other examples of the co-sensitizer include thiols and sulfides, e.g., the thiol compounds described in JP-A-53-702, JP-B-55-500806, and JP-A-5-142772 and the disulfide compounds described in JP-A-56-75643. Specific examples thereof include 2-mercaptobenzothiazole, 2-mercaptobenzoxazole, 2-mercaptobenzimidazole, 2-mercapto-4(3H)-quinazoline, and β-mercaptonaphthalene.

Still other examples thereof include amino acid compounds (e.g., N-phenylglycine), the organometallic compounds described in JP-B-48-42965 (e.g., tributyltin acetate), the hydrogen donors described in JP-B-55-34414, the sulfur compounds described in Japanese Patent Application No. 5-91089 (e.g., trithiane), the phosphorus compounds described in Japanese Patent Application No. 5-32147 (e.g., diethyl phosphite), and the Si—H and Ge—H compounds described in Japanese Patent Application No. 6-191605.

The amount of ingredients (ii), (iii), and (iv) in the composition each is generally from 0.01 to 60 wt %, preferably from 1 to 30 wt %, based on the total amount of the photopolymerizable ethylenically unsaturated compound and a linear organic polymer optionally added as a binder.

The proportion of ingredient (ii) to ingredient (iii) used in the composition of the present invention is such that the amount of ingredient (iii) is preferably from 0.01 to 50 parts by weight, more preferably from 0.02 to 20 parts by weight, most preferably from 0.05 to 10 parts by weight, per part by weight of the oxime ether of ingredient (ii).

The proportion of ingredient (ii) to ingredient (iv) used in the composition of the present invention is such that the amount of ingredient (iv) is preferably from 0.01 to 50 parts by weight, more preferably from 0.02 to 20 parts by weight, most preferably from 0.05 to 10 parts by weight, per part by weight of the oxime ether of ingredient (ii).

In the case of using the co-sensitizer described above, it is added in an amount of preferably from 0.01 to 50 parts by weight, more preferably from 0.02 to 20 parts by weight, most preferably from 0.05 to 10 parts by weight, per part by weight of the oxime ether of ingredient (ii).

A linear organic polymer serving as a binder can be preferably incorporated in the photopolymerizable composition of the present invention. Any linear organic polymer may be used as the "linear organic polymer" as long as it is compatible with the photopolymerizable ethylenically unsaturated compound. It is however preferred to select a linear organic polymer which is soluble or swells in water or weakly alkaline water so as to enable development with water or weakly alkaline water. An appropriate linear organic polymer is selected according to not only the desired film-forming function for the composition, but also depending on whether water, weakly alkaline water, or an organic solvent is used as a developing agent. For example, when a water-soluble organic polymer is used, development with water is possible. Examples of such a linear organic polymer include addition polymers having carboxy groups in side chains, e.g., those described in JP-A-59-44615, JP-B-54-34327, JP-B-58-12577, JP-B-54-25957, JP-A-54-92723, JP-A-59-53836, and JP-A-59-71048, i.e., methacrylic acid copolymers, acrylic acid copolymers, itaconic acid copolymers, crotonic acid copolymers, maleic acid copolymers, and partly esterified maleic acid copolymers. Examples thereof further include acid cellulose derivatives having carboxy groups in side chains like the addition polymers. Polymers prepared by adding a cyclic acid anhydride to an addition polymer having hydroxyl groups are also effective. Especially preferred are copolymers of benzyl (meth)acrylate, (meth)acrylic acid, and one or more optional addition-polymerizable vinyl monomers and copolymers of allyl (meth)acrylate, (meth)acrylic acid, and one or more optional addition-polymerizable vinyl monomers. Other useful water-soluble linear organic polymers include polyvinylpyrrolidone and poly(ethylene oxide). Furthermore, alcohol-soluble polyamides, 2,2-bis(4-hydroxyphenyl) propane/epichlorohydrin polyethers, and the like are useful for heightening the strength of cured films. These linear organic polymers can be incorporated into the composition in any desired amount. However, if it exceeds 90% by weight, unsatisfactory results with respect to the strength of images to be formed may be exhibited. The amount of the linear organic polymer is preferably from 30 to 85%. The weight ratio of the photopolymerizable ethylenically unsaturated compound to the linear organic polymer is preferably from 1/9 to 7/3, more preferably from 3/7 to 5/5.

Besides the basic ingredients described above, a heat polymerization inhibitor is desirably added in a small amount to the composition of the present invention in order to inhibit the polymerizable ethylenically unsaturated compound from undergoing unnecessary thermal polymerization during the production or storage of the photosensitive composition. Examples of the heat polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and the primary cerium salt of N-nitrosophenylhydroxylamine. The addition amount of the heat polymerization inhibitor is preferably about from 0.01 to 5% by weight based on the amount of the whole composition. For the purpose of restraining polymerization inhibition attributable to oxygen, if desired, it is possible to add a higher fatty acid or a derivative thereof, such as behenic acid or behenamide, or the like so that it comes to be present in a higher concentration on the surface of a photosensitive layer during drying after coating. The addition amount of the higher fatty acid derivative is preferably about from 0.5 to 10% based on the amount of the whole composition. A dye or pigment may be added for the purpose of coloring a photosensitive layer, preferably in an amount of about from 0.5 to 5% based on the amount of the whole composition. Furthermore, an inorganic filler and other known additives may be added in order to improve properties of a cured film.

In using the photopolymerizable composition of the present invention, it is usually applied to a substrate. For application to a substrate, the composition is dissolved in any of various organic solvents. The solvents usable here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, and ethyl lactate. These solvents can be used alone or as a mixture of two or more thereof. The coating solution preferably has a solid concentration of from 2 to 50% by weight. The solution is applied in an amount of preferably about from 0.1 to 10 g/m$^2$, more preferably from 0.5 to 5 g/m$^2$, on a dry basis.

A dimensionally stable material in sheet or plate form is used as the substrate. Examples of the dimensionally stable sheet or plate material include paper, papers laminated with a plastic (e.g., polyethylene, polypropylene, or polystyrene), plates of metals such as aluminum (including aluminum alloys), zinc, and copper, films of plastics such as cellulose diacetate, cellulose triacetate, cellulose propionate, cellulose butyrate, cellulose acetate butyrate, cellulose nitrate, poly (ethylene terephthalate), polyethylene, polystyrene, polypropylene, polycarbonates, and poly(vinyl acetal)s, and paper sheets or plastic films having a layer of any of the aforementioned metals formed by laminating or vapor deposition. Aluminum plates are especially preferred because they are extremely stable dimensionally and are inexpensive. Furthermore, preferred is a composite sheet comprising a poly(ethylene terephthalate) film and an aluminum sheet bonded thereto as described in JP-B-48-18327.

In the case of a substrate having a metallic surface, especially an aluminum surface, this substrate is preferably subjected to a surface treatment such as graining, immersion in an aqueous solution of sodium silicate, potassium fluorozirconate, a phosphoric acid salt, etc., or anodization.

Furthermore, an aluminum plate which has undergone graining and then immersion in an aqueous sodium silicate solution can be advantageously used. Preferably used is an aluminum plate which has undergone anodization and then immersion in an aqueous solution of an alkali metal silicate, as described in JP-B-47-5125. The anodization is accomplished by immersing an aluminum plate in an electrolytic solution comprising an aqueous or nonaqueous solution of at least one member selected from inorganic acids, e.g., phosphoric acid, chromic acid, sulfuric acid, and boric acid, organic acids, e.g., oxalic acid and sulfamic acids, and salts of these acids, and permitting a current to flow therethrough.

Electrodeposition of silicate such as that described in U.S. Pat. No. 3,658,662 is effective.

Also useful is a surface treatment comprising a combination of electrolytic graining, such as that disclosed in JP-B-46-27481, JP-A-52-58602, or JP-A-52-30503, the anodization described above, and treatment with sodium silicate.

A further preferred substrate is one which has undergone a mechanical surface-roughening treatment, chemical etching, electrolytic graining, anodization, and treatment with sodium silicate in this order as disclosed in JP-A-55-28893.

Still a further preferred substrate is one which has undergone these treatments, after being primed with a water-soluble resin, e.g., poly(vinylphosphonic acid), a polymer or copolymer having sulfo groups in side chains, or poly (acrylic acid), a water-soluble metal salt (e.g., zinc borate), a yellow dye, an amine salt, etc.

The hydrophilizing treatment effected in order to not only hydrophilize the surface of a substrate, but also prevent the photopolymerizable composition provided thereon from undergoing harmful reactions and improve the adhesion of the photosensitive layer, etc.

A protective layer may be formed on the layer of the photopolymerizable composition formed on a substrate, in order to prevent polymerization inhibition attributable to oxygen in air. The protective layer is made of a polymer having excellent oxygen-barrier properties, such as a poly (vinyl alcohol), especially one having a degree of saponification of 95% or higher, or an acid cellulose. Coating methods for forming such a protective layer are described in detail, e.g., in U.S. Pat. No. 3,458,311 and JP-A-55-49729.

The photopolymerizable composition of the present invention can be used in ordinary photopolymerization reactions. It is also usable in many applications, for example, as a photoresist for use in producing printing plates, printed boards, etc. In particular, since the photopolymerizable composition of the present invention is characterized by high sensitivity and high spectral sensitivity in a wide range extending to the visible light region, it produces satisfactory effects when applied to a photosensitive material for a visible-light laser, e.g., an $Ar^+$ laser or YAG-SHG laser.

Furthermore, since the photopolymerizable composition of the present invention has high sensitivity and is sensitive to visible light, it can be especially advantageously used as an image-forming system utilizing microcapsules.

In applying the photopolymerizable composition to the image-forming system utilizing microcapsules, reference can be made, e.g., to JP-A-57-197538, JP-A-61-130945, JP-A-58-88739, JP-A-58-88740, and EP 223,587 A1. For example, this method for image formation comprises: applying microcapsules containing a photopolymerization initiator composition comprising an ethylenic vinyl compound, a photopolymerization initiator, and a dye precursor onto a substrate; image-wise exposing the resultant photosensitive sheet to light to cure microcapsules in the exposed areas; subsequently superposing a color developer sheet thereon; and then pressing the whole surface of the resultant assemblage to break microcapsules in the unexposed areas, whereby a color image forming substance (e.g., the dye precursor) is transferred to an image-receiving element (e.g., the color developer layer) to develop a color.

A photosensitive material comprising the photopolymerizable composition of the present invention is image-wise exposed to light, and the photosensitive layer in the unexposed areas is then removed with a developing solution to obtain an image. In the case where the photopolymerizable composition is used for producing lithographic printing plates, developing solutions such as those described in JP-B-57-7427 are preferred. Specific examples thereof include aqueous solutions of inorganic alkalis such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium hydrogen carbonate, and ammonia water and of organic alkalis such as monoethanolamine and diethanolamine. Such an alkali is added generally in a concentration of from 0.1 to 10% by weight, preferably from 0.5 to 5% by weight.

The aqueous alkali solution, if desired, may contain small amounts of a surfactant and an organic solvent such as benzyl alcohol, 2-phenoxyethanol, or 2-butoxyethanol. Examples of such a developing solution are described in U.S. Pat. Nos. 3,375,171 and 3,615,480. The developing solutions described in JP-A-50-26601, JP-A-58-54341, JP-B-56-39464, and JP-B-56-42860 are also excellent.

EXAMPLES

The present invention will be explained below in more detail by reference to Examples, but the invention should not be construed as being limited thereto.

Synthesis of Oxime Ether Compounds

Oxime ether compounds represented by formula (I) are generally synthesized, for example, by a method described in JP-A-8-202035. Specifically, a commercial or synthesized ketone is reacted as a starting material according to reaction scheme 1, whereby the target compound can be easily synthesized via an oxime (provided that the X-Y-Z-Hal may be introduced step-wise).

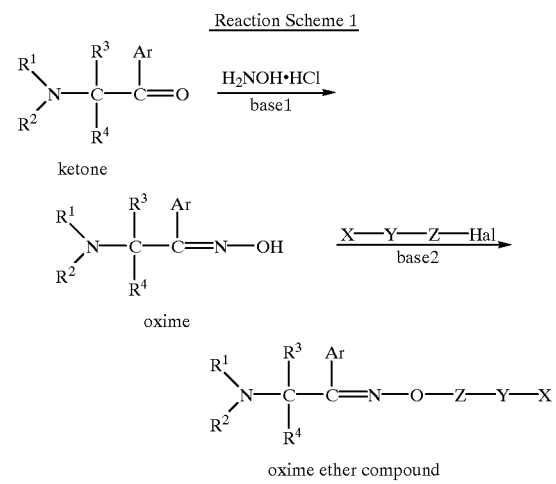

(In the scheme, $R^1$ to $R^4$, Ar, X, Y, and Z have the same meanings as in formula (I); and Hal represents a halogen atom (Cl, Br, or I).)

Although Synthesis Examples for synthesizing individual compounds are described below, the present invention should not be construed as being limited by these Synthesis Examples.

Synthesis Example 1 (Synthesis of Oxime)

Into a flask were introduced 2-methyl-4'-(methylthio)-2-morpholinopropiophenone (279.39 g) manufactured by Ciba-Geigy Ltd., hydroxylamine hydrochloride (208.5 g), ethanol (1.0 liter), and water (0.2 liters). While the contents were being heated at 60° C., NaOH (240 g) was added thereto in ten portions in such a manner that each portion was gradually added over 10 minutes. After the addition of NaOH, the resultant reaction mixture was stirred for 3 hours, and water (3.0 liters) was then added thereto. As a result, white crystals precipitated.

The reaction mixture was filtered to obtain 265.0 g of 2-methyl-4'-(methylthio)-2-morpholinopropiophenone oxime as white crystals in a yield of 90%. The structure thereof was ascertained by $^1H$ NMR, IR, and mass spectrometry.

Synthesis Example 2 (Synthesis of I-2)

Into a flask were introduced hydroxyethyl methacrylate (13.0 g) and carbon tetrachloride (200 ml). Thereto was added tris(octyl)phosphine (38.1 g) with cooling with ice. The resultant mixture was warmed to room temperature, stirred for 5 hours, and then passed through a silica gel chromatographic column (hexane/ethyl acetate=95/5). The eluate was concentrated to obtain 11.9 g of a light-yellow oil.

Into a flask were then introduced the oxime obtained in Synthesis Example 1 (23.6 g), the oil (11.9 g), and N,N'-dimethylacetamide (100 ml). Thereto was gradually added, with cooling with ice, 60% NaOH (3.2 g) over a period of 1 hour. After the addition, the reaction mixture was stirred for 1 hour, and water (200 ml) was then added thereto. This mixture was extracted with ethyl acetate, and the resultant ethyl acetate solution was dried with $Na_2SO_4$ and then concentrated. Thereafter, the solvent was distilled off and the residue was passed through a silica gel chromatographic column (hexane/ethyl acetate=90/10). The eluate was concentrated to obtain 28.4 g of a colorless oil. Thus, Compound I-2 was obtained in a yield of 80%. The structure of this Compound I-2 was ascertained by $^1$H NMR, IR, and mass spectrometry.

Synthesis Example 3 (Synthesis of I-7)

Into a flask were introduced the oxime obtained in Synthesis Example 1 (58.9 g), methyl chloroacetate (32.6 g), and N,N'-dimethylacetamide (200 ml). Thereto was dropwise added, with cooling with ice, a 28% methanol solution of NaOMe (57.9 g) over a period of 30 minutes. After this mixture was stirred for 1 hour, NaOH (12.0 g) and water (80 ml) were added thereto and the resultant mixture was stirred for 30 minutes. Subsequently, 3-iodopropanol (37.2 g) was added thereto and the resultant mixture was stirred at 90° C. for 8 hours. Thereafter, water (500 ml) was added and the mixture was extracted with ethyl acetate. The resultant ethyl acetate solution was dried with $Na_2SO_4$, and methacryloyl chloride (20.9 g) was then added thereto. To this mixture was dropwise added, with cooling with ice, triethylamine (20.2 g) over a period of 1 hour. Subsequently, water (500 ml) was added thereto. The ethyl acetate layer was dried with $Na_2SO_4$, and the solvent was then removed under vacuum to obtain a yellow oil. This oil was purified by silica gel chromatography (hexane/ethyl acetate=90/10) to obtain 38.3 g of a colorless viscous oil. Thus, Compound I-7 was obtained in a yield of 40%. The structure thereof was ascertained by $^1$H NMR, IR, and mass spectrometry.

Synthesis Example 4 (Synthesis of I-17)

Into a flask were introduced the oxime obtained in Synthesis Example 1 (58.9 g), p-chloromethylstyrene (45.8 g), and N,N'-dimethylacetamide (200 ml). Thereto was dropwise added, with cooling with ice, a 28% methanol solution of NaOMe (57.9 g) over a period of 30 minutes. After this mixture was stirred for 1 hour, 1 liter of water was added thereto and the resultant mixture was stirred with cooling with ice. As a result, light-yellow crystals precipitated. The crystals were taken out by filtration and recrystallized from ethanol to obtain 61.6 g of colorless crystals. Thus, Compound I-17 was obtained in a yield of 75%. The structure thereof was ascertained by $^1$H NMR, IR, and mass spectrometry.

Synthesis Example 5 (Synthesis of I-19)

Into a flask were introduced the oxime obtained in Synthesis Example 1 (58.9 g), methyl chloroacetate (32.6 g), and N,N'-dimethylacetamide (200 ml). Thereto was dropwise added, with cooling with ice, a 28% methanol solution of NaOMe (57.9 g) over a period of 30 minutes. After this mixture was stirred for 1 hour, NaOH (12.0 g) and water (80 ml) were added thereto and the resultant mixture was stirred for 30 minutes. Subsequently, KI (16.6 g) and p-chloromethylstyrene (45.8 g) were added thereto and the resultant mixture was stirred at 90° C. for 3 hours. Thereafter, water (400 ml) and methanol (400 ml) were added and the resultant mixture was stirred with cooling with ice. As a result, light-yellow crystals precipitated. The crystals were taken out by filtration and recrystallized from a 90/10 mixture of ethanol and water to obtain 56.2 g of colorless crystals. Thus, Compound I-19 was obtained in a yield of 60%. The structure thereof was ascertained by $^1$H NMR, IR, and mass spectrometry.

Compounds according to the present invention which are represented by formula (I), other than Compounds I-2, I-7, I-17, and I-19, can be easily synthesized in the same manner.

Examples 1 to 13 and Comparative Examples 1 to 16

The surface of an aluminum plate having a thickness of 0.30 mm was grained using a nylon brush and an aqueous suspension of a 400-mesh pumice powder, and then sufficiently washed with water. The grained plate was immersed in 10% sodium hydroxide solution at 70° C. for 60 seconds to etch the surface, subsequently washed with running water, neutralized with 20% nitric acid, and then washed with water. This aluminum plate was subjected to an electrolytic surface-roughening treatment in 1% aqueous nitric acid solution using an alternating sine-wave current under the conditions of a $V_A$ of 12.7 V and an anode-time quantity of electricity of 160 $C/dm^2$. The roughness of the thus-roughened surface was measured, and was found to be 0.6 $\mu m$ (in terms of $R_a$). Subsequently, the plate was immersed in 30% aqueous sulfuric acid solution to conduct desmutting at 55° C. for 2 minutes, and then anodized for 2 minutes in a 20% aqueous sulfuric acid solution at a current density of 2 $A/dm^2$ so as to form an anodization film in an amount of 2.7 $g/m^2$.

The aluminum plate thus treated was coated with a photopolymerizable composition having the following composition in an amount of 1.4 $g/m^2$ on a dry basis, and the coating was dried at 80° C. for 2 minutes to form a photosensitive layer.

Composition

| | |
|---|---|
| Pentaerythritol tetraacrylate | 2.0 g |
| Allyl methacrylate/methacrylic acid (75/25 by mol) copolymer | 2.0 g |
| Ingredient (ii) | X g |
| Ingredient (iii) | Y g |
| Ingredient (iv) | Z g |
| Methyl ethyl ketone | 20 g |
| Propylene glycol monomethyl ether acetate | 20 g |

This photosensitive layer was coated with a 3 wt % aqueous solution of poly(vinyl alcohol) (degree of saponification, 98 mol %; degree of polymerization, 1,000) in an amount of 2 $g/m^2$ on a dry basis. The coating was dried at 100° C. for 2 minutes to produce a photosensitive material. This photosensitive material was subjected to the following tests.

A photosensitivity test was conducted using visible light and $Ar^+$ laser light (wavelength, 488 nm) each as a monochromatic light. The visible light was obtained by using a tungsten lamp as a light source and passing the light of the lamp through Kenko Optical Filter BP-49. For the measurement of photosensitivity was used Fuji PS Step Guide (a 15-step tablet manufactured by Fuji Photo Film Co., Ltd., in which the optical density of transmitted light increases gradationally by 0.15, with that for the first step being 0.05). The sensitivity of each photosensitive material is shown in terms of the number of steps of the PS Step Guide which were cleared when the photosensitive material was exposed at an exposure energy of 0.25 mJ as measured on the photosensitive film surface. The larger the number of such steps, the higher the sensitivity.

Development was conducted by immersing the exposed photosensitive material in the following developing solution at 25° C. for 1 minute.

Developing Solution

| | |
|---|---|
| 1 K Potassium silicate | 30 g |
| Potassium hydroxide | 15 g |
| $C_{12}H_{25}$—$C_6H_4$—O—$C_6H_4$—$SO_3Na$ | 3 g |
| Water | 1000 g |

An impression capability test was further conducted in order to examine film strength in exposed areas.

In the impression capability test, the photosensitive material produced above was exposed with high-precision laser plotter XLP4000 (air-cooled $Ar^+$ laser, 200 mW, 488 nm), manufactured by Optonics Co., under the conditions of 4,000 dpi and 175 lines per inch so as to reproduce 2% dots. The exposed photosensitive material was developed with the developing solution described above to produce a sample. This sample was mounted on printing machine SOR-KZ, manufactured by Heidenberg Co., and printing was conducted on woodfree paper using a dampening solution prepared by adding 10% isopropanol to EU-3 (1:100), manufactured by Fuji Photo Film Co., Ltd., and using Kraf G (N), manufactured by Dainippon Ink & Chemicals Inc., Japan, as an ink. A print was taken out every 5,000 sheets to determine the number of prints obtained before the occurrence of printing failure with respect to the reproduction of the 2% dots in 175 lines per inch.

The impression capability of each printing plate was calculated using the number of prints finally obtained in Comparative Example 14 as a standard; the press life of the printing plate of Comparative Example 14 was taken as 100%. The results obtained are shown in Table 3.

Furthermore, the yield of residual film was measured in order to examine the degree of curing of each film in exposed areas.

The yield of residual film was measured in the following manner.

(1) The photosensitive material produced above (50 cm by 50 cm plate) is wholly exposed to visible light obtained in the same manner as the above by using a tungsten lamp as a light source and passing the light emitted therefrom through BP-49. The exposure is conducted at an exposure energy of 0.25 mJ as measured on the photosensitive film surface. This exposed photosensitive material is weighed (this weight is referred to as "α g").

(2) The wholly exposed plate is immersed in 2 liters of acetone for 10 minutes, subsequently dried, and then weighed (this weight is referred to as "β g").

(3) Another photosensitive material of the same size (50 cm by 50 cm) is prepared and weighed (this weight is referred to as "γ g").

(4) This unexposed plate is immersed in 2 liters of acetone for 10 minutes, subsequently dried, and then weighed (this weight is referred to as "δ g").

After the above procedure, the yield of residual film was calculated using the following equation.

$$\text{Yield of residual film}=(\alpha-\beta)/(\gamma-\delta)\times 100(\%)$$

The results obtained are shown in Table 3.

TABLE 3

Sensitivity; Impression Capability in Highlight Parts

| | Ingredient Proportions in Photopolymerizable Composition | | | | | | Sensitivity in Exposure (number of steps in step wedge) | Press Life (%) | Yield of Residual Film (%) |
|---|---|---|---|---|---|---|---|---|---|
| | Ingredient (ii) | X g | Ingredient (iii) | Y g | Ingredient (iv) | Z g | | | |
| Ex. 1 | I-1 | 0.50 g | B-1 | 0.05 g | C-1 | 0.12 g | 10.5 | 150 | 70 |
| Ex. 2 | I-7 | 0.50 g | B-1 | 0.05 g | C-1 | 0.12 g | 10.5 | 150 | 70 |
| Ex. 3 | I-13 | 0.50 g | B-1 | 0.05 g | C-1 | 0.12 g | 10.5 | 140 | 73 |
| Ex. 4 | I-19 | 0.50 g | B-2 | 0.06 g | C-1 | 0.12 g | 11.0 | 160 | 75 |
| Ex. 5 | I-36 | 0.50 g | B-2 | 0.06 g | C-1 | 0.12 g | 10.0 | 130 | 70 |
| Ex. 6 | I-49 | 0.50 g | B-2 | 0.06 g | C-1 | 0.12 g | 10.0 | 140 | 68 |
| Ex. 7 | I-57 | 0.50 g | B-2 | 0.06 g | C-2 | 0.10 g | 9.5 | 120 | 60 |
| Ex. 8 | I-65 | 0.50 g | B-2 | 0.06 g | C-2 | 0.10 g | 9.0 | 120 | 60 |
| Ex. 9 | I-70 | 0.50 g | B-2 | 0.06 g | C-2 | 0.10 g | 9.5 | 125 | 65 |
| Ex. 10 | I-80 | 0.50 g | B-2 | 0.06 g | C-1 | 0.10 g | 10.5 | 150 | 70 |
| Ex. 11 | I-87 | 0.50 g | B-2 | 0.06 g | C-1 | 0.10 g | 10.5 | 150 | 70 |
| Ex. 12 | I-93 | 0.50 g | B-2 | 0.06 g | C-1 | 0.10 g | 10.0 | 130 | 70 |
| Ex. 13 | I-94 | 0.50 g | B-2 | 0.06 g | C-1 | 0.10 g | 10.5 | 125 | 65 |
| Comp. Ex. 1 | A-1 | 0.50 g | B-1 | 0.05 g | C-1 | 0.12 g | 10.0 | 120 | 60 |
| Comp. Ex. 2 | A-2 | 0.50 g | B-1 | 0.05 g | C-1 | 0.12 g | 10.0 | 120 | 63 |
| Comp. Ex. 3 | A-3 | 0.50 g | B-1 | 0.05 g | C-1 | 0.12 g | 10.0 | 125 | 60 |
| Comp. | A-4 | 0.50 g | B-2 | 0.06 g | C-1 | 0.12 g | 10.5 | 130 | 62 |

TABLE 3-continued

| | Sensitivity; Impression Capability in Highlight Parts | | | | | | | |
|---|---|---|---|---|---|---|---|---|
| | Ingredient Proportions in Photopolymerizable Composition | | | | | | Sensitivity in Exposure (number of steps in step wedge) | Press Life (%) | Yield of Residual Film (%) |
| | Ingredient (ii) | X g | Ingredient (iii) | Y g | Ingredient (iv) | Z g | | | |
| Ex. 4 | | | | | | | | | |
| Comp. Ex. 5 | A-5 | 0.50 g | B-2 | 0.06 g | C-1 | 0.12 g | 9.5 | 110 | 62 |
| Comp. Ex. 6 | A-6 | 0.50 g | B-2 | 0.06 g | C-1 | 0.12 g | 9.5 | 110 | 55 |
| Comp. Ex. 7 | A-7 | 0.50 g | B-2 | 0.06 g | C-2 | 0.10 g | 9.0 | 105 | 52 |
| Comp. Ex. 8 | A-8 | 0.50 g | B-2 | 0.06 g | C-2 | 0.10 g | 8.0 | 105 | 53 |
| Comp. Ex. 9 | A-9 | 0.50 g | B-2 | 0.06 g | C-2 | 0.10 g | 9.0 | 110 | 58 |
| Comp. Ex. 10 | A-10 | 0.50 g | B-2 | 0.06 g | C-1 | 0.10 g | 9.0 | 120 | 55 |
| Comp. Ex. 11 | A-11 | 0.50 g | B-2 | 0.06 g | C-1 | 0.10 g | 9.5 | 120 | 55 |
| Comp. Ex. 12 | A-12 | 0.50 g | B-2 | 0.06 g | C-1 | 0.10 g | 9.0 | 110 | 60 |
| Comp. Ex. 13 | A-13 | 0.50 g | B-2 | 0.06 g | C-1 | 0.10 g | 9.0 | 110 | 60 |
| Comp. Ex. 14 | none | | B-1 | 0.05 g | C-1 | 0.12 g | 7.5 | 100 | 48 |
| Comp. Ex. 15 | none | | B-2 | 0.06 g | C-1 | 0.12 g | 7.5 | 95 | 49 |
| Comp. Ex. 16 | none | | B-2 | 0.06 g | C-2 | 0.10 g | 7.0 | 90 | 45 |

Compounds (A-1) to (A-13), (B-1), (B-2), (C-1), and (C-2) shown in Table 3 are as follows.

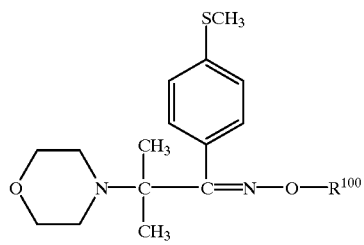

Compound No.   Structure of $-R^{100}$

A-1

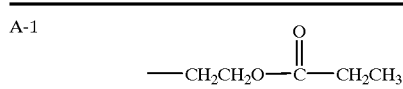

A-2

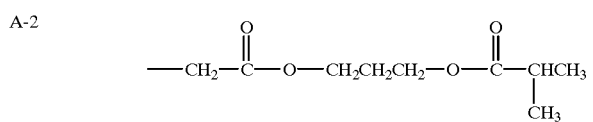

A-3

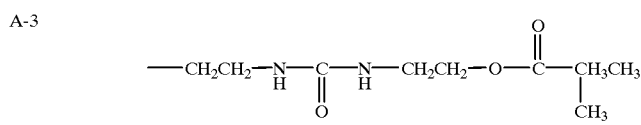

-continued
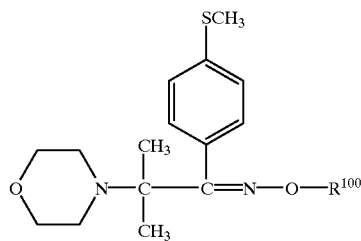
| Compound No. | Structure of $-R^{100}$ |
|---|---|
| A-4 | 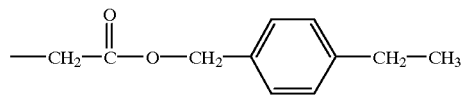 |
| A-5 | 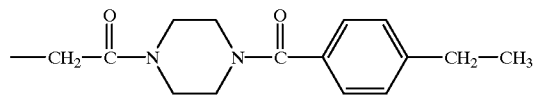 |
| A-6 | 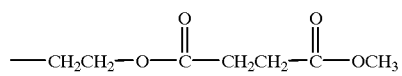 |
| A-7 | 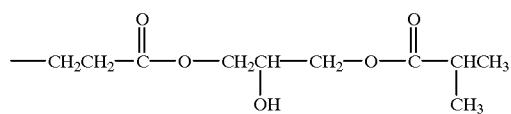 |
| A-8 | 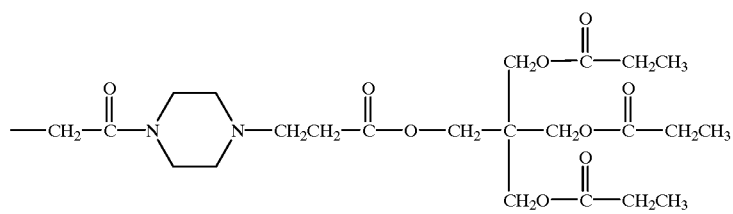 |
| A-9 | 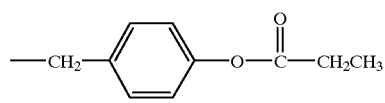 |
| A-10 | 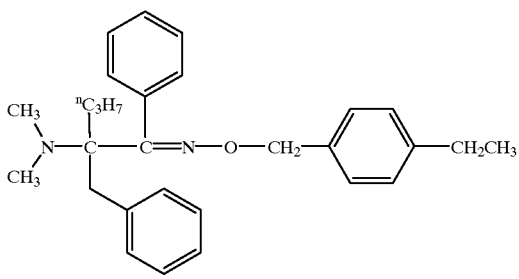 |

-continued
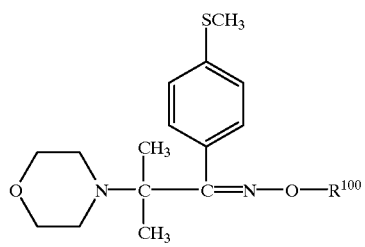
| Compound No. | Structure of $-R^{100}$ |
|---|---|
| A-11 | 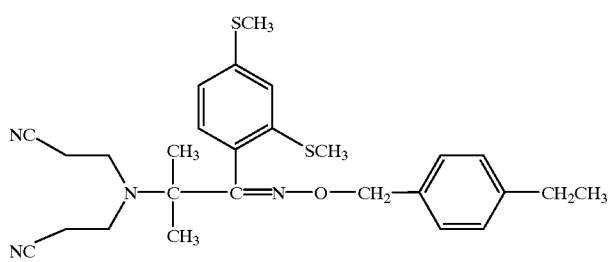 |
| A-12 | 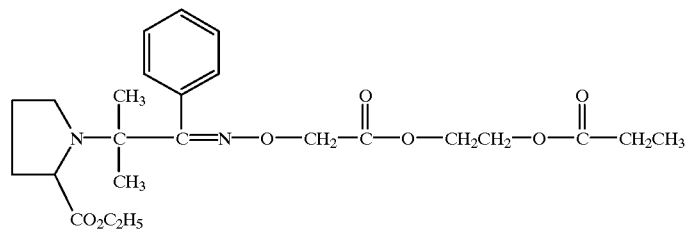 |
| A-13 | 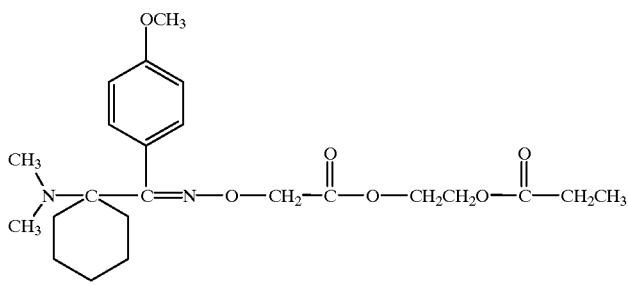 |
| (B-1) | 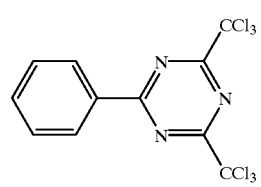 |

-continued

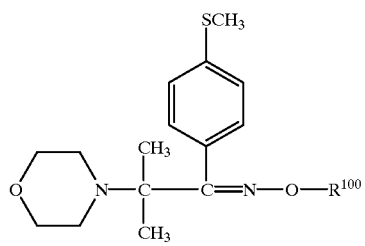

Compound No. Structure of $-R^{100}$ (B-2)

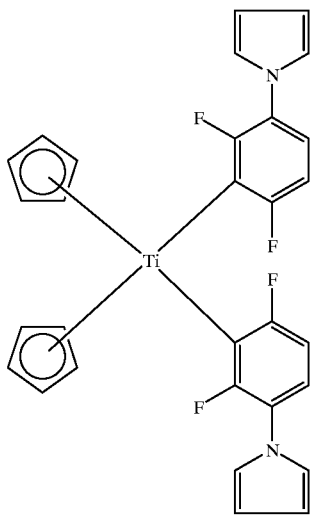

(C-1)

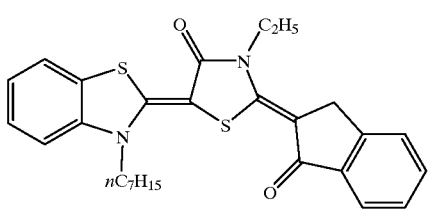

(C-2)

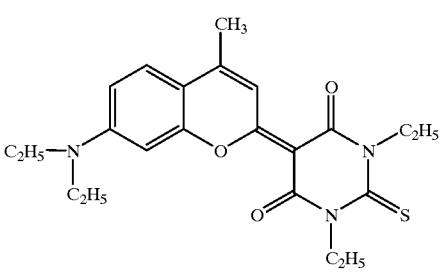

Table 3 shows that use of ingredient (ii) according to the present invention was effective in improving not only sensitivity but impression capability, which is a measure of film strength in exposed areas.

The table further shows that these effects are attributable to the improved yield of residual film which was attained by the addition of ingredient (ii).

Examples 14 to 23 and Comparative Examples 17 to 29

The surface of an aluminum plate having a thickness of 0.30 mm was grained using a nylon brush and an aqueous suspension of a 400-mesh pumice powder, and then sufficiently washed with water. The grained plate was immersed in 10% sodium hydroxide solution at 70° C. for 60 seconds to etch the surface, subsequently washed with running water, neutralized with 20% nitric acid, and then washed with water. This aluminum plate was subjected to an electrolytic surface-roughening treatment in 1% aqueous nitric acid solution using an alternating sine-wave current under the conditions of a $V_A$ of 12.7 V and an anode-time quantity of electricity of 160 C/dm². The roughness of the thus-roughened surface was measured, and was found to be 0.6 µm (in terms of $R_a$). Subsequently, the plate was immersed in 30% aqueous sulfuric acid solution to conduct desmutting at 55° C. for 2 minutes, and then anodized for 2 minutes in a 20% aqueous sulfuric acid solution at a current density of 2 A/dm² so as to form an anodization film in an amount of 2.7 g/m².

The aluminum plate thus treated was coated with a photopolymerizable composition having the following composition in an amount of 1.4 g/m² on a dry basis, and the coating was dried at 80° C. for 2 minutes to form a photosensitive layer.

Composition

| | |
|---|---|
| Pentaerythritol tetraacrylate | 2.0 g |
| Ethyl methacrylate/allyl methacrylate/methacrylic acid (20/60/20 by mol) copolymer | 2.0 g |
| Ingredient (ii) | X g |
| Ingredient (iii) | Y g |
| Ingredient (iv) | Z g |
| Methyl ethyl ketone | 20 g |
| Propylene glycol monomethyl ether acetate | 20 g |

This photosensitive layer was coated with a 3 wt % aqueous solution of poly(vinyl alcohol) (degree of saponification, 98 mol %; degree of polymerization, 1,000) in an amount of 2 g/m² on a dry basis. The coating was dried at 100° C. for 2 minutes to produce a photosensitive material. This photosensitive material was subjected to the following tests.

A photosensitivity test was conducted using visible light and YAG-SHG laser light (wavelength, 532 nm) each as a monochromatic light. The visible light was obtained by using a tungsten lamp as a light source and passing the light of the lamp through Kenko Optical Filter BP-53. For the measurement of photosensitivity was used Fuji PS Step Guide (a 15-step tablet manufactured by Fuji Photo Film Co., Ltd., in which the optical density of transmitted light increases gradationally by 0.15, with that for the first step being 0.05). The sensitivity of each photosensitive material is shown in terms of the number of steps of the PS Step Guide when the photosensitive material was exposed at an exposure energy of 0.25 mJ as measured on the photosensitive film surface. The larger the number of such steps, the higher the sensitivity.

Development was conducted by immersing the exposed photosensitive material in the following developing solution at 25° C. for 1 minute.

Developing Solution

| | |
|---|---|
| 1 K Potassium silicate | 30 g |
| Potassium hydroxide | 15 g |
| $C_{12}H_{25}$—$C_6H_4$—O—$C_6H_4$—$SO_3Na$ | 3 g |
| Water | 1000 g |

An impression capability test was further conducted in order to examine film strength in exposed areas.

In the impression capability test, the photosensitive material produced above was exposed with Leinotype high-precision laser plotter Gutenberg (YAG-SHG laser, 100 mW, 532 nm), manufactured by Hel Co., under the conditions of 4,000 dpi and 175 lines per inch so as to reproduce 2% dots. The exposed photosensitive material was developed with the developing solution described above to produce a sample. This sample was mounted on printing machine SOR-KZ, manufactured by Heidenberg Co., and printing was conducted on woodfree paper using a dampening solution prepared by adding 10% isopropanol to EU-3 (1:100), manufactured by Fuji Photo Film Co., Ltd., and using Kraf G (N), manufactured by Dainippon Ink & Chemicals Inc., as an ink. A print was taken out every 5,000 sheets to determine the number of prints obtained before the occurrence of printing failure with respect to the reproduction of the 2% dots in 175 lines per inch.

The impression capability of each printing plate was calculated using the number of prints finally obtained in Comparative Example 26 as a standard; the press life of the printing plate of Comparative Example 26 was taken as 100%. The results obtained are shown in Table 4.

Furthermore, the yield of residual film was measured in order to examine the degree of curing of each film in exposed areas.

The yield of residual film was measured in the following manner.

(1) The photosensitive material produced above (50 cm by 50 cm plate) is wholly exposed to visible light obtained in the same manner as the above by using a tungsten lamp as a light source and passing the light emitted therefrom through BP-53. The exposure is conducted at an exposure energy of 0.25 mJ as measured on the photosensitive film surface. This exposed photosensitive material is weighed (this weight is referred to as "α g").

(2) The wholly exposed plate is immersed in 2 liters of acetone for 10 minutes, subsequently dried, and then weighed (this weight is referred to as "β g").

(3) another photosensitive material of the same size (50 cm by 50 cm) is prepared and weighed (this weight is referred to as ("γ g").

(4) This unexposed plate is immersed in 2 liters of acetone for 10 minutes, subsequently dried, and then weighed (this weight is referred to nas ("δ g").

After the above procedure, the yield of residual film was calculated ising the following equation.

Yield of residual; film=$(\alpha-\beta)/(\gamma-\delta)\times 100(\%)$ the results obtained are shown in Table 4.

TABLE 4

Sensitivity; Impression Capability in Highlight Parts

| Ingredient Proportions in Photopolymerizable Composition | Sensitivity in Exposure (number of steps) | Press | Yield of Residual |
|---|---|---|---|

| | Ingredient (ii) | X g | Ingredient (iii) | Y g | Ingredient (iv) | Z g | in step wedge) | Life (%) | Film (%) |
|---|---|---|---|---|---|---|---|---|---|
| Ex. 14 | I-1 | 0.50 g | B-1 | 0.05 g | C-3 | 0.12 g | 10.0 | 140 | 70 |
| Ex. 15 | I-7 | 0.50 g | B-1 | 0.05 g | C-3 | 0.12 g | 10.0 | 140 | 70 |
| Ex. 16 | I-13 | 0.50 g | B-1 | 0.05 g | C-3 | 0.12 g | 10.5 | 130 | 70 |
| Ex. 17 | I-19 | 0.50 g | B-2 | 0.06 g | C-3 | 0.12 g | 11.0 | 150 | 70 |
| Ex. 18 | I-36 | 0.50 g | B-2 | 0.06 g | C-3 | 0.12 g | 10.5 | 140 | 70 |
| Ex. 19 | I-49 | 0.50 g | B-2 | 0.06 g | C-3 | 0.12 g | 11.0 | 145 | 65 |
| Ex. 20 | I-57 | 0.50 g | B-2 | 0.06 g | C-2 | 0.10 g | 11.0 | 140 | 65 |
| Ex. 21 | I-65 | 0.50 g | B-2 | 0.06 g | C-2 | 0.10 g | 10.5 | 130 | 65 |
| Ex. 22 | I-70 | 0.50 g | B-2 | 0.06 g | C-2 | 0.10 g | 10.5 | 130 | 70 |
| Comp. Ex. 17 | A-1 | 0.50 g | B-1 | 0.05 g | C-3 | 0.12 g | 9.0 | 110 | 60 |
| Comp. Ex. 18 | A-2 | 0.50 g | B-1 | 0.05 g | C-3 | 0.12 g | 9.0 | 115 | 60 |
| Comp. Ex. 19 | A-3 | 0.50 g | B-1 | 0.05 g | C-3 | 0.12 g | 8.5 | 110 | 60 |
| Comp. Ex. 20 | A-4 | 0.50 g | B-2 | 0.06 g | C-3 | 0.12 g | 9.0 | 120 | 60 |
| Comp. Ex. 21 | A-5 | 0.50 g | B-2 | 0.06 g | C-3 | 0.12 g | 9.5 | 120 | 55 |
| Comp. Ex. 22 | A-6 | 0.50 g | B-2 | 0.06 g | C-3 | 0.12 g | 10.0 | 115 | 55 |
| Comp. Ex. 23 | A-7 | 0.50 g | B-2 | 0.06 g | C-2 | 0.10 g | 9.0 | 110 | 60 |
| Comp. Ex. 24 | A-8 | 0.50 g | B-2 | 0.06 g | C-2 | 0.10 g | 9.0 | 110 | 52 |
| Comp. Ex 25 | A-9 | 0.50 g | B-2 | 0.06 g | C-2 | 0.10 g | 9.0 | 110 | 60 |
| Comp. Ex. 26 | none | | B-1 | 0.05 g | C-3 | 0.12 g | 7.5 | 100 | 48 |
| Comp. Ex. 27 | none | | B-2 | 0.06 g | C-3 | 0.12 g | 7.0 | 95 | 45 |
| Comp. Ex. 28 | none | | B-2 | 0.06 g | C-2 | 0.10 g | 7.5 | 100 | 49 |

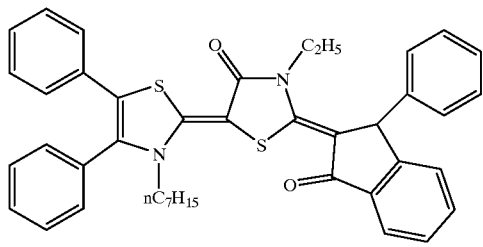

C-3

Table 4 shows that use of ingredient (ii) according to the present invention was effective in improving not only sensitivity but impression capability, which is a measure of film strength in exposed areas.

The table further shows that these effects are attributable to the improved yield of residual film which was attained by the addition of ingredient (ii).

The photopolymerizable composition of the present invention has the following effects. The composition has high sensitivity to actinic rays in a wide region, ranging from ultraviolet to visible light. A photosensitive material obtained using the composition gives a film having improved strength in exposed areas.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising at least the following ingredients (i) and (ii), (i) a compound having one or more addition-polymerizable ethylenically unsaturated bond(s) and (ii) an oxime ether compound represented by formula (I):

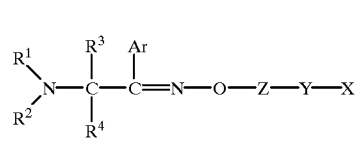

(I)

wherein $R^1$ to $R^4$ each represents an alkyl group which may have substituent(s) or an aryl group which may have substituent(s); Ar represents an aryl group which may have substituent(s); $R^1$ and $R^2$ may be bonded to each other to form a ring, and $R^3$ and $R^4$ may be bonded to each other to form a ring; Z represents a bivalent hydrocarbon-containing connecting group which may have substituent(s); Y represents a bivalent connecting group or a single bond, said connecting group comprising at least one of the following groups:

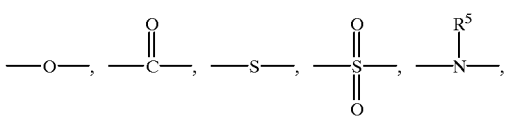

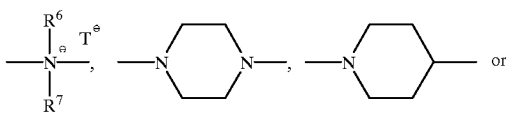

-continued

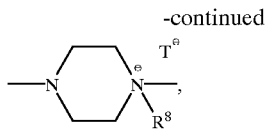

wherein $R^5$ represents a hydrogen atom, a hydrocarbon group which may have substituent(s) and unsaturated bond(s), a carbonyl group, or a sulfonyl group, $R^6$ to $R^8$, which may be the same or different, each represents a hydrocarbon group which may have substituent(s) and unsaturated bond(s), and $T^-$ represents a univalent anion comprising a halogen atom or a univalent sulfonate anion; and X is a group having an addition-polymerizable group represented by the following formula (I-a):

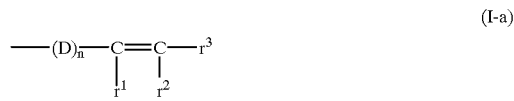

wherein D represents one of the following groups:

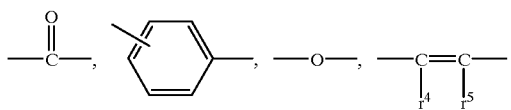

$r^1$ to $r^3$, which may be the same or different, each represents a hydrogen atom, a methyl group, an ethyl group, a phenyl group, a halogen atom, a cyano group, or —C(=O)—OR$^9$; n represents 0 or 1, provided that when n is 0, not all of $r^1$ to $r^3$ are hydrogen atoms; $r^4$ and $r^5$, which may be the same or different, each represents a hydrogen atom, a methyl group, an ethyl group, or a phenyl group; and $R^9$ represents an alkyl group which may have substituent(s) or an aryl group which may have substituent(s) provided that when n is 0 and one of $r^2$ and $r^3$ is —C(=O)—OR$^9$, $R^9$ is an alkyl group having two or more carbon atoms which may have substituent(s) or an aryl group which may have substituent(s).

2. The photopolymerizable composition of claim 1, which contains said oxime ether compound in an amount of 0.05 to 50% by weight.

3. The photopolymerizable composition of claim 1, which further comprises a photopolymerization initiator.

4. The photopolymerizable composition of claim 3, wherein the photopolymerization initiator is at least one selected from the group consisting of aromatic ketones, aromatic onium salt compounds, organic peroxides, thio compounds, hexaarylbiimidazole compounds, ketoxime ester compounds, borate compounds, azinium compounds, metallocene compounds, active ester compounds, and compounds having one or more carbon-halogen bonds.

* * * * *